United States Patent [19]

Iwahashi et al.

[11] Patent Number: 5,258,958
[45] Date of Patent: Nov. 2, 1993

[54] SEMICONDUCTOR MEMORY DEVICE

[75] Inventors: Hiroshi Iwahashi, Yokohama; Hiroto Nakai, Kawasaki; Kazuhisa Kanazawa, Tokyo; Isao Sato, Kawasaki, all of Japan

[73] Assignee: Kabushiki Kaisha Toshiba, Kawasaki, Japan

[21] Appl. No.: 778,088

[22] PCT Filed: Jun. 8, 1990

[86] PCT No.: PCT/JP90/00755
§ 371 Date: Dec. 12, 1991
§ 102(e) Date: Dec. 12, 1991

[87] PCT Pub. No.: WO90/16069
PCT Pub. Date: Dec. 27, 1990

[30] Foreign Application Priority Data

Jun. 12, 1989 [JP] Japan ................ 1-148677
Jan. 19, 1990 [JP] Japan ................ 2-10406
Jun. 4, 1990 [JP] Japan ................ 2-145640

[51] Int. Cl.$^5$ .................................. G11C 7/00
[52] U.S. Cl. ................ 365/210; 365/189.07; 365/208
[58] Field of Search ........... 365/210, 205, 207, 208, 365/206, 189.07; 307/530

[56] References Cited

U.S. PATENT DOCUMENTS 4,301,518 11/1981 Klaas ..................... 365/185
5,148,063 9/1992 Hotta ..................... 365/210

FOREIGN PATENT DOCUMENTS 60-89899 5/1985 Japan .
61-73300 4/1986 Japan .
61-255597 11/1986 Japan .
63-107225 5/1988 Japan .
64-23494 1/1989 Japan .

OTHER PUBLICATIONS

Richard Zeman et al., "A 55ns CMOS EEPROM", IEEE ISSCC Digest of Technical Papers, pp. 144-145, 1984.

Primary Examiner—Eugene R. LaRoche
Assistant Examiner—Christopher R. Glembocki
Attorney, Agent, or Firm—Foley & Lardner

[57] ABSTRACT

There is disclosed a semiconductor memory device comprising memory cells (M11 to Mmn) for storing binary data, and first reference cells (DM11 to DMm1) and second reference cells (DM12 to DMm2) corresponding to respective two storage states of the memory cell, to make comparisons between the storage state of the memory cell and the storage states of the both reference cells at first and second sense amplifiers (1, 2) to compare outputs from the both sense amplifiers at the third sense amplifier (3) to thereby detect storage data of the memory cell. Thus, there can be provided a high speed memory device which has a less number of memory cells and of a high integration structure, and which has a little possibility of an erroneous operation in reading.

164 Claims, 40 Drawing Sheets

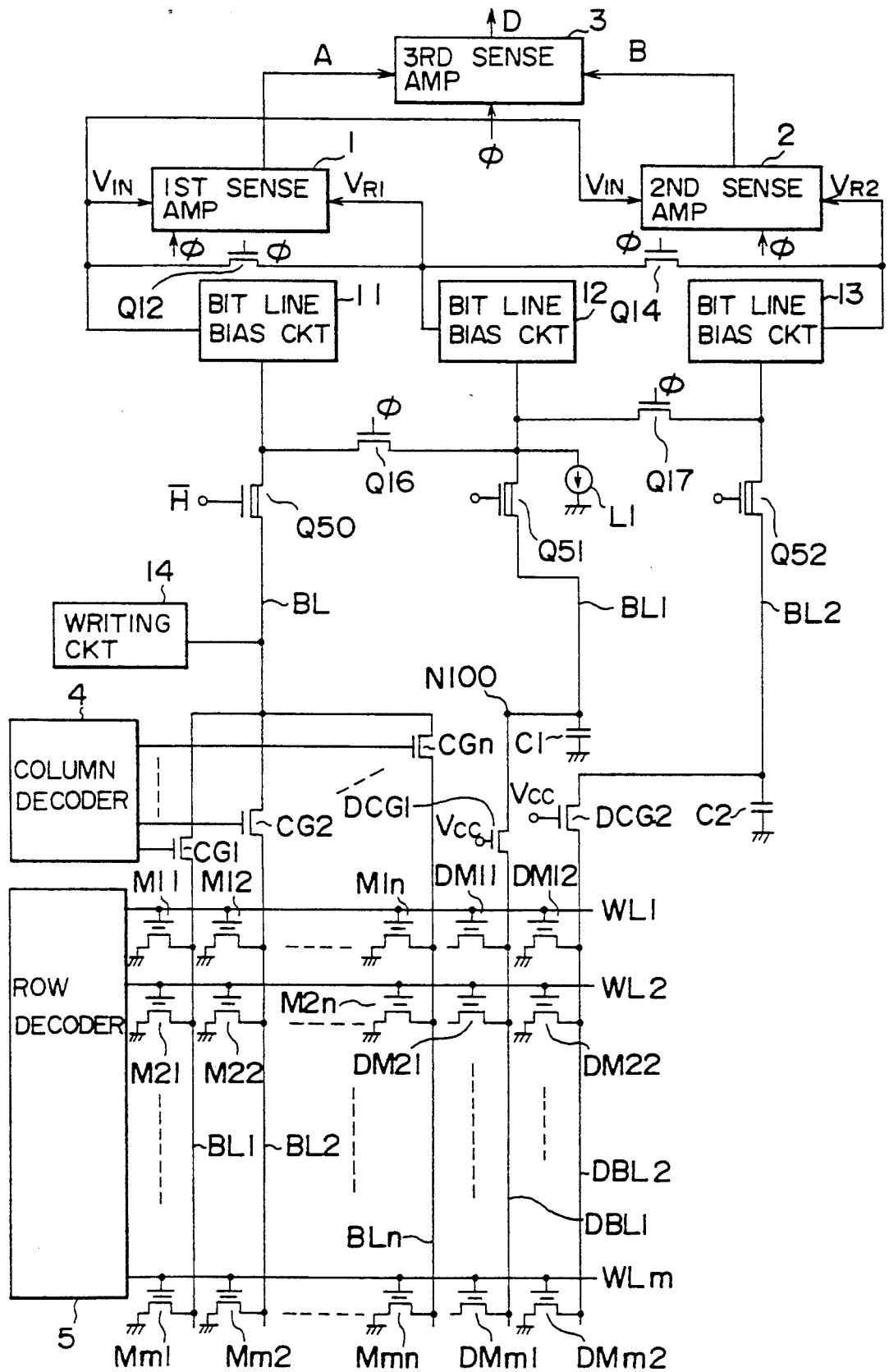
F I G. 31

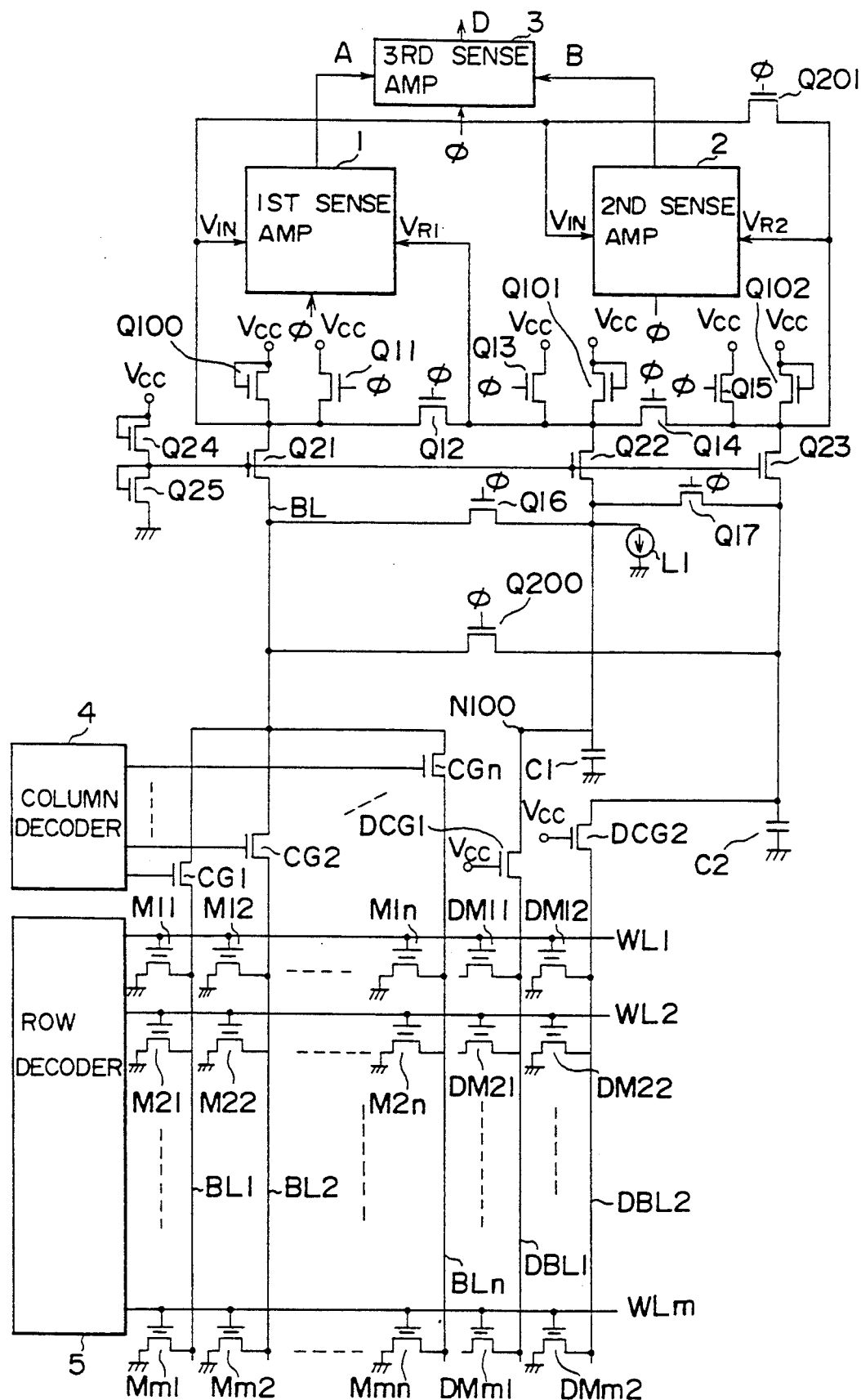
F I G. 33

⊙ --- BIT LINE BL
○ --- 1ST REFERENCE BIT LINE DBL 1
● --- 2ND REFERENCE BIT LINE DBL 2

① ---- 1ST BIT LINE 1BL
② ---- 2ND BIT LINE 2BL
○ ---- 1ST REFERENCE BIT LINE 1DBL
● ---- 2ND REFERENCE BIT LINE 2DBL

①--- 1ST BIT LINE 1BL
②--- 2ND BIT LINE 2BL
○--- 1ST REFERENCE BIT LINE 1
●--- 2ND REFERENCE BIT LINE 2
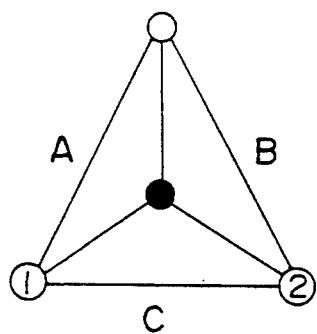
FIG.37(1-0)
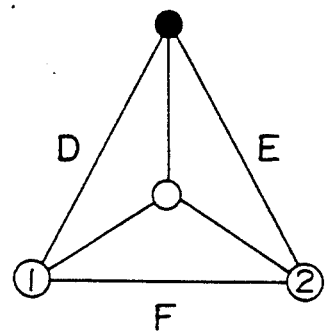
FIG.37(1-1)

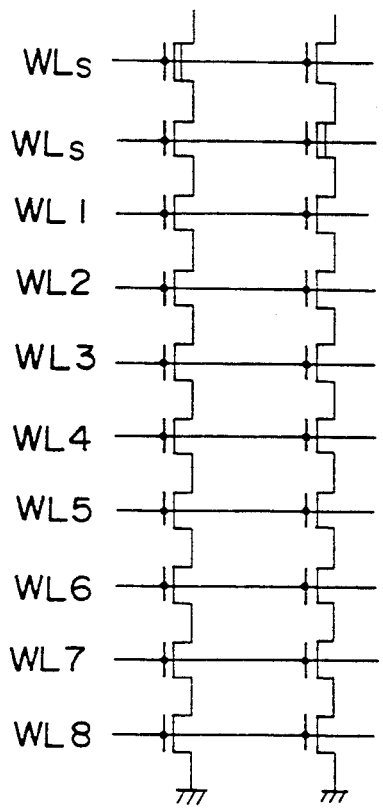
FIG. 42
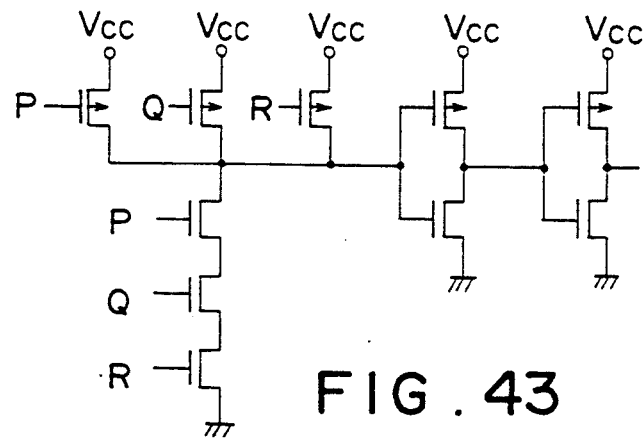
FIG. 43
| | P | Q | R |
|---|---|---|---|
| WL1 | $\bar{A}_0$ | $\bar{A}_1$ | $\bar{A}_2$ |
| WL2 | $A_0$ | $\bar{A}_1$ | $\bar{A}_2$ |
| WL3 | $\bar{A}_0$ | $A_1$ | $\bar{A}_2$ |
| WL4 | $A_0$ | $A_1$ | $\bar{A}_2$ |
| WL5 | $\bar{A}_0$ | $\bar{A}_1$ | $A_2$ |
| WL6 | $A_0$ | $\bar{A}_1$ | $A_2$ |
| WL7 | $\bar{A}_0$ | $A_1$ | $A_2$ |
| WL8 | $A_0$ | $A_1$ | $A_2$ |
FIG. 44
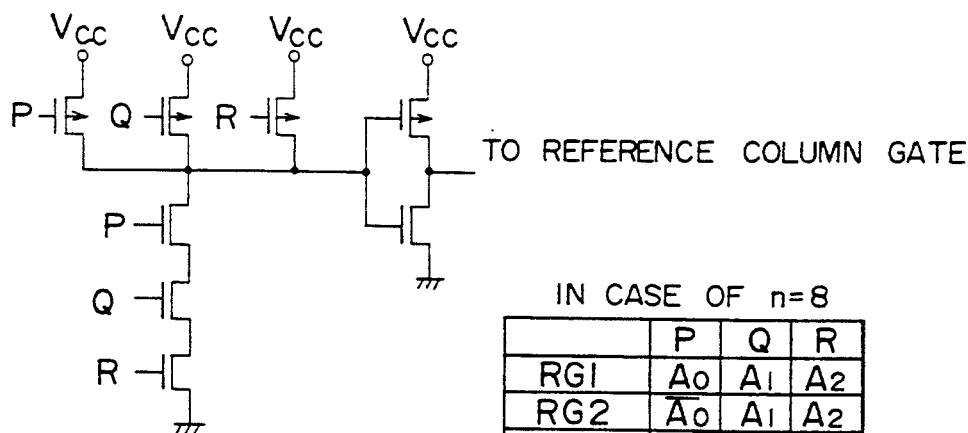
FIG. 45
IN CASE OF n=8
| | P | Q | R |
|---|---|---|---|
| RG1 | $A_0$ | $A_1$ | $A_2$ |
| RG2 | $\bar{A}_0$ | $A_1$ | $A_2$ |
| RG3 | $A_0$ | $\bar{A}_1$ | $A_2$ |
| RG4 | $\bar{A}_0$ | $\bar{A}_1$ | $A_2$ |
| RG5 | $A_0$ | $A_1$ | $\bar{A}_2$ |
| RG6 | $\bar{A}_0$ | $A_1$ | $\bar{A}_2$ |
| RG7 | $A_0$ | $\bar{A}_1$ | $\bar{A}_2$ |
| RG8 | $\bar{A}_0$ | $\bar{A}_1$ | $\bar{A}_2$ |
FIG. 46

SEMICONDUCTOR MEMORY DEVICE

TECHNICAL FIELD

This invention relates to a semiconductor memory device.

A conventional semiconductor memory device constructed so that a data readout speed is caused to be faster will be described with reference to FIG. 54. This semiconductor memory device comprises two memory cell arrays of the same structure to allow a pair of cells to be operative at the same time to read out data therefrom. More particularly, this memory device is of an EPROM structure in which floating gate type MOSFETs are arranged in a matrix form as respective memory cells. Memory cells T11, T12, . . . , Tmn and memory cells TT11, TT12, . . . , TTmn comprised of floating gate type MOSFETs function to store either of binary data. For storing data of one bit, two memory cells such as memory cells T11 and TT11, and T12 and TT12 and so on are used as a pair or a set.

Gates of memory cells belonging to respective the same rows are connected to word lines WL1, WL2, . . . , WLm. Further, drains of memory cells belonging to respective columns are connected to bit lines BL1, BL2, . . . , BLn or bit lines BBL1, BBL2, . . . , BBLn. A memory cell is selected by a column decoder 4 and a row decoder 5. The column decoder 4 selects arbitrary bit lines by selectively driving column gate transistors CG1, CG2, . . . , CGn and column gate transistors CCG1, CCG2, . . . , CCGn.

Transistors Q2 and Q4 serve to charge these bit lines BL and BBL, respectively. Further, transistors Q3 and Q6 serve to make a connection of bit lines BL and BBL to place them in an equipotential state (hereinafter referred to as "equalization"). Transistors Q2–Q4 and Q6 become operative when a pulse signal $\phi$ is a logic "1". Transistors Q1 and Q5 serve to allow a predetermined current to flow to the bit line BL and the bit line BBL, respectively, with a view to making a compensation such that potentials on the bit line BL and the bit line BBL charged by the transistors Q2 and Q4, respectively, are not lowered by a leak current, etc., thus to charge bit lines.

Further, transistors Q7, Q8, Q9 and Q10 serve to suppress elevations in the drain voltages of respective memory cells so that each drain voltage is not above a predetermined level, thus to improve reliability of the memory cells.

A sense amplifier 10 serves to compare, with each other, changes in potentials on the bit line BL and the bit line BBL which are respectively given as voltages VIN1 and VIN2 to thereby sense data stored in the memory cells to output its result to an external equipment (not shown) as a signal D.

In the memory device thus constructed, how the sense amplifier 10 reads out data stored in the memory cells will now be described.

The storage of data in the memory cell is conducted depending upon whether or not electrons are injected into the floating gate. The memory cells in which electrons are injected into the floating gate are maintained in an OFF state even when a signal of logic "1" level is applied to the gates thereof. In contrast, the memory cells in which no electron is injected into the floating gate are turned on when that signal is applied. More particularly, a pair of memory cells have a relationship such that they are in states opposite to each other such that if electrons are injected into the floating gate of, e.g., one memory cell T11, no electron is injected into the other memory cell TT11.

For example, a word line WL1 is placed at a predetermined potential by the row decoder 5. Further, the column gate transistor CG1 and the column gate transistor CCG1 become conductive by the column decoder 4. A pair of memory cells, e.g., memory cells T11 and TT11 are thus selected.

Data stored in the memory cells T11 and TT11 thus selected are read by the sense amplifier 10. This reading operation is caused to be fast by carrying it in a manner described below. An explanation thereof will now be made with reference to FIG. 55.

When an equalization signal $\phi$ of "1" is applied to each gate of precharging transistors Q2 and Q4 and equalizing transistors Q3 and Q6, these transistors become conductive. As a result, the bit lines BL and BBL are precharged and equalized. Thus, for a period during which the equalization signal $\phi$ is at "1" level (period t11), the potential VIN1 on the bit line BL and the potential VIN2 on the bit line BBL are charged so that these bit lines both have a potential equal to each other.

Thereafter, when the equalization signal $\phi$ changes to "0" level (period t12), the precharging transistors Q2 and Q4 and the equalizing transistors Q3 and Q6 become non-conductive. Thus, potential on the bit lines BL and BBL become equal to the potential VIN1 and VIN2 corresponding to data stored in the memory cells T11 and TT11, respectively. Since one transistor T11 into which electrons are injected is in a non-conductive state, the bit line BL is brought into a charged state, resulting in a high potential VIN1. In contrast, since no electron is injected into the other transistor TT11, the bit line BBL is brought into a discharged state, resulting in a low potential VIN2.

The difference between the potential on such bit lines BL and BBL is sensed at the sense amplifier 10 to make a comparison therebetween. When the potential VIN1 is higher than the potential VIN2 as shown in FIG. 55, the sense amplifier 10 outputs a signal D of "1" level, while when the potential VIN1 is lower than the potential VIN2, the sense amplifier 10 outputs a signal D of "0" level. As stated above, since a potential difference produced at the moment the equalization signal $\phi$ changes from "1" to "0" level is sensed, the read operation can be conducted faster than that in the case where read operation is started after a potential difference naturally occurs depending upon the storage state without carrying out precharging and equalizing operations.

As indicated by the reference symbol B in FIG. 55, an output signal D from the sense amplifier is also controlled by the equalization signal $\phi$. When the equalization signal $\phi$ is a logic "1", the signal D is set at a level intermediate between "1" and "0" level, thus allowing a transition to "1" or to "0" level of the signal D after the equalization signal $\phi$ changes to "0" level to be conducted faster.

In a semiconductor memory device adapted to perform such a high speed operation, the current supply ability of a transistor of the output stage for outputting data to the external is set to an extremely large value in order to output the data at a high speed to a connection line to external devices. As a result, the quantity of changes in a current flowing in the transistor of the output stage becomes large, resulting in changes in the power supply voltage. In view of this, a measure is taken to combine two memory cells to make a selective drive by the same word line to compare potentials on bit lines produced due to a difference between data in respective memory cells to thereby equalize the influences of the changes of the power supply voltage on potentials of respective bit lines, thus to prevent occurrence of an erroneous operation.

As a result, for high speed operation, two memory cells are combined for storage of one bit data. Thus, the chip area in this case becomes larger than those in low speed or medium speed semiconductor memory devices, resulting in the problem of an increased chip cost.

With the above in view, an object of this invention is to provide a semiconductor memory device which operates at a high speed, does not provide an erroneous operation due to changes in a power supply voltage, has a reduced chip area, and a decreased chip cost.

DISCLOSURE OF THE INVENTION

In accordance with the first aspect of a semiconductor memory device according to this invention, there is provided a semiconductor memory device comprising: a memory cell for storing at least binary data; a first reference cell placed in a storage state equivalent to that one logical state of the binary data; a second reference cell placed in a storage state equivalent to the other logical state of the binary data; a first sense amplifier section for comparing voltages changed in response to respective storage states of the memory cell and the first reference cell to provide a second output corresponding to the compared result; and a third sense amplifier section for comparing the first and second outputs to thereby sense the storage state of the memory cell.

It is preferable that the semiconductor memory device comprises a bit line for outputting a voltage corresponding to the storage state of the memory cell, a first reference bit line for outputting a voltage corresponding to the storage state of the first reference cell, and a second reference bit line for outputting a voltage corresponding to the storage state of the second reference cell.

It is desirable that the memory cell includes a floating gate, and for storing binary data in response to whether or not electrons are injected into the floating gate.

It is preferable that the first and second reference cells and the memory cell are electrically equivalently connected, the first reference cell having a high threshold value substantially the same as a threshold value of the memory cell into which electrons are injected. It is desirable that the semiconductor memory device comprises reference bit line leak means for allowing a very small current in the first reference bit line to prevent the first reference bit line from being in a floating state.

It is desirable to provide leak means for forming a leak current path in the bit line and the reference bit lines so that a potential on the bit line is lower than a potential on each reference bit line when no electron is injected into the floating gate of the memory cell, and that a potential on the bit line is higher than a potential on each reference bit line when electrons are injected into the floating gate of the memory cell.

It is desirable to provide precharge means wherein when an address for selecting the memory cell changes, the precharge means is brought into a conductive state for a predetermined period to charge the bit line and the first and second reference bit lines.

It is desirable that the semiconductor memory device comprises equalizing means wherein an address signal for selecting the memory cell changes, the equalizing means is brought into a conductive state for a predetermined period to equalize with each other potentials on the bit-line and the first and second reference bit lines.

In accordance with the second aspect of a semiconductor memory device according to this invention, there is provided a semiconductor memory device comprising: first and second memory cells each including a floating gate and for storing binary data in response to whether or not electrons are injected into said floating gate; a first reference cell line placed in a storage state equivalent to that of the memory cell in which electrons are injected into said floating gate and a second reference cell line placed in a storage state equivalent to that of the memory cell in which no electron is injected into the floating gate; a first bit line for outputting a voltage corresponding to the storage state of the first memory cell when reading out data stored in the first memory cell; a second bit line for outputting a voltage corresponding to the storage state of the second memory cell when reading out data stored in said second memory cell; a first reference bit line for outputting a voltage corresponding to the storage state of the first reference cell line; a second reference bit line for outputting a voltage corresponding to the storage state of the second reference cell line; first sense amplifier section for comparing voltages on the first bit line and the first reference bit line to thereby produce a first output corresponding to the storage state of the first memory cell; a second sense amplifier section for comparing voltages on the first bit line and said second reference bit line to thereby produce a second output corresponding to the storage state of the first memory cell; a third sense amplifier section for comparing the first and second outputs to thereby sense the storage state of the first memory cell; a fourth sense amplifier section for comparing voltages on the second bit line and the first reference bit-line to thereby produce a fourth output corresponding to the storage state of the second memory cell; a fifth sense amplifier section for comparing voltages on the second bit line and the second reference bit line to thereby produce a fifth output corresponding to the storage state of the second memory cell; and a sixth sense amplifier section for comparing the fourth and fifth outputs to sense the storage state of the second memory cell.

There is also provided a first reference bit line for outputting a voltage corresponding to the storage state of the reference cell line; a second reference bit line for outputting a voltage corresponding to the storage state of the second reference cell line; a first sense amplifier section for comparing voltages on the first bit line and the first reference bit line to thereby produce a first output corresponding to the storage state of the memory cell; a second sense amplifier section for comparing voltage on the first bit line and said second reference bit line to thereby produce a second output corresponding to the storage state of the first memory cell; a third sense amplifier section for comparing the first and second outputs to thereby sense the storage state of the first memory cell.

Further, in accordance with the third aspect of a semiconductor memory device, there is provided a semiconductor memory device comprising: a memory cell including a floating gate and for storing binary data in response to whether or not electrons are injected into the floating gate; a first reference cell placed in a storage state equivalent to that of the memory cell in which electrons are injected into the floating gate; a second reference cell placed in a storage state equivalent to that of the memory cell in which no electron is injected into the floating gate; a bit line for outputting a voltage corresponding to the storage state of the first memory cell when reading out data stored in the memory cell; means for setting a voltage outputted from the second reference bit line at the time of a program verify data read operation carried out after data is written into said memory cell to a value higher than a voltage outputted from the second reference bit line at the time of an ordinary readout operation of data in the memory cell; a fourth sense amplifier section for comparing a voltage outputted from the second reference bit line with a voltage outputted from the bit line at the time of the program verify data read operation to thereby sense the storage state of the memory cell, and output switching means for outputting a sensed result from the third sense amplifier section at the time of reading out the data and for outputting a sensed result from the fourth sense amplifier section at the time of the program verify data read operation.

Further, in accordance with the fourth aspect of the semiconductor memory device according to this invention, there is provided a semiconductor memory device comprising: a memory cell including a floating gate, and for storing binary data in response to whether or not electrons are injected into said floating gate; a first reference cell placed in a storage state equivalent to that of the memory cell in which electrons are injected into the floating gate; a second reference cell placed in a storage state equivalent to that of the memory cell in which no electron is injected into the floating gate; a first sense amplifier section for comparing voltages changed in response to respective storage states of said memory cell and the first reference cell to provide a first output corresponding to the compared result; a second sense amplifier section for comparing voltages changed in response to respective storage states of the memory cell and said second reference cell to provide a second output corresponding to the compared result; and a third sense amplifier section for comparing the first and second outputs to thereby sense the storage state of the memory cell whereby a current flowing in the memory cell in which no electron is injected into the floating gate is less than a current flowing in the second reference bit line.

In accordance with the fifth aspect of the semiconductor memory device according to this invention, there is provided a non-volatile semiconductor memory comprising: a memory cell including a floating gate, and for storing binary data in response to whether or not electrons are injected into the floating gate; a first reference cell placed in a storage state equivalent to that of the memory cell in which electrons are injected into the floating gate; a second reference cell placed in a storage state equivalent to that of the memory cell in which no electron is injected into the floating gate; a first sense amplifier section for comparing voltages changed in response to respective storage states of the memory cell and the first reference cell to provide a first output corresponding to the compared result; a second sense amplifier section for comparing voltages changed in response to respective storage states of the memory cell and the second reference cell to provide a second output corresponding to the compared result; a third sense amplifier section for comparing the first and second outputs to thereby sense the storage state of the memory cell; a voltage drop circuit for outputting a voltage corresponding to a power supply voltage, and lower than the power supply voltage by a predetermined value; and a third reference cell having a drain connected to the drain of the first reference cell and a gate connected to the output terminal of the voltage drop circuit, the third reference cell being placed in a state equivalent to that of the memory cell in which no electron is injected into the floating gate.

In accordance with the sixth aspect of the semiconductor memory device according to this invention, there is provided a semiconductor memory device comprising: a memory cell for storing binary data at a manufacturing stage by patterning "0" or "1" of binary data on a glass mask; a first reference cell placed in a storage state equivalent to that of the memory cell in which "0" of the binary data is stored; a second reference cell placed in a storage state equivalent to that of the memory cell in which "1" of the binary data is stored; a first sense amplifier section for comparing voltages changes in response to respective storage states of the memory cell and the first reference cell to provide a first output corresponding to the compared result; a second sense amplifier section for comparing voltages changed in response to respective storage states of said memory cell and said second reference cell to provide a second output corresponding to the compared result; and a third sense amplifier section for comparing said first and second outputs to thereby sense the storage state of said memory cell.

In accordance with the seventh aspect of a semiconductor memory device according to this invention, there is provided a non-volatile semiconductor memory device comprising: a non-volatile memory cell for storing "0" or "1" of binary data in response to whether a MOS transistor is of a depletion type or an enhancement type; a NAND bundle transistor train comprised of n number of the memory cells and select transistors connected in series; a bit line to which a plurality of sets of the NAND bundle transistor trains are connected, the bit line being operative to output a voltage corresponding to the storage state of the memory cell when reading out data stored in the memory cell; a first reference NAND bundle transistor train having the same configuration as that of the NAND bundle transistor train, and being comprised of a series circuit comprising a single first reference cell equivalent to the depletion type memory cell, (n−1) first reference cells equivalent to the enhancement type memory cell, and NAND select transistors; a first reference bit line to which a plurality of said first reference cell NAND bundle transistor trains are connected, the first reference bit line being operative to output a voltage corresponding to the storage state of the depletion type first reference cell, a second reference NAND bundle transistor train having the same configuration as that of the NAND bundle transistor train, and being comprised of a series circuit comprising n number of second reference cells equivalent to the enhancement type memory cell and NAND select transistors, a second reference bit line to which a plurality of sets of the reference NAND bundle transistor bundles are connected, said second reference bit line being operative to output a voltage corresponding to the storage state of the enhancement type second reference cell, a first sense amplifier section for comparing voltages on the bit line and said first reference bit line to thereby produce a first output corresponding to the storage state of the memory cell; a second sense amplifier section for comparing voltages on the bit line and second reference bit line to thereby produce a second output corresponding to the storage state of the memory cell, and a third sense amplifier section for comparing the first and second outputs to thereby sense the storage state of the memory cell.

In accordance with the eighth aspect of a semiconductor memory device according to this invention, there is provided a semiconductor memory device comprising: bit lines; word lines; a memory cell array including memory cells arranged on the intersecting points of the bit lines and the word lines; a auxiliary memory cell array provided in association with the memory cell array; programming means for storing that there are defective cells in said memory cell array; select means wherein when there is any defective cell in the memory cell array, the select means responds to an output from the programming means to select an auxiliary memory cell from the auxiliary memory cell array in place of the defective cell; a reference bit line to which the drain of a reference cell equivalent to the memory cell is connected, a reference potential being produced therefrom, a sense amplifier for comparing a voltage appearing on the bit line with a voltage appearing on the reference bit line to read out data of a selected memory cell; and equalizing means for equalizing the bit line and said reference bit line for a predetermined time at the time of data read operation, whereby when there is any defective cell in said memory cell, an equalization time by said equalizing means is set to a value longer than said predetermined time in response to an output of said programming means.

In accordance with the ninth aspect of a semiconductor memory device according to this invention, there is provided a semiconductor memory device comprising: bit lines; word lines; a memory cell array including memory cells arranged on the intersecting points of the bit lines and the word lines; an auxiliary memory cell array provided in association with the memory cell array; programming means for storing that there are defective cells in the memory cell array, select means wherein when there is any defective cell in the memory cell array, the select means responds to an output from the programming means to select the auxiliary memory cell array in place of the defective cell, a first reference cell placed in a storage state equivalent to the memory cell in which electrons are injected into the floating gate; a first reference bit line for producing a voltage corresponding to the storage state of the first reference cell; a second reference cell placed in a storage state equivalent to the memory cell in which no electron is injected into the floating gate; a second reference bit line for outputting a voltage corresponding to the storage state of the second reference cell; a first sense amplifier section for comparing voltages changed in response to respective storage states of the memory cell and the first reference cell to provide a first output corresponding to the compared result, a second sense amplifier section for comparing voltages changed in response to respective storage states of the memory cell and the second reference cell to provide a second output corresponding to the compared result; a third sense amplifier section for comparing the first and second outputs to thereby sense the storage state of the memory cell; equalizing means for equalizing the bit line and the first and second reference bit lines for a predetermined time at the time of data read operation, whereby when there is any defective cell in the memory cell, an equalizing time by the equalizing means is set to a value longer than the predetermined time in response to an output from the programming means.

In accordance with this invention, the storage state of the memory cell and the states of the first and second reference cells are compared. Thus, data stored in the memory cell is detected. Accordingly, the number of required memory cells can be reduced to one half of that in the case of storing data of one bit into two memory cells to compare storage states with each other to thereby read out data.

By allowing a very small current to flow in the first reference bit line, that bit line is prevented from being brought into a floating state. Thus, an erroneous operation can be prevented.

In the case where leak means is provided, the relationship between potentials on the bit line and the reference bit line becomes reasonable. Thus, the sense operation is performed at a high speed and the margin is increased.

In the case where equalizing means is provided, it is possible to equalize potentials on the bit line and the reference bit line to stabilize the operation.

In the case where precharge means is provided, it is possible to prevent changes in potentials on the bit line and the reference bit line by changes in the equalizing signal when the equalization is completed. Thus, occurrence of an erroneous operation can be prevented.

In the device based on the second aspect, since data of one bit is stored by two memory cells to take out data by the reference cell in two states with respect to respective data, high speed data sense can be made. In addition, by suitably carrying out equalization, a higher speed operation can be performed.

In the device based on the third aspect, a technique is employed to set, at the time of the program verify operation, an output voltage on the second bit line to a value higher than that at the time of the ordinary read operation, and to use a sense amplifier dedicated thereto. Thus, it is possible to increase the quantity of electrons injected into the memory cell at the time of the write operation to increase the voltage margin.

In the device based on the fourth aspect, a current flowing on the second reference bit line is set to a value smaller than a current flowing in the memory cell in which no electron is injected into the floating gate of the memory cell. Thus, an output from the second sense amplifier reaches an intermediate potential between "0" and "1" at a higher speed. Thus, the data sense speed is improved.

In the device based on the fifth aspect, by providing the voltage drop circuit for outputting a voltage lower than the power supply voltage by a predetermined value, and the third reference cell in the state equivalent to the memory cell in which no electron is injected into the floating gate, its drain being connected to the drain of the first reference cell, its gate being connected to the output of the voltage drop circuit, the operation is performed at a higher speed.

In the device based on the sixth aspect, by providing "0" or "1" of binary data on a glass mask, the mask ROM similar to the device based on the first aspect can be provided.

In the device based on the seventh aspect, by constituting the memory cell with a non-volatile memory cell for storing data in response to whether the MOS transistor is of a depletion type or an enhancement type, and by constituting the reference cell with a NAND bundle transistor train, a non-volatile semiconductor memory device can be provided.

In the device based on the eighth aspect, the auxiliary memory cell is provided in association with the memory cell array, and when there is any defective cell, the equalizing time for equalizing the bit line and the reference bit line is set to a value longer than that in the ordinary operation. Accordingly, row lines where there occurs an unsatisfactory operation are securely brought into a non-selected state. As a result, the possibility that any erroneous operation takes place is reduced.

Finally, in the device based on the ninth aspect, elongation of the equalizing time based on the eighth aspect is applied to the memory device based on the first aspect. Similarly, the possibility of occurrence of an erroneous operation is reduced.

BRIEF DESCRIPTION OF THE DRAWINGS

In the accompanying drawings,

FIG. 31 is a circuit diagram showing a further embodiment capable of providing the same effect as that of the embodiment shown in FIG. 29;

FIG. 33 is a circuit diagram showing an embodiment in which the equalization system is improved;

FIG. 42 shows an example of a memory cell NAND bundle constituted with eight word lines;

FIG. 43 is a circuit diagram showing an example of a decoder for selecting word lines of the NAND type ROM shown in FIG. 42;

FIG. 44 is a Table showing address inputs and selection of word line;

FIG. 45 is a circuit diagram showing an example of a reference decoder;

FIG. 46 is a Table showing address inputs and selection of reference column gates;

DESCRIPTION OF THE PREFERRED EMBODIMENTS

Preferred embodiments of this invention will now be described with reference to the attached drawings.

Figure 1:
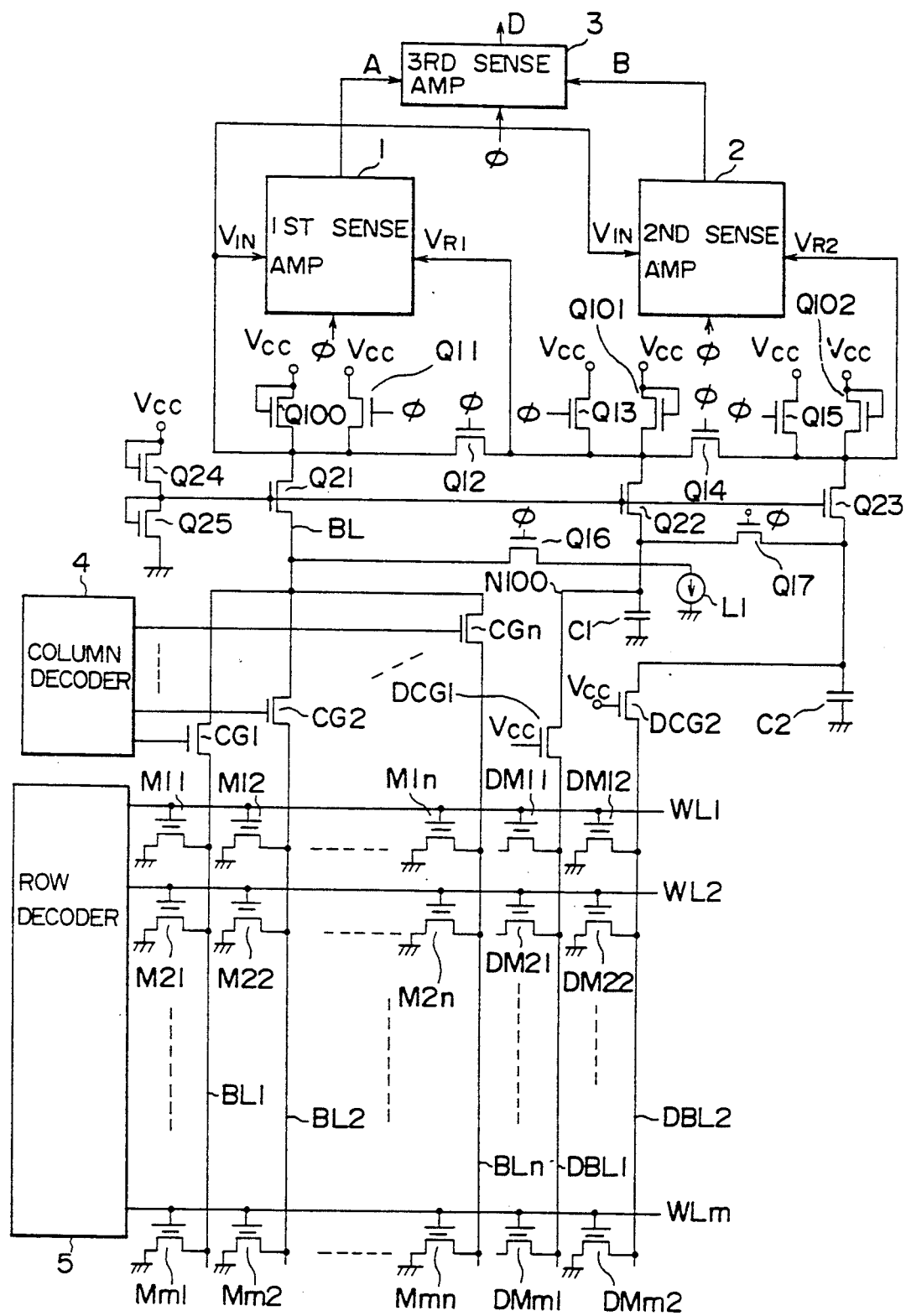
FIG. 1 is a circuit diagram showing the configuration of a semiconductor memory device according to a first embodiment of this invention.

FIG. 1 shows a circuit configuration of a first embodiment. This embodiment differs from the prior art in that storage of data corresponding to one bit is constituted by a single memory cell, that there are provided two columns of first and second reference (dummy) cells DM11, ..., DMm1 and DM12, ... DMm2 for storing data for setting voltages serving as references in reading out data stored in the single memory cell, and that there are provided three sense amplifiers for sensing data stored in the memory cell in correspondence with the above modifications. In this embodiment, the same reference numerals are attached to the same components as those in the prior art, respectively, and their explanation will be omitted.

The source of the first reference cells DM11, DM21, ... DMm1 are in a floating state, respectively. Even if a signal of a logic "1" is applied to their gates, no current path is formed. Thus, these first reference cells are equivalent to the memory cell in which electrons are injected into the floating gate. On the other hand, the second reference cells DM12, DM22, ..., DMm2 have floating gates into which no electron is injected. Thus, these second reference cells are equivalent to the memory cell in which no electron is injected.

Drains of the first reference cells DM11, DM21, ..., DMm1 are connected to the first reference bit line DBL1, and drains of the second reference cells DM12, DM22, ... DMm2 are connected to the second reference bit line DBL2. Further, MOSFET DCG1 and DCG2 equivalent to the column gate CG are connected to the reference bit lines DBL1 and DBL2, respectively. The capacitances C1 and C2 are connected in order to make zero a difference between capacitance values of the bit lines and the reference bit lines, which results from a difference between the number of column gate transistors CG1, CG2 ... on the memory cell side and the number of reference column gate transistors DCG1 and DCG2 on the reference cell side, thus to equalize capacitance values of the bit lines and the reference lines.

A leak current path L1 connected to the reference bit line DBL1 serves to form a current path in order to prevent the reference bit line DBL1 from electrically being in a floating state because no current path is formed in the first reference cell. For the purpose of allowing the characteristics of respective bit lines to be all equivalent to each other, a leak current path for allowing a very small current to flow may be similarly connected to the bit line BL and/or the reference bit line DBL2.

An address transition detecting circuit (not shown) detects that an address signal inputted from the external has been changed to generate an equalization signal $\phi$. When this equalization signal $\phi$ is a logic "1", transistors Q11, Q13 and Q15 precharge the bit line BL and the reference bit lines DBL1 and DBL2, and transistors Q12, Q14, Q16 and Q17 allow the potentials of the bit line and the reference bit lines to be equal to each other. Further, transistors Q100, Q101 and Q102 correspond to first, second and third load circuits, respectively. These transistors allow predetermined currents to flow so that potentials on the bit line BL, and the reference bit lines DBL1 and DBL2 precharged by the transistors Q11, Q13 and Q15 are not lowered by a leak current, etc to charge these bit lines. For this reason, those conduction resistance values are set to extremely large values, respectively. Further, transistors Q21, Q22, Q23, Q24 and Q25 serve to suppress rising of drain voltages of memory cells or reference cells so that they do not exceed predetermined levels, thus to improve reliability of the memory cells, respectively. The transistors Q21, Q22 and Q23 correspond to first, second and third bias transistors, respectively.

The first sense amplifier 1 compares a potential VIN on the bit line BL and a potential VR1 on the reference bit line DBL1 to output a signal A corresponding to the first output as the compared result.

The second sense amplifier 2 is supplied with the potential VIN and a potential VR2 on the reference bit line DBL2 to make a comparison therebetween to output a signal B corresponding to the second output. Further, the third sense amplifier 3 is supplied with first and second signals to make a comparison therebetween to output a signal D as the third output which is in correspondence with data of a selected memory cell.

Figure 2:
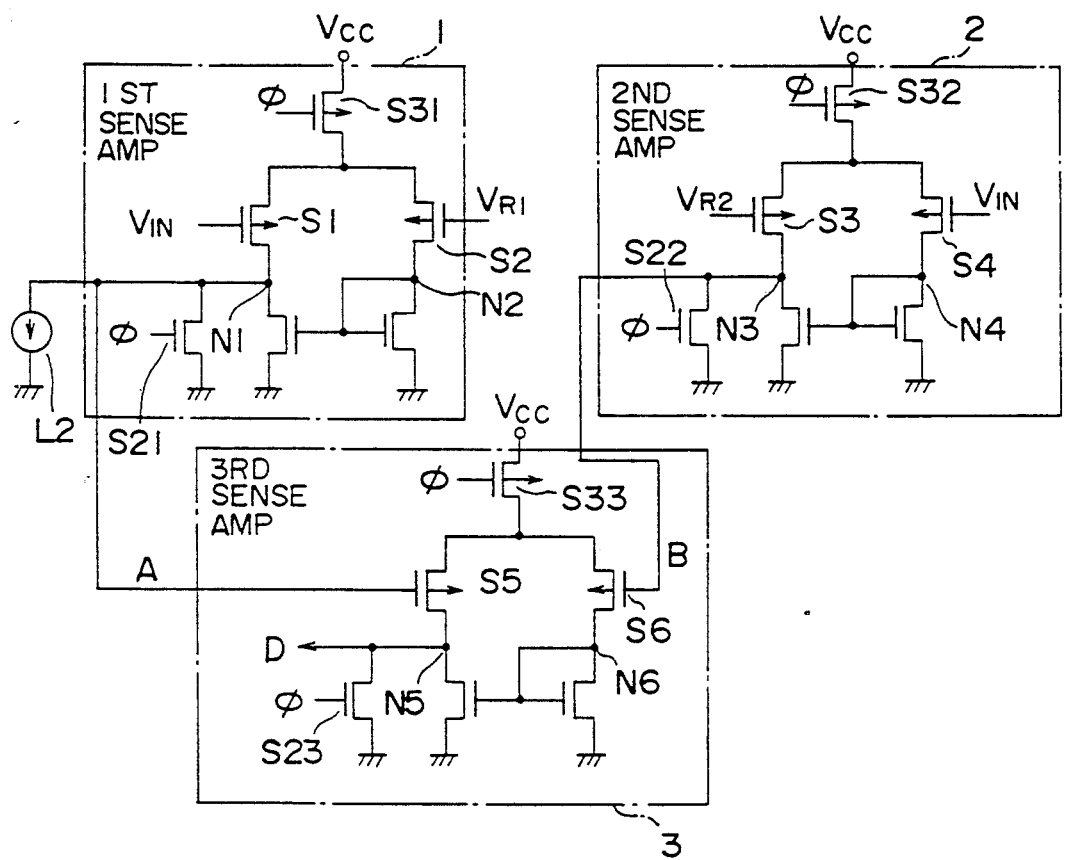
FIG. 2 is a circuit diagram showing the configuration of first, second and third sense amplifiers in the device shown in FIG. 1.

FIG. 2 shows an example of the circuit configuration of the first, second and third sense amplifiers. These sense amplifiers all constitute current mirror circuits, respectively. Potentials VIN and VR1 are applied to the gates of P-channel enhancement type transistors S1 and S2 of the first sense amplifiers 1, respectively. Thus, a first signal A is outputted therefrom. Further, potentials VR2 and VIN are applied to the gates of P-channel enhancement type transistors S3 and S4 of the second sense amplifier 2, respectively. Thus, a second signal B is outputted therefrom. In addition, the first and second signals A and B are applied to the gates of P-channel enhancement type transistors S5 and S6 of the third sense amplifier 3, respectively. Thus, a third signal D is outputted therefrom, respectively.

The operation for reading out data stored in the memory cell in this embodiment thus constructed will be described as below.

One of word lines WL is selected by the row decoder 5. Further, one of column gate transistors CG is selected by the column decoder 4. Thus, a memory cell existing on an intersecting point of a bit line corresponding to the selected column gate transistor and the selected word line is selected.

Further, two reference cells connected to the same word line WL as that of the memory cell selected by the row decoder 5 are also selected.

Figure 3:
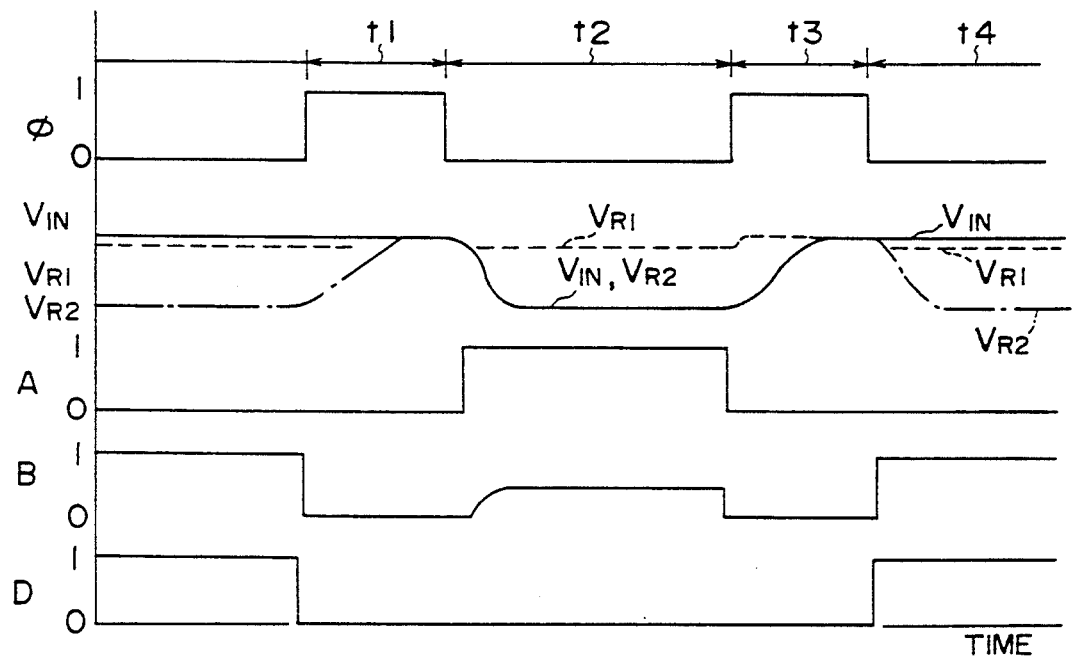
FIG. 3 is a timing chart showing the relationship of an equalization signal $\phi$, voltages VIN, VR1 and VR2 and signals A, B and D in the device shown in FIG. 1.

The relationship of the equalization signal $\phi$, the potentials VIN, VR1 and VR2, and the signals A, B and D is shown in FIG. 3. When the equalization signal $\phi$ changes from "0" to "1" level (period t1), the transistors Q11, Q13 and Q15 are turned on. As a result, the bit line BL and the reference bit lines DBL1 and DBL2 are precharged, and are set to have substantially the same potential by the transistors Q12, Q14, Q16 and Q17. Thus, for this period t1, the VIN, VR1 and VR2 are precharged to the same potential.

At this time, respective N-channel enhancement type transistors S21, S22 and S23 in the first, second and third sense amplifiers are conductive by the equalization signal $\phi$ of logic "1" level. On the other hand, respective P-channel enhancement type transistors S31, S32 and S33 are turned off by the equalization signal $\phi$. As a result, signals A, B and D outputted from nodes N1, N3 and N5 become all equal to a logic "0".

When the equalization signal $\phi$ changes from "1" to "0" (period t2), transistors Q11, Q13 and Q15, and transistors Q12, Q14, Q16 and Q17 all become non-conductive. As a result, potentials on the bit line BL and the reference bit lines DBL1 and DBL2 vary in response to storage states of a selected memory cell and reference cells, respectively. Similarly, transistors S21, S22 and S23 in FIG. 2 become non-conductive and the transistors S31, S32 and S33 become conductive. As a result, the first, second and third amplifiers start the sense operation.

This period t2 shows the case where a memory cell in which no electron is injected into the floating gate is selected. Since the memory cell is conductive, the bit line BL is discharged, so the potential VIN is lowered. On the contrary, since reference cells DM11 to DMm1 are all in a non-conductive state equivalent to the state where electrons are injected, the reference bit line DBL1 is placed in a charged state. As a result, the potential VR1 is maintained in a charged state. In this case, the potential VR1 is slightly lowered by a potential corresponding to a leak current by the leak current path L1. Further, since no electron is injected to all the reference cells DM12 to DMm2 and these reference cells are therefore conductive, the reference bit line DBL2 is discharged. As a result, the potential VR2 is lowered to the same level as that of the potential VIN.

Thus, the potential VIN in the discharged state is applied to the gate of the transistor S1 of the first sense amplifier 1 and thus the transistor S1 becomes conductive. On the other hand, the potential VR1 in a charged state is applied to the gate of the transistor S2, so this transistor S2 is maintained in a non-conductive state. Thus, a signal A of "1" level is outputted from the first sense amplifier.

Further, potentials VR2 and VIN in the discharged state are applied to the both gates of the transistors S3 and S4 of the second sense amplifier 2, respectively. As a result, both transistors become conductive. In the case where P-channel transistors S3 and S4 are both conductive as stated above, the signal B takes a medium value between a logic "1" and a logic "0".

The signal A of logic "1" level and the signal B having a potential intermediate between "1" and "0" level are applied to the gates of the transistors S5 and S6 of the third sense amplifier, respectively.

The third sense amplifier senses that the potential of the signal A is higher than the potential of the signal B to output a signal of logic "0" level to the output terminal thereof.

To read data stored in a newly selected memory cell, the equalization signal $\phi$ changes from "0" to "1" level (period t3). As a result, the bit line BL and the reference bit lines DBL1 and DBL2 are precharged and are then placed in an equipotential state. In this case, the potentials VIN, VR1 and VR2 and the signals A, B and D are the same as those for the period t1.

When the equalization signal $\phi$ changes from "1" to "0" level (period t4), potentials on the bit line BL and the reference bit lines DBL1 and DBL2 vary in response to each storage state of a newly selected memory cell and reference cells, respectively. This period t4 shows the case where a memory cell in which electrons are injected into the floating gate is selected. Since this memory cell is non-conductive, the bit line BL is maintained in a charged state. Since potentials on the reference bit line DBL1 and the reference bit line DBL2 are exactly the same as those in the case of the above-described period t2, the potential VR1 is maintained in a charged state, and the potential VR2 is lowered. Thus, potentials VIN and VR1 both in a charged state are applied to the gates of the transistors S1 and S2 of the first sense amplifier 1, respectively. As a result, the transistor S1 becomes non-conductive, and the signal A is maintained in the state discharged by the transistor S21, namely the signal A is at logic "0" level.

A potential VR2 in a discharged state is applied to the gate of the transistor S3 of the second sense amplifier 2. As a result, the transistor S3 becomes conductive and a potential VIN in a charged state is applied to the transistor S4. The second sense amplifier 2 senses that the potential VIN is higher than the potential VR2 to allow the output signal B to have a logic "1" level.

The third sense amplifier senses that the potential of the signal A is lower than the potential of the signal B to allow the output signal D to have a logic "1" level.

As stated above, when no electron is injected into the floating gate of the memory cell, a signal D of "0" level is outputted. In contrast, when electrons are injected into that gate, a signal D of "1" level is outputted. Thus, the storage states of the memory cell are read out.

As described above, under this embodiment, the following advantages are provided. As compared to the conventional device, storage of data corresponding to one bit can be carried out by a single memory cell. As a result, the chip area is reduced, resulting in a reduced chip cost.

The readout operation in this case can be carried out by precharging and equalizing a bit line connected to a selected memory cell and reference bit lines connected to two kinds of reference cells to thereby equally place them at a high voltage to sense the moment they change from that state to voltages corresponding to respective storage states to read voltages changed. This method is equivalent to a conventional read method in which data opposite to each other are stored into two memory cells as data corresponding to one bit. Thus, high speed read operation is realized in the same manner as in the prior art.

The occurrence of an erroneous operation in the case where a power supply voltage changes is prevented as follows. In the case where a memory cell in which no electron is injected is selected (period t2), the first sense amplifier 1 makes a comparison between data from the memory cell in which no electron is injected and data from reference cells DM11 to DMm1 equivalent to the memory cell in which electrons are injected having no current path, i.e., between data from the memory cell turned ON and data from reference cells turned OFF. Accordingly, even in the case where a power supply voltage changes, the potential on the bit line is not inverted in the same manner as that in the conventional method in which data corresponding to one bit is stored into two memory cells as data opposite to each other, resulting in no erroneous operation.

Further, the second sense amplifier 2 makes a comparison between data from memory cells in which no electron is injected and data from reference cells DM12 to DMm2 equivalent to such memory cells to read out data obtained by comparison. For this reason, even in the case where a power supply voltage changes, the influence or effect on the bit line BL and that on the reference bit line DBL2 are equal to each other. Accordingly, while voltages VIN and VR2 inputted are both low, they undergo the same effect.

Thus, the relationship that the signal B outputted from the second sense amplifier 2 is lower than the signal A from the first sense amplifier 1 is maintained. The signal D from the third amplifier 3 stably holds "1" level. The occurrence of an erroneous operation is prevented.

In the case where a memory cell into which electrons are injected (period t4), the second sense amplifier 2 makes a comparison between data from the memory cell into which electrons are injected and data from reference cells DM12 to DMm2 equivalent to the memory cell into which no electron is injected, i.e., between data from the memory cell turned OFF and data from reference cells turned ON. Accordingly, even in the case where a power supply voltage changes, a potential on the bit line and a potential on the reference bit line are not inverted in the same manner as that in the conventional method in which data corresponding to one bit is stored into two memory cells as data opposite to each other, resulting in no erroneous operation. Further, the first sense amplifier 1 makes a comparison between data from a memory cell into which electrons are injected and data from reference cells DM11 to DMm1 equivalent to this memory cell to read data obtained by comparison. The influence or effect on the bit line BL and that on the reference bit line DBL1 compared at the first sense amplifier 1 are equal to each other, so they undergo the same change. Accordingly, the relationship that the signal A outputted from the first sense amplifier 1 is lower than the signal B outputted from the second sense amplifier 2 is maintained. Thus, a signal D of logic "1" level is stably outputted from the third sense amplifier 3 irrespective of changes in the power supply voltage.

As stated above, the semiconductor memory device according to the first embodiment can operate at a high speed and prevent occurrence of an erroneous operation due to changes in a power supply voltage. In addition, storage of data of one bit can be sufficiently made by a single memory cell transistor. Thus, the chip area can be reduced to the same extent as that of conventional medium or low speed memory devices, resulting in reduced cost.

Figure 4:
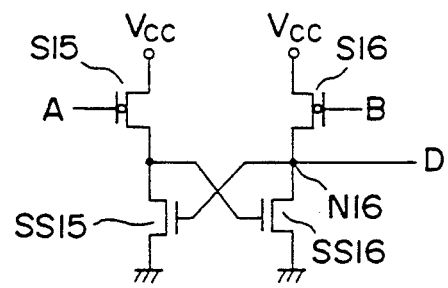
FIG. 4 is a circuit diagram showing the configuration of a third sense amplifier according to a second embodiment of this invention.

Another embodiment of this invention will be referred to below. As the second embodiment, the third sense amplifier 3 may be constructed as shown in FIG. 4. Further, for all the first, second and third sense amplifiers, the arrangement shown in FIG. 4 may be used. The third sense amplifier 3 shown in FIG. 2 is adapted to deliver signals A and B to the gates of the P-channel transistors S5 and S6, respectively, whereas the third sense amplifier 3 shown in FIG. 4 is adapted to deliver them to the gates of N-channel type transistors S15 and S16 each having a threshold voltage of substantially zero volts, respectively. The drain of the transistor S15 is connected to a power supply Vcc, and the source thereof is connected to the drain of a N-channel enhancement type transistor SS15 and to the gate of a N-channel enhancement type transistor SS16. Further, the drain of the transistor S16 is connected to the power supply Vcc, and the source thereof is connected to the drain of the transistor SS16 and to the gate of the transistor SS15. In addition, the sources of the transistors SS15 and SS16 are grounded. Also in this case, signals A, B and D similarly vary as shown in FIG. 3.

Namely, when the signals A and B are both at a logic "0" level (period t1), the transistors S15 and S16 are both non-conductive, so the signal D is at "0" level. On the other hand, when the signal A is at "1" level and the signal B has a potential between "1" and "0" level (period t2), the potential of the signal A becomes higher than the potential of the signal B, so the node N16 changes to "0" level. Thus, a signal D of logic "0" level is outputted. In addition, when the signal A is at "0" level and the signal B is at "1" level (period t4), the potential of the signal B is higher than the potential of the signal A, so the potential of the node N16 rises. Thus, a signal of "1" level is outputted.

When the pulse signal $\phi$ changes from a logic "1" to a logic "0", either of the signals A and B placed at "0" level changes to "1" level. This change is immediately read to output signal D.

In the case where the circuit shown in FIG. 4 is used for the first and second sense amplifiers as the second embodiment, if there occurs a difference between a potential on the bit line and those on the reference bit lines, this potential difference can be immediately sensed irrespective of precharge potentials on the bit line and the reference bit lines.

Figure 5:
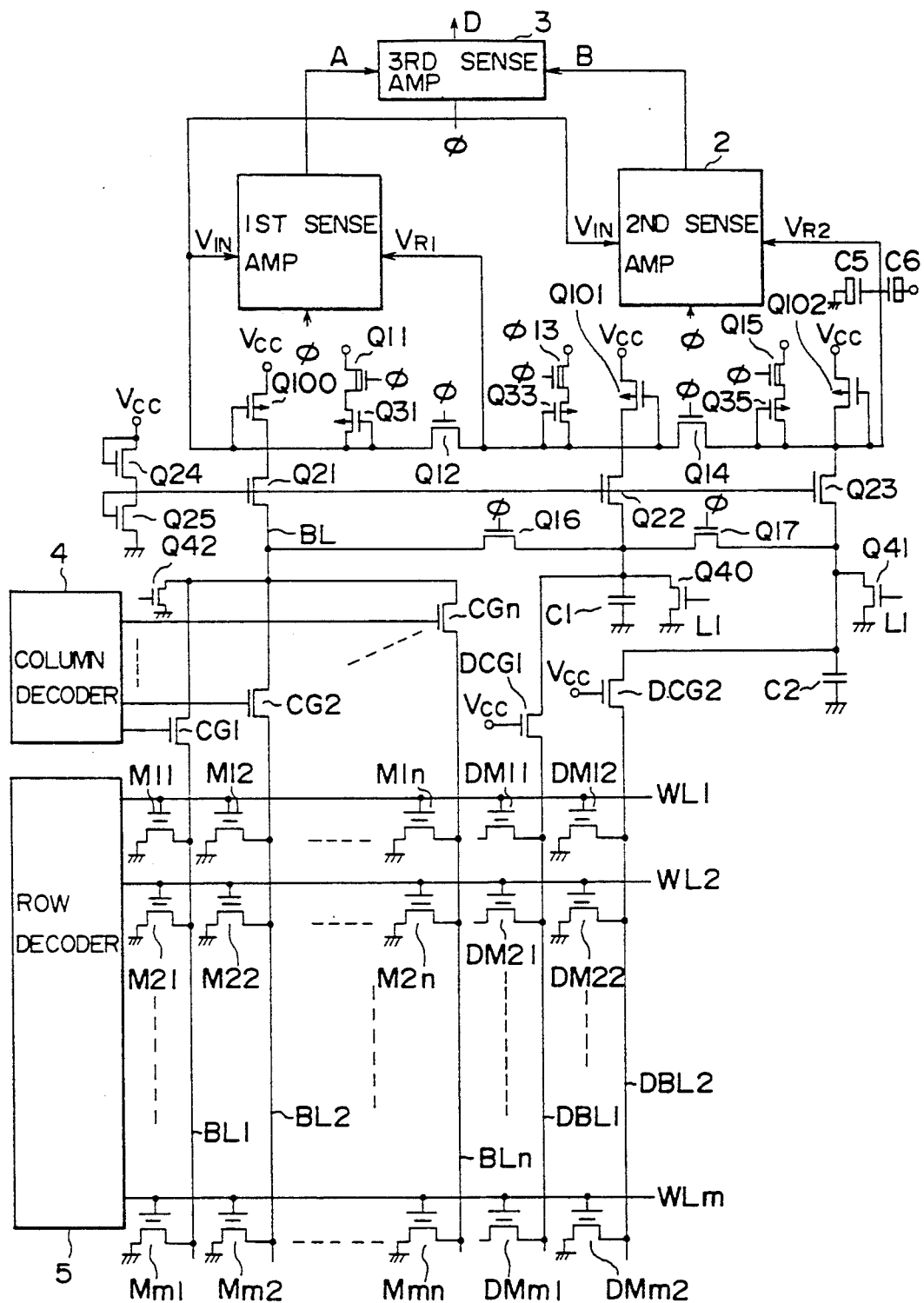
FIG. 5 is a circuit diagram showing the configuration of a semiconductor memory device according to a third embodiment of this invention.
Figure 6:
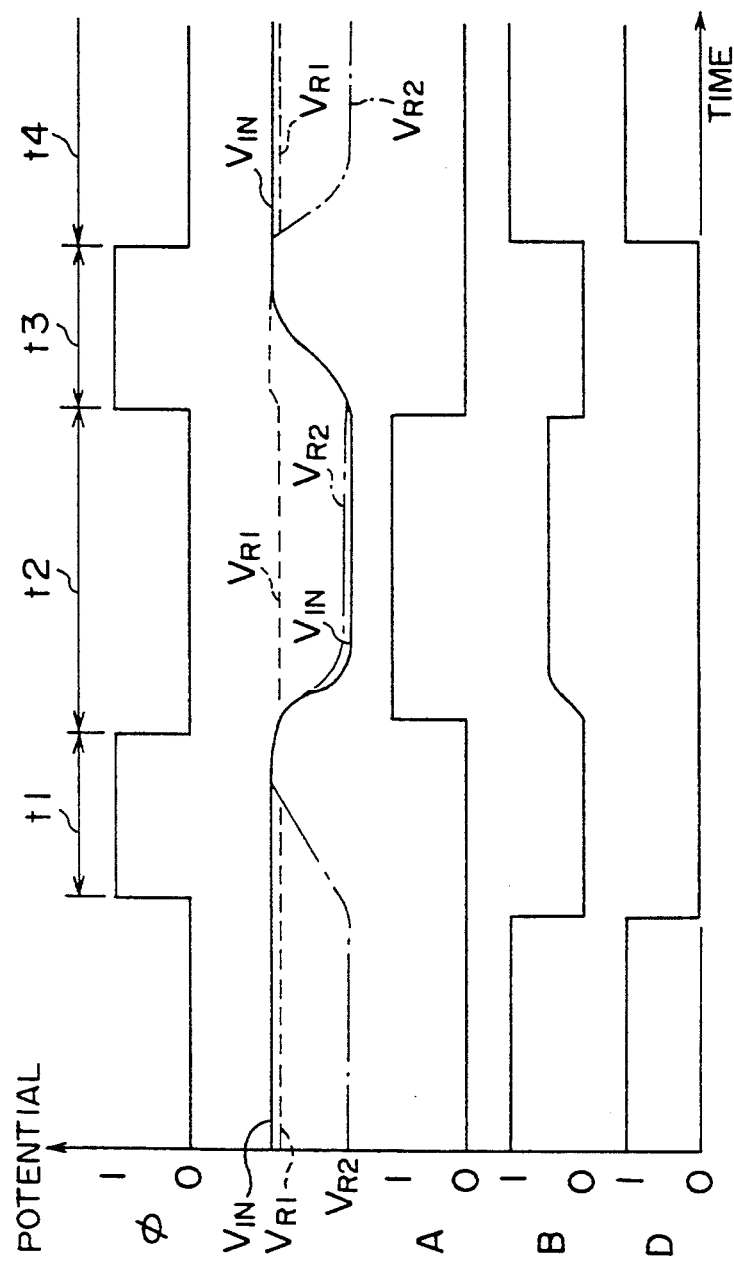
FIG. 6 is a time chart showing the relationship of an equalization signal $\phi$, voltages VIN, VR1 and VR2 and signals A, B and D in the device shown in FIG. 5.

A third embodiment of this invention will now be described. The circuit configuration in this case and timings of respective signals at the time of readout operation are shown in FIGS. 5 and 6, respectively. This embodiment differs from the above-described first and second embodiments as follows.

The bit line precharge circuit is comprised of a N-channel depletion type transistor Q11 and a P-channel enhancement type transistor Q31 connected in series. The precharging circuit for the reference bit line DBL1 is comprised of a N-channel depletion type transistor Q13 and a P-channel enhancement type transistor Q33 connected in series. Further, the precharge circuit for the reference bit line DBL2 is comprised of a N-channel depletion type transistor Q15 and a P-channel enhancement type transistor Q35 connected in series.

Gates of P-channel transistors Q31, Q33 and Q35 are connected to the bit line BL, the reference bit line DBL1 and the reference bit line DBL2, respectively.

In addition, as the load transistor, P-channel transistors Q100, Q101 and Q102 of which drains and gates are commonly connected to the bit line or the reference bit line are used.

When the equalization signal $\phi$ changes to "1" level as indicated by the period t1 or t3 in FIG. 6, the N-channel depletion type transistors Q11, Q13 and Q15 all become conductive. As a result, the bit line BL and the reference bit lines DBL1 and DBL2 are charged, so their potentials rise up to a potential (Vcc$-$|Vthp|) obtained by subtracting the threshold voltage Vthp of the P-channel transistor from the power supply voltage Vcc. In the case where the input transistors of the first and second sense amplifiers are the P-channel enhancement type as in the circuit of the embodiment shown in FIG. 2, potentials on the bit line and the reference bit lines are changed from the boundary point between ON states and OFF states of the input transistors S1 to S4, after the precharging of the bit line and the reference bit lines are completed. Since the potentials of the bit line and the reference bit lines are changed the boundary point between the transistors S1 to S4, the responses of the first and second sense amplifiers become fast. For this reason, P-channel transistors Q31, Q33 and Q35 are used to make a setting such that potentials on the bit line and the reference bit lines after precharge become equal to (Vcc−|Vthp|) when the precharging is completed. For this precharge period, N-channel transistors Q12, Q14, Q16 and Q17 become conductive, thus allowing potentials on the bit line BL and the reference bit lines DBL1 and DBL2 to be equal to each other.

After the equalizing operation is completed, when the equalization signal φ shifts to "0" level as at the period t2 or t4, precharge transistors Q11, Q13 and Q15 in which the equalization signal φ is inputted to each gate become all non-conductive. At this time, equalizing transistors Q12, Q14, Q16 and Q17 also become non-conductive at the same time. Thus, potentials VIN, VR1 and VR2 change to a level corresponding to the storage states of the memory cell or the reference cells, respectively. When the equalizing or precharge operation is completed, a voltage applied to each gate of the transistors Q11, Q13 and Q15 changes from "1" to "0" level. For this reason, source voltages of the P-channel enhancement type transistors Q31, Q33 and Q35 are lowered by the capacitive coupling between gates and sources of the transistors Q11, Q13 and Q15, respectively. However, since potentials VIN, VR1, and VR2 on the bit line and the reference bit lines are equal to the above-described potential (Vcc−|Vthp|), the P-channel transistors Q31, Q33 and Q35 are all still in a non-conductive state. Even if the equalization signal φ changes from "1" to "0" level, potentials VIN, VR1 and VR2 can stably change to potentials corresponding to storage data of the memory cell and the reference cell without undergoing the influence of such a level change.

As stated above, when not only depletion type N-channel transistors Q11, Q13 and Q15 but also P-channel transistors Q31, Q33 and Q35 are used in combination as the precharging circuit, the operation can be stabilized, resulting in a high speed readout operation.

The P-channel transistors Q31, Q33 and Q35 also have a function to determine potentials on the bit line and the reference bit lines when the precharging operation is completed, and to control charge currents flowing in the bit line and the reference bit lines at the time of precharging operation. Since potentials on non-selected bit lines are discharged into Ground level, in the case where a column address changes, whereby a new bit line is selected, this bit line is charged from 0V. As a result, the time required for precharge for this bit line is the longest. For a high speed readout operation, it is required to charge the bit line (BL) and the first and second reference bit lines (DBL1, DBL2) up to respective predetermined potentials for a short precharging period. The bit line and the first reference bit line, and the first and second reference bit lines are equalized by the equalizing transistor. However, because of a conductive resistance of the transistor, there slightly occur potential difference between the bit line and the reference bit lines. Taking into consideration the fact that the precharging time for the bit line after the column address has changed is longer than the precharging time for the reference bit line, the conduction resistance of the transistor Q31 may set to a value smaller than the conduction resistance of the transistor Q33 or Q35.

Further, an enhancement type N-channel transistor Q42 is connected to the bit line BL, an enhancement type N-channel transistor Q40 is connected to the reference bit line DBL1, and an enhancement type N-channel transistor Q41 is similarly connected to the reference bit line DBL2. The reason why the sizes (channel width/channel length) of respective transistors have the relationship indicated by Q40>Q42>Q41 is as follows.

As indicated by the period t4 in FIG. 6, in the case of reading out data from a memory cell into which electrons are injected, the potential VIN becomes equal to (Vcc−|Vthp|) in the same manner as the potential VR1. However, generally a power supply voltage Vcc applied to the gate of the memory cell is not necessarily kept at a constant level at all times. When data is outputted from the output buffer circuit, a large current flows to drive a large load capacitance existing on the output terminal. Because of a parasitic inductance of a power source line for applying the power supply voltage Vcc, the power supply voltage Vcc in the chip may vary by about 1 to 2 volts, when the data is outputted. For example, when it is assumed that the power supply voltage Vcc is 5 volts in a normal state, it may temporarily rise to about 6 to 7 volts. As a result, even in the case where a memory cell in which electrons are injected into the floating gate is selected, since the gate voltage ($V_G$) of the memory cell rises, that memory cell may temporarily become conductive, resulting in a potential VIN slightly lower than (Vcc−|Vthp|). Consequently, since the output signal A from the first sense amplifier changes from "0" to "1" level and the output signal D from the third sense amplifier changes from "1" to "0" level by the influence of the change of the power supply voltage Vcc, a signal corresponding to "1" data may be outputted from the sense circuit although the memory cell into which electrons are injected is selected. To solve this problem, an approach is employed to allow leak currents of leak transistors Q42 and Q40 provided in association with the bit line BL and the reference bit line DBL1 to have a difference therebetween, thus to make a setting such that a bit line potential VIN when a memory cell into which electrons are injected is selected is higher than a reference bit line potential VR1. Consequently, even if a current of the order of several μA flows in the memory cell to be slightly conductive by the influence of the change of the power source voltage Vcc, there is no possibility that the output signal D from the third sense amplifier is not inverted. Thus, "1" data of the memory cell can be stably outputted. Since a setting is made such that a quantity of leak currents of the bit line is smaller than a quantity of leak currents of the first reference bit line, the transistor size W/L which is the ratio of channel width of a transistor to the length thereof, of the leak transistors Q40 and Q42 is selected so that the inequality expressed as Q40>Q42 holds. In this example, a potential L1 for setting a quantity of leak to a predetermined value is applied commonly to the gates of the transistors Q42 and Q40.

Further, currents flowing each of memory cells in a chip are not exactly the same, and there are about several percent of differences therebetween due to irregularity of W/L. For this reason, in the case where a current flowing in a selected memory cell into which no electron is injected is smaller than a current flowing in a selected second reference cell, the potential VIN becomes a level higher than the potential VR2. Because of this potential difference between VIN and VR2, an intermediate potential between "1" level and "0" level of an output signal B from the second sense amplifier becomes high, and the rising speed is also fast. Since the third sense amplifier senses a difference between rising speeds when the signals A and B change from "0" to "1" level to make a data sense operation, a potential difference when the signals A and B change from "0" to "1" by irregularity of currents flowing in the memory cell becomes small, resulting in the problem that the readout speed becomes slow. To solve this problem, a scheme is employed to make a setting such that a quantity of leak currents flowing in the bit line BL is larger than a quantity of leak currents flowing in the second reference bit line DBL2, thus to set a potential VIN when a memory cell in which no electron is injected into the floating gate is selected to a value lower than the potential VR2. Since a quantity of leak currents in the bit line BL is set to a value larger than a quantity of leak currents in the second reference bit line DBL2, the transistor size W/L of the leak transistors Q42 and Q41 is selected so that the inequality expressed as Q42>Q41 holds.

In order to realize stable data output and high speed readout operation as stated above, it is preferable that quantities of leak currents of leak circuits provided in association with the bit line and the reference bit lines have a relationship such that the inequality expressed as the first reference bit line DBL1>the bit line BL>the second reference bit line DBL2 holds.

While an approach is employed to alter the transistor sizes of respective leak circuits to thereby set a quantity of leak currents in the embodiment shown in FIG. 5, an approach may be alternatively employed to set respective transistor sizes to the same value to control their gate voltages, thereby to provide the relationship of a quantities of leak currents similar to the above.

Further, when a technique is employed to add a capacitance to the second reference bit line so that the potential VR2 on the second reference bit line varies more gently than the potential VIN on the bit line, in the case of reading out the above-described memory cell in which no electron is injected, delay of a readout speed due to irregularity of currents flowing in the memory cell can be prevented. In the embodiment shown in FIG. 5, this capacitance is constituted with gate capacitances of a P-channel transistor C6 and an N-channel transistor C5.

Figure 7:
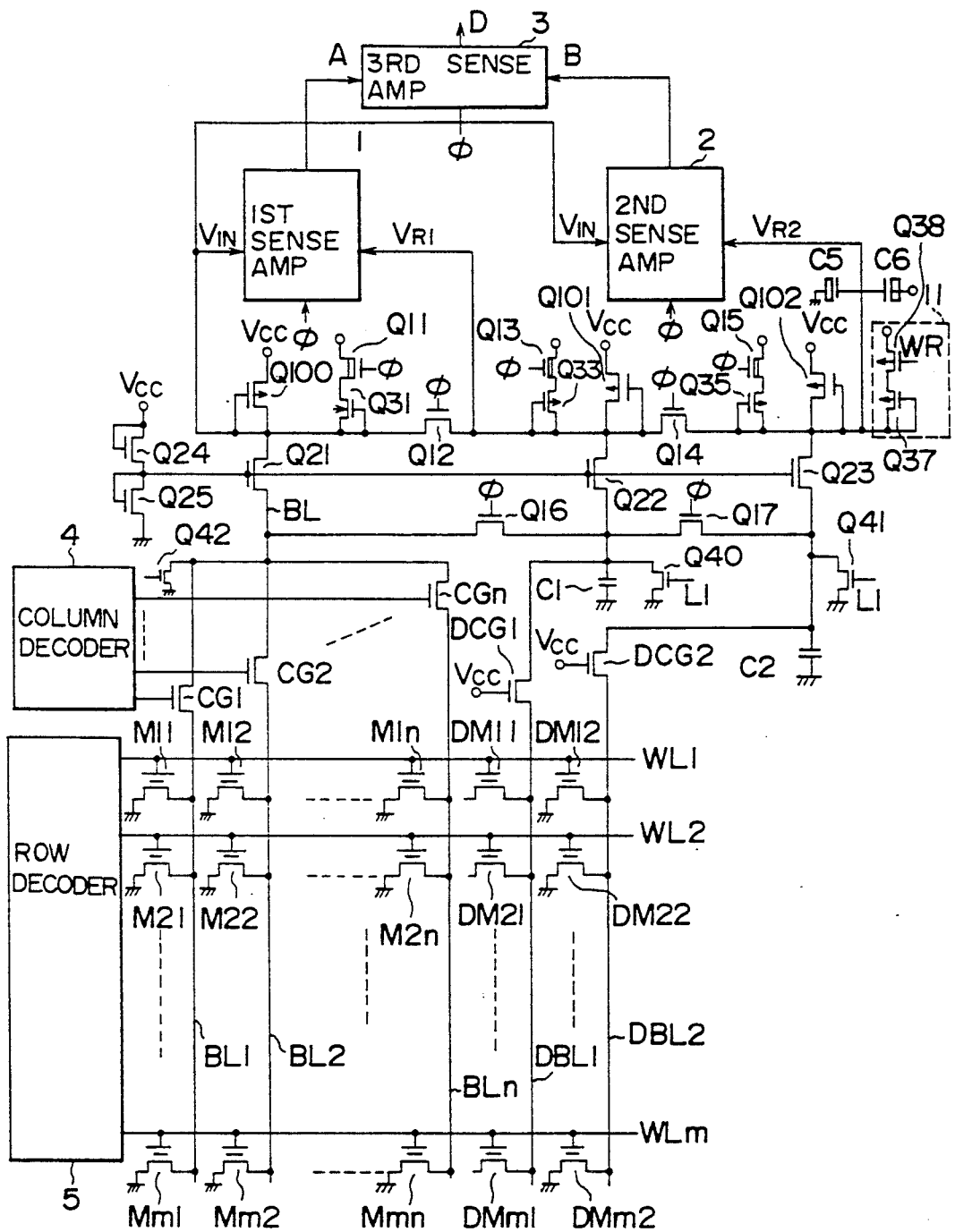
FIG. 7 is a circuit diagram showing the configuration of a semiconductor memory device according to a fourth embodiment of this invention.

A fourth embodiment will be described with reference to FIGS. 2, 7 and 8. Each circuit of the embodiments shown in FIGS. 1 and 2 has the following problem. In the case of reading out data in a memory cell in which electrons are injected into the floating gate, if this memory cell is slightly conductive, "0" data in the memory cell is correctly read out for a certain time period after the precharging operation, but data is inverted thereafter, so an erroneous "1" data is outputted. As described above, when the memory cell is slightly conductive, the potential VIN becomes slightly lower than the potential VR1. After the precharging operation of the bit line, a potential on the second reference bit line immediately changes to a predetermined low level. Thus, the second sense amplifier senses that change, so its output B immediately changes toward Vcc. On the contrary, since the potential VIN on the bit line and the potential VR1 on the first reference bit line to which a reference cell having no current path is connected are both at a high level in the vicinity of (Vcc−|Vthp|) level, and the potential VIN is at a level slightly lower than the potential VR1, the potential of the output A of the first sense amplifier gradually rises up toward the potential Vcc. For this reason, when about several hundred nsec has passed, the transistor S5 of the third sense amplifier shown in FIG. 2 becomes non-conductive in the same manner as in the case of the transistor S6. As a result, its output signal D gradually lowers to Ground level.

The time until the output signal D is inverted to "0" level is not fixed. Because, if a potential difference between the potentials VIN and VR1 is small, the output signal D is inverted from a logic "1" to a logic "0" in a longer time. To check whether or not a quantity of electrons injected into the floating gate is sufficient, an approach is ordinarily employed to raise the power supply voltage Vcc to a predetermined potential after data is written to confirm that "0" data is stably outputted. For this reason, if readout data change depending upon the readout time as described above, it is difficult to judge according readout time whether or not a quantity of electrons injected into the floating gate is sufficient.

Figure 8:
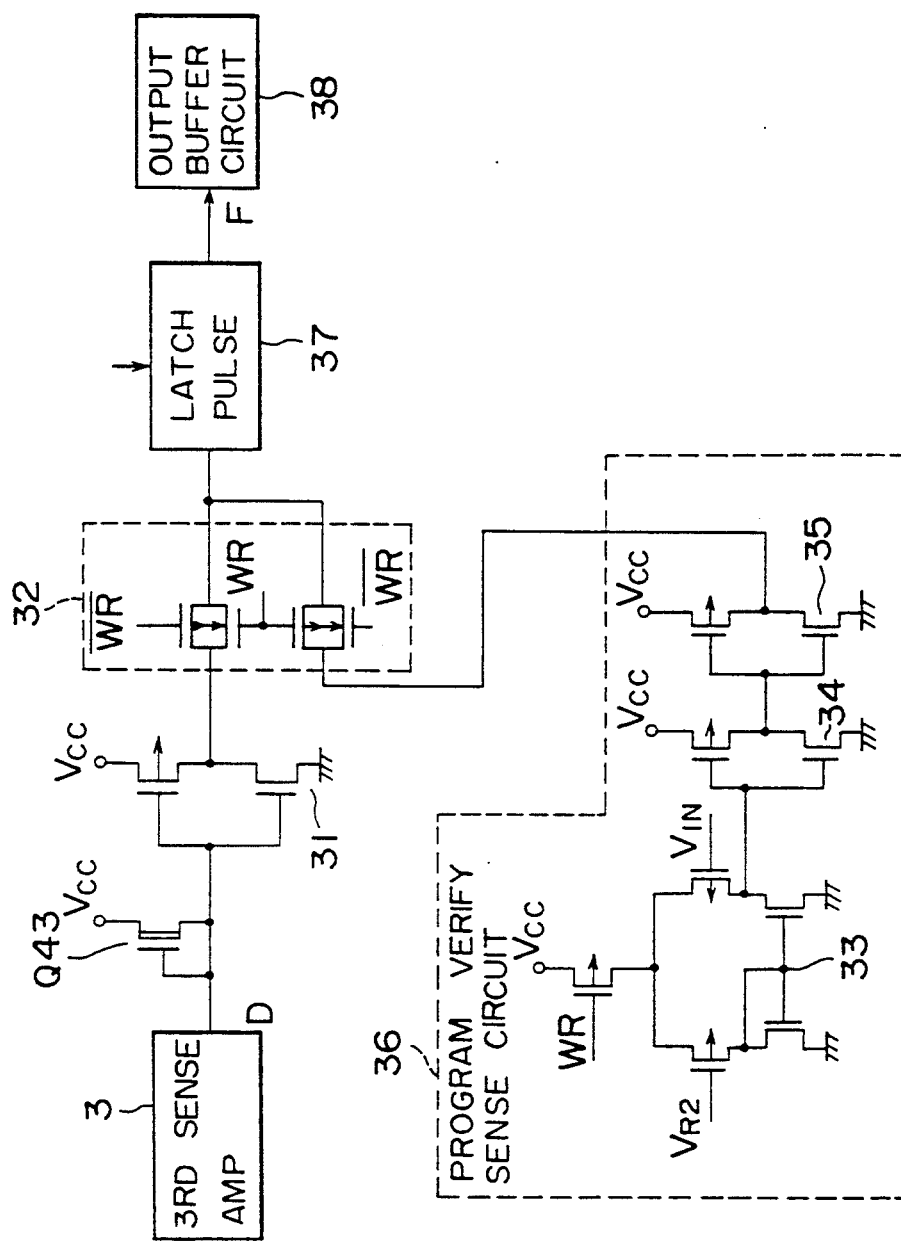
FIG. 8 is a circuit diagram showing the configuration for increasing a quantity of injection of electrons at the time of program verify operation of the device shown in FIG. 7.

Taking this problem into account, the embodiment shown in FIG. 8 is constructed to provide a pull-up N-channel depletion type transistor Q43 having a large conduction resistance between the output terminal of the third sense amplifier 3 and the power supply Vcc, thereby making it possible to provide a stable data output. By pulling up an output from the third sense amplifier, even in the case where when a certain time has passed after the "0" data was read out the transistor S5 and the transistor S6 of the third sense amplifier 3 become non-conductive as described above, the potential of the output D is kept at Vcc potential. For this reason, even in the case where a memory cell into which electrons are injected and slightly in a conductive state is selected, an erroneous operation such that the output data from the third sense amplifier is inverted to "0" level for a long time period does not result. In this embodiment, since when the power supply voltage is raised so that a current flowing in the memory cell takes a predetermined value, the output B from the second sense amplifier changes to a potential lower than (Vcc−|Vthp|), the output D from the third sense amplifier changes from "1" to "0" level. For this reason, a quantity of electrons injected into the floating gate can be correctly checked irrespective of the readout time. It is preferable that the conduction resistance of the transistor Q43 is set to a small value to such an extent that the readout speed is not slow when reading out "1" data.

Further, as previously described, the power supply voltage Vcc applied to the gate of the memory cell is not necessarily kept at a constant level at all times. Assuming that the power supply voltage Vcc is 5 volts in a normal state, it may temporarily rise up to 6 to 7 volts by the influence of the output buffer noise. Further, while the floating gate is covered with a silicon oxide film, because a defect generally exists in such a silicon oxide film, there are instances where electrons injected into the floating gate gradually go therethrough. Even in such instances, in order to guarantee a long time stable readout operation, according as the threshold voltage of a memory cell into which electrons are injected becomes high, more satisfactory effect is provided. For this reason, in the fourth embodiment, there is provided an exclusive readout circuit at the time of program verify operation in order to guarantee a stable readout operation with respect to rising of the power supply voltage to expand the power supply voltage margin.

Generally, a program for EPROM employs a program sequence to again apply an additional writing for a predetermined time to a memory cell judged to be insufficiently written in the program verify mode to thereby increase a quantity of electrons injected into the floating gate. For this reason, there is provided a sense circuit adapted to output "1" data in a program verify mode when the threshold voltage of a memory cell into which electrons are injected is at a voltage below a predetermined voltage (e.g., 7 volts) to thereby apply an additional writing to a memory cell of which threshold voltage is 7 volts or less. Thus, the threshold voltages of all the memory cells into which electrons are injected can be set to 7 volts or more with a margin with respect to changes in the power supply voltage. To realize this, in the fourth embodiment, there is newly provided a program verify sense circuit 36 shown in FIG. 8 separately from sense amplifiers 1, 2 and 3 for data readout shown in FIG. 1. The switch circuit 32 carries out a switching operation so that, at the time of an ordinary readout operation, an output signal from the third sense amplifier is transmitted to an output buffer circuit 38 through the latch circuit 37, and at the time of program verify operation, an output signal from the program verify sense circuit is transmitted to the output buffer circuit 38 through the latch circuit 37. A signal WR for controlling a switching operation is a logic "0" at the time of program verify operation, and is a logic "1" at the time of an ordinary readout operation. A signal $\overline{WR}$ is an inverted signal of the signal WR. This program verify sense circuit 36 is comprised of a differential amplifier circuit 33 using P-channel transistors as respective input transistors for voltage comparison, and inverters 34 and 35. A potential VIN on the bit line and a potential VR2 on the second reference bit line DBL2 are applied to the input gates of the respective transistors for voltage comparison, respectively. Further, the signal WR is inputted to a gate of a P-channel transistor connected between the power supply terminal Vcc and the input transistors so that current dissipation in the differential amplifier circuit 33 becomes small and current dissipation in the chip does not increase at the time of an ordinary readout operation. A potential VR2 on the second reference bit line DBL2 at the time of program verify operation is set to a level higher than a potential VR2 at the time of an ordinary readout operation because a load circuit 11 for program verify operation comprised of P-channel transistors Q37 and Q38 in FIG. 7 becomes conductive. The data readout operation at the time of the program verify operation is conducted using the potential VR2 as a reference potential in the same manner as that in the sense system by the differential amplifier circuit used in the conventional CMOS EPROM. When the potential VIN on the bit line is higher than the potential VR2, data in the memory cell is judged to be "0" data where electrons are injected into the floating gate. In contrast, when the potential VIN on the bit line is lower than the reference potential VR2, data in the memory cell is judged to be "1" data where no electron is injected into the floating gate. When the threshold voltage of a memory cell is 7 volts or less, the conduction resistance of the transistor Q37 of the above-described load circuit for program verify operation is set so that "1" data is outputted from the program verify sense circuit 36 at the time of the program verify mode. The readout speed when the program verify sense circuit is used is about 100 nsec because of a sense system using a single reference potential. However, since the judgment at the time of the program verify operation in the EPROM is generally such that the readout time is set to a very long time of the order of 1 μsec, a readout speed of about 100 nsec may be sufficiently employed.

The difference amplifier circuit 33 of the program verify sense circuit shown in FIG. 8 may be constituted by one of the current mirror circuits of the first to third sense amplifiers at the time of the program verify operation. For example, an arrangement is employed such that a gate input signal of the P-channel transistor S2 of the first sense amplifier is passed through the first reference bit line at the time of an ordinary readout operation and is switched so that it is passed through the second reference bit line at the time of the program verify operation, and that an output signal A from the first sense amplifier is inputted to the output buffer circuit through two stages of inverters and the switch circuit 32. By employing such an arrangement, the program verify sense circuit shown in FIG. 8 can be realized, resulting in reduced chip area.

In FIG. 8, a latch circuit 37 is connected between the data transfer circuit 32 and the output buffer circuit 38. There are generally instances where while equalizing and precharging operations are being conducted, any data which does not correspond to data in a memory cell is outputted from the output buffer circuit 38, so a power supply voltage changes by this data output. The above-mentioned latch circuit 37 is provided for preventing such an undesired phenomenon.

Figure 9:
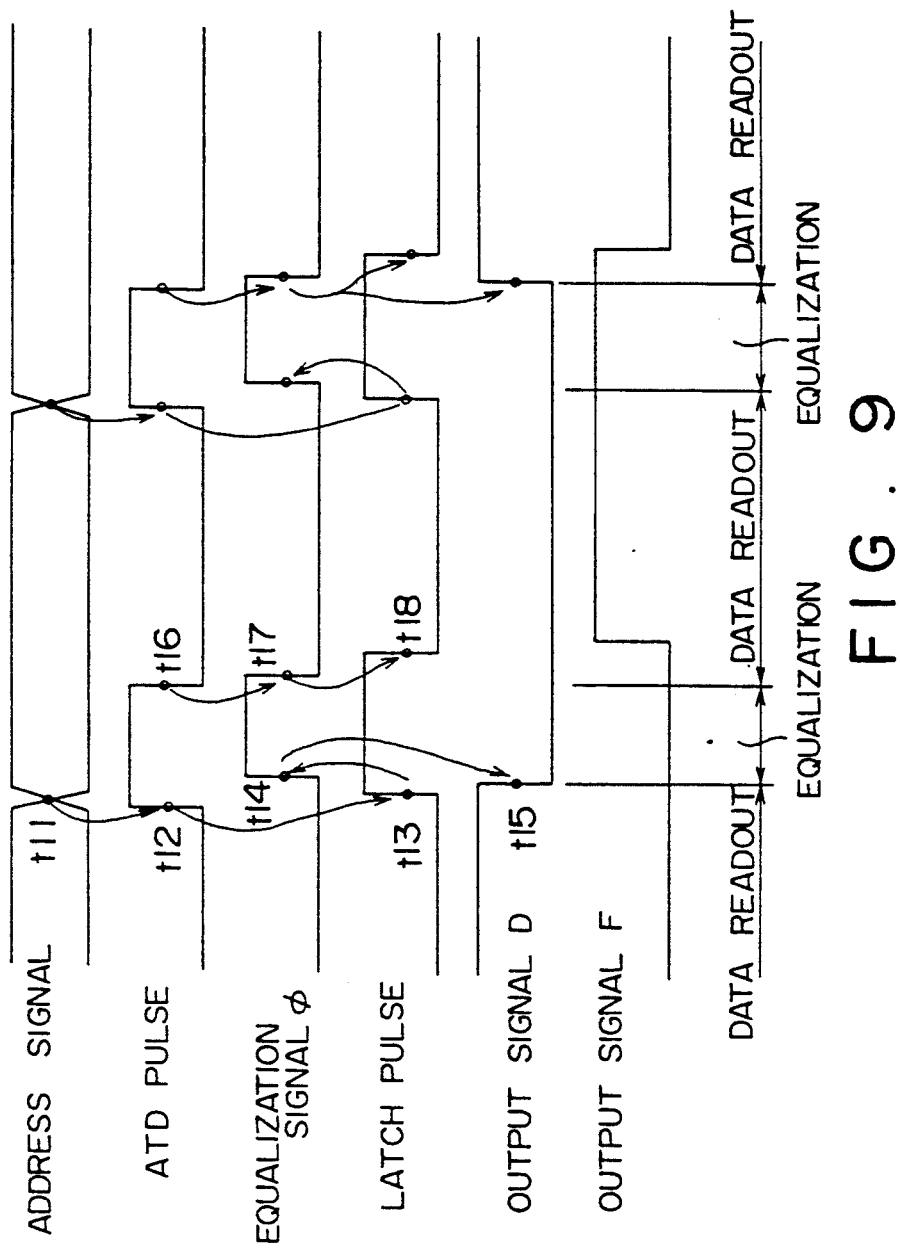
FIG. 9 is a timing chart showing the relationship of an address signal, and ATD pulse signal, an equalization signal $\phi$, a latch pulse, and output signals D and F in the device shown in FIG. 7.

FIG. 9 shows timing diagrams of respective signals at the time of the data readout operation. This readout operation when the latch circuit is used will now be described below. When an address signal in FIG. 9 changes (time point t11), a change in this address signal is sensed by an address transition detecting circuit (ATD circuit) which is not shown. From this ATD circuit, an ATD pulse of "1" level is outputted for a predetermined time (time point t12). Responding to the level change of the ATD pulse, a latch pulse for controlling the latch circuit 37 changes to "1" level (time point t13). Further, responding to such a change of this latch pulse, the above-described equalization signal $\phi$ for control of equalization and precharge also changes to "1" level (time point t14). As shown in FIG. 9, the latch pulse changes to "1" level prior to the rise of the equalization signal $\phi$.

For this reason, the output signal D is latched at the latch circuit 37 at time point t13 before the equalizing and precharging operations are started. Thus, even if the output signal D from the third sense amplifier 3 changes from "1" to "0" level in response to a change of the equalization signal $\phi$, a latched output signal F which is outputted from the output buffer circuit 38 is not changed.

When the ATD pulse changes to "0" level after a predetermined time has passed (time point t16), the equalization signal $\phi$ also changes to "0" level in response to the change of the ATD pulse signal (time point t17). After a predetermined time has passed from the time when the equalization signal $\phi$ changed to "0"

level, the latch pulse also changes to "0" level (time point t18). Thus, the output signal D from the third sense amplifier 3 is transferred to the output buffer circuit 38 through the latch circuit, and is then outputted to the external. As stated above, in accordance with this embodiment, since the latched data which is stored in a memory cell designated by an inputted address signal before the change of the address signal (time point t11) is outputted from the output buffer while the sense operation is being carried out, the power supply voltage is stable, so a high speed readout operation can be performed.

A fifth embodiment will now be described. It has been described in the first to fourth embodiments that reference cells forming no current path are employed as the first reference cells DM11 to DMm1 equivalent to memory cells M11 to Mmn into which electrons are injected. Accordingly, even if a voltage is applied to each of the gates of the first reference cells DM11 to DMm1, no current path is formed. However, memory cells in which electrons are injected into the floating gate of the memory cells M11 to Mmn differ from memory cells into which no electron is injected only in that their threshold voltages take a higher value. For this reason, when a power supply voltage Vcc higher than the threshold voltage is applied to each gate, a current path is formed in the memory cell into which electrons are injected. Thus, such memory cells become conductive. As a result, an erroneous data "1" is sensed from the third sense amplifier 3.

As previously described, the power supply voltage Vcc applied to the gate of the memory cell is not necessarily kept at a fixed level at all times. For example, when data is outputted from the output buffer circuit 38, it is required to allow a large current to flow in order to drive the large load capacitance. For this reason, the power supply voltage Vcc may change by about 1 to 2 volts by the inductance existing in the power supply wiring. For example, when the power supply voltage Vcc is assumed to be 5 volts in a normal state, it may temporarily rise up to 6 to 7 volts. Also in such a case, in order to avoid any erroneous operation, it is necessary that the threshold voltage of the memory cell into which electrons are injected is above 7 volts or more.

However, a larger number of electrons are required to be injected by additional writing in order to raise the threshold voltage, resulting in a prolonged programming time. If it takes much time to inject electrons into one memory cell, much time is required for programming of the entirety of the memory device. According as the memory capacity becomes large, longer time must be spent accordingly.

Figure 10:
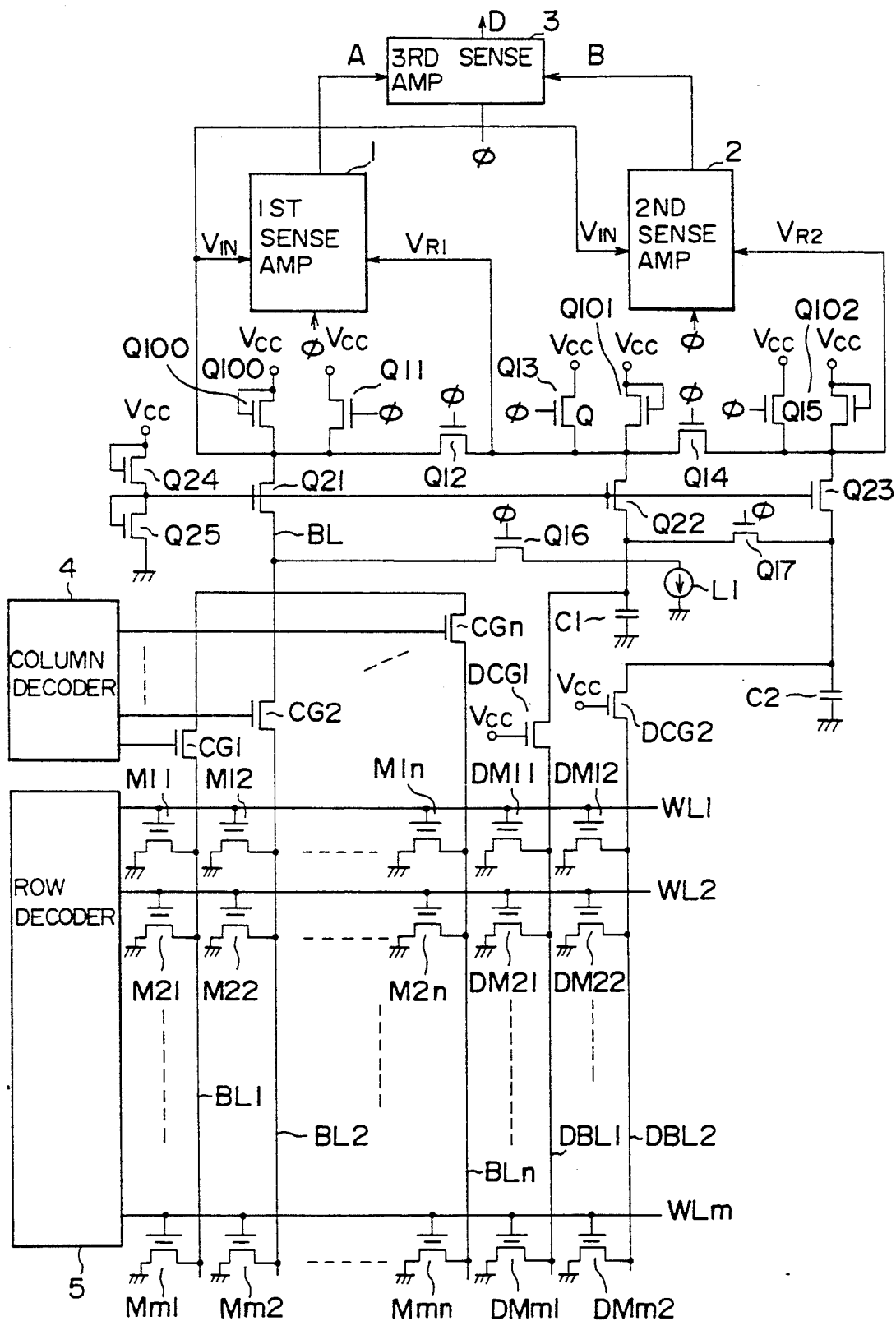
FIG. 10 is a circuit diagram showing the configuration of a semiconductor memory device according to a fifth embodiment.

The fifth embodiment has been made in consideration of the above circumstances. In this embodiment, memory cells electrically equivalent to memory cells into which electrons are injected are used as first reference cells DM11 to DMm1 as shown in FIG. 10.

The threshold voltages of the first reference cells are higher than threshold voltages of memory cells in which no electron is injected into the floating gate, and are the same value as those of memory cells into which electrons are injected. When a power supply voltage Vcc above the threshold voltage is applied to the gates of the first reference cells, a current path is formed in the same manner as in the case of memory cells. As a result, the first reference cells become conductive. For example, it is now assumed that the threshold voltages of memory cells into which electrons are injected are 6 volts, and the threshold voltages of the first reference cell are similarly 6 volts. When any change in the power supply occurs, so the power supply voltage rises up to 6 volts or more, not only memory cells but also first reference cells similarly become conductive. Thus, an erroneous operation is prevented.

In this embodiment, it is not necessarily required to set the threshold voltages of memory cells into which electrons are injected to a higher value. Such threshold voltages may be about 4 to 5 volts. In this case, it is sufficient that the first reference cells similarly have a threshold voltage of 4 to 5 volts.

For a method of raising the threshold voltages of the first reference cells to levels comparable to those of memory cells into which electrons are injected, several methods are conceivable. For example, a method may be used to increase a dose of impurity ions introduced into the channel of the transistor. Alternatively, there may be employed a method of injecting electrons into the floating gate in the same manner as in the case of memory cells. In this case, it is preferable to set the threshold voltages of the first reference cells to a value lower than the threshold voltages of memory cells into which electrons are injected. To realize this, when injecting electrons into the memory cells and the first reference cells, it is sufficient that the time required for applying a program voltage to the first reference cells is shorter than that required for applying a program voltage to the memory cell.

A sixth embodiment related to the above-mentioned fifth embodiment will now be described. In this embodiment, in the same manner as in the first to fourth embodiments, memory cells in which no current path is formed are used as the first reference cells. This embodiment differs from the first to fourth embodiments in that there is provided leak means wherein when the power supply voltage Vcc is above a predetermined value, the leak means serves to form a leak path in the reference column line DBL1 to lower the potential VR1 by a required level thus to prevent an erroneous operation.

Figure 11:
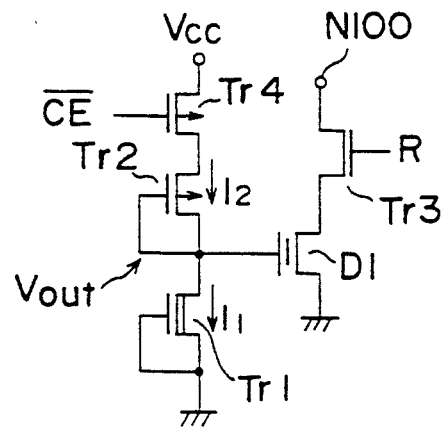
FIG. 11 is a circuit diagram showing the configuration of leak means in a semiconductor memory device according to a sixth embodiment.
Figure 12:
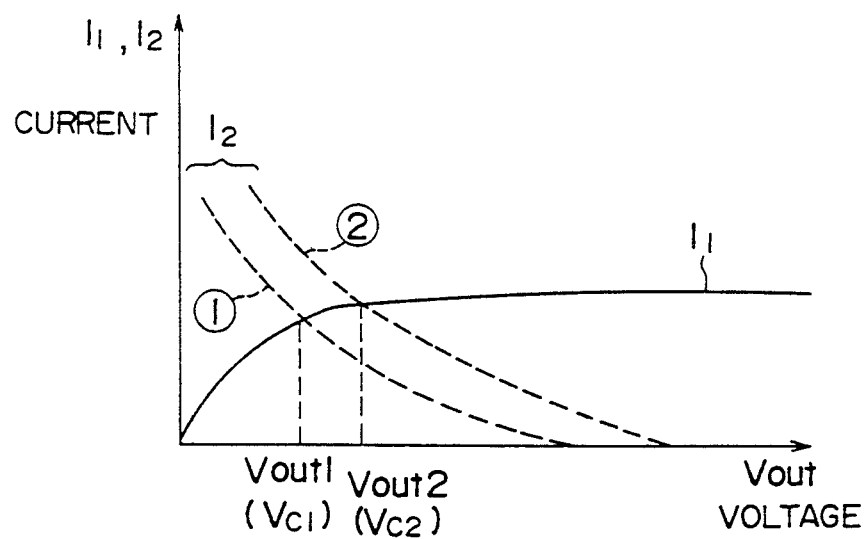
FIG. 12 is an explanatory view showing the relationship of changes in a power supply voltage and a potential on the node Vout in the device shown in FIG. 11.

The leak means is shown in FIG. 11. A node N100 is connected to a node N100 of the reference column line $\overline{DBL1}$ shown in FIG. 1. A chip enable signal $\overline{CE}$ is applied to the gate of a P-channel enhancement type transistor Tr4. When the chip is in an enable state, the power supply voltage Vcc is applied to a P-channel enhancement type transistor Tr2. From the drain electrode of the transistor Tr2, a voltage Vout lower than the power supply voltage Vcc by a predetermined voltage is outputted. The operation of this leak circuit will now be described with reference to FIG. 12. In FIG. 12, the solid line represents the relationship between the drain voltage (Vout) of the N-channel depletion type transistor TR1 of FIG. 11 and a current (I1) flowing therein, and broken lines represent the relationship between the drain voltage (Vout) of the P-channel enhancement type transistor Tr2 and a current (I2) flowing therein. The broken lines ① represent the characteristic of a current I2 flowing in the transistor Tr2 in the case where the power supply voltage Vcc is equal to Vc1 and the broken lines ② represent the characteristic of a current I2 flowing in the transistor Tr2 in the case where the power supply voltage Vcc is equal to Vc2 higher than Vc1.

When the power supply voltage Vcc rises from Vc1 to Vc2 as shown in FIG. 12, an output voltage Vout changes from Vout1 to Vout2. The output voltage Vout changes in response to changes in the power supply voltage Vcc and eventually reaches a value lower than the power supply voltage Vcc by a desired voltage. For example, in FIG. 2, when the normal power supply voltage Vc1 is 5 volts, the output voltage Vout1 is assumed to be about 1 volt. Accordingly, when the power supply voltage Vc2 is 6 volts, the output voltage Vout2 becomes equal to about 2 volts. The output voltage Vout thus dropped from the power supply voltage Vcc is applied to the gate of an N-channel enhancement type transistor D1 corresponding to a third reference cell. The drain of this transistor D1 is connected to the node N100 through an N-channel enhancement transistor Tr3 which becomes conductive by a read signal R at the time of the data readout operation.

The output voltage Vout applied to the gate of the transistor D1 may be arbitrarily set by varying the ratio between conduction resistance values of the transistors TR1 and Tr2. Further, the current I1 flowing in the transistor TR1 reaches the saturation region at an output voltage Vout which becomes smaller according as the absolute value of the threshold voltage becomes lower. Accordingly, in order to set a desired output voltage Vout over a broad range of the power supply voltage Vcc, it is desirable to set the absolute value of the threshold voltage of the transistor TR1 to a lower value.

The leak means thus constructed operates as follows. When the power supply voltage Vcc rises to reach a predetermined value (e.g., 6 volts), an output voltage (e.g., 2 volts) dropped from this voltage is applied to the gate of the transistor D1. As a result, this transistor D1 becomes conductive, so a leak current path is formed at the node N100. Thus, when the power supply voltage is above a predetermined voltage (5 volts), the potential VR1 on the first reference bit line DBL1 is lowered.

If the threshold voltage of the transistor D1 is set so that the transistor D1 becomes conductive at a lower power supply voltage Vcc eventually obtained as compared to the memory cells into which electrons are injected, an erroneous operation can be prevented even in the case where the power supply voltage rises.

Figure 13:
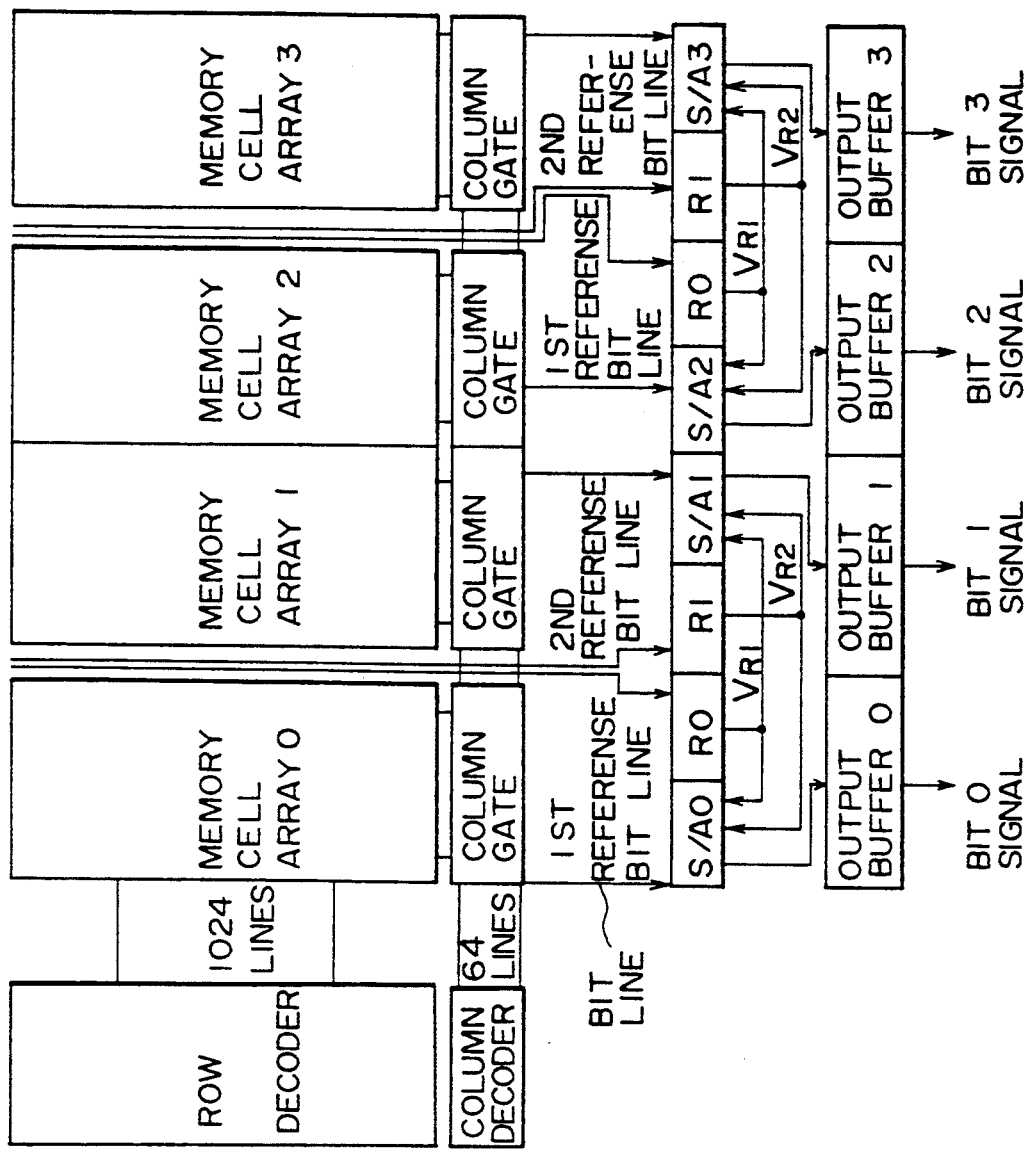
FIG. 13 is a circuit diagram showing the circuit arrangement in realizing the first embodiment on a silicon substrate.

An embodiment of the circuit arrangement on a chip of the circuit of the embodiment shown in FIG. 1 is shown in FIG. 13. Ordinarily, in the EPROM, a plurality of data are stored with respect to an address. In the embodiment of FIG. 13, there is shown the configuration of a memory chip such that four memory cells are selected by 10 row address signals and 5 column address signals, and data stored the four memory cells are outputted at the same time. The memory cell array is divided into four sections of the memory cell array 0 to the memory cell array 3 in correspondence with respective bits. Potentials VIN corresponding to data in memory cells respectively selected by the row decoder are outputted to four bit lines corresponding to respective bits selected by the column decoder. Further, first and second reference bit lines are arranged between memory cell arrays 0 and 1 and between memory cell arrays 2 and 3. Thus, potentials (VR1 and VR2) corresponding to storage states of the first and second reference cells connected to respective reference bit lines appear on the respective reference bit lines DBL1 and DBL2. In this embodiment, the potential (VR1) on the first reference bit line arranged between the memory cell arrays 0 and 1 of two first reference bit lines is compared with potentials (VIN) on bit lines respectively selected at a sense circuit S/A0 for sensing memory data of bit 0 and a sense circuit S/A1 for sensing memory data of bit 1. Further, the potential (VR1) on the first reference bit line arranged between memory cell arrays 2 and 3 is compared with potentials (VIN) on bit lines respectively selected at sense circuits S/A2 and S/A3 for sensing memory cell data of bit 2 and 3. Similarly, the potential (VR2) on the second reference bit line arranged between memory cell arrays 0 and 1 of two second reference bit lines is compared with potentials on bit lines respectively selected at sense circuits S/A0 and S/A1, and the potential (VR2) on the second reference bit line arranged between memory cell arrays 2 and 3 is compared with potentials on bit lines respectively selected at sense circuits S/A2 and S/A3. On the basis of compared results, data corresponding to storage states of memory cells are outputted by four bits from respective sense circuits. These data are outputted as bits 0, 1, 2 and 3 to the external through output buffers 0, 1, 2 and 3, respectively. In each of the regions S/A0 to 3, there is formed a bias transistor Q21, which sets the potential on the bit line to a predetermined low level in the first embodiment and a precharge transistor Q11, a bit line load transistor Q100, and first, second and third sense amplifier circuits. Further, in each of regions of two reference circuits R0, there is formed a bias transistor Q22 which sets the potential on the first reference bit line to a predetermined low level, a precharge transistor Q13, and a first reference bit line load transistor Q101. Furthermore, in each of the regions of two R1, there is formed a bias transistor Q23 which sets the potential on the second reference bit line to a predetermined low level, a precharge transistor Q15, and a second reference bit line load transistor Q102. Since data of the memory cell is sensed at the third sense amplifier by comparing potentials of output signals from the first and second sense amplifiers, if the operation of either of the first and second sense amplifiers is slow, an erroneous operation would occur. For this reason, it is preferable that the sense speeds of the first and second sense amplifiers are set so that they are equal to each other. In view of this point, the sense amplifier circuit shown in FIG. 2 is designed so that transistor sizes W/L of corresponding transistors of the first and second sense amplifiers 1 and 2 are equal to each other. However, in the circuit of the embodiment of FIG. 2, the capacitance added to the bit lines is sum of the capacitances of the gates of the transistors S1 and S4, which becomes equal to a value twice larger than the capacitances of the gate added to the first or second reference bit line. For this reason, the change rate of the bit line potential VIN is slower than the change rate of the reference bit line potential VR2. When the bit line is discharged, since the change of the potential VIN becomes slower than that of the potential VR2, the potential VIN becomes higher than the potential VR2. For this reason, the output signal B from the second sense amplifier immediately changes to "1" level, giving rise to an erroneous operation. Taking this problem into consideration, the embodiment of FIG. 13 is constructed as follows. As described above, potentials VR1 on the first reference bit lines are applied to the gates of voltage comparison transistors of two first sense amplifiers formed in the regions S/A0 and S/A1, thereby making a setting such that the capacitance of the gate added to each bit line and the capacitance of the gate added to each first reference bit line are equal to each other. Similarly, potentials VR2 on second reference bit lines are applied to the gates of voltage comparison transistors of two second sense amplifiers formed in the regions S/A0 and S/A1, thereby making a setting such that the capacitance of the gate added to each bit line and the capacitance of the gate added to each second reference bit line are equal to each other. As a result, capacitance values added to respective bit lines and reference bit lines become equal to each other. Thus, an erroneous operation can be prevented. The above-mentioned embodiment of FIG. 13 can be applied in other various manners.

As previously described, for reading out memory cell data of "1" at a high speed, it is preferable that the potential VIN on the bit line changes to a lower level earlier than the potential VR2 on the second reference bit line. For this reason, where a memory cell of "1" is selected as a result of switching of row lines, a higher speed readout operation can be made according as the gate potential of the selected memory cell become higher than the gate potential of a selected second reference cell. Since as the material of row lines, polysilicon having a resistance value 100 times or more larger than that of aluminum is generally used, and moreover the line width of the row line is fined so that it is equal to 1 $\mu$m or less, there occurs a difference of the order of 10 nsec between the rise speed of the row lines in memory cells closer to the row decoder in the memory cell array and that in memory cells remote therefrom. For this reason, by arranging second reference cells at the position remotest from the row decoder to make a setting such that the gate potential of the second reference cell is lower than the gate potential of a memory cell selected when the switching of row lines is made, a high speed readout operation can be realized. For example, such a high speed readout operation can be realized by arranging the second reference bit line between memory cell arrays 1 and 2, and by exchanging the region R1 to which the second reference bit line is connected and the regions S/A1 of the sense circuit. Similarly, the same effect as stated above can be provided also in connection with the bit 2 or 3 by arranging, on the right side of the memory cell array 3, the second reference bit line arranged between memory cell arrays 2 and 3 to exchange the region R1 to which the second reference bit line is connected and the region S/A3.

As in the above-described first to sixth embodiments, this invention can be applied in various manners as the semiconductor memory device.

Figure 14:
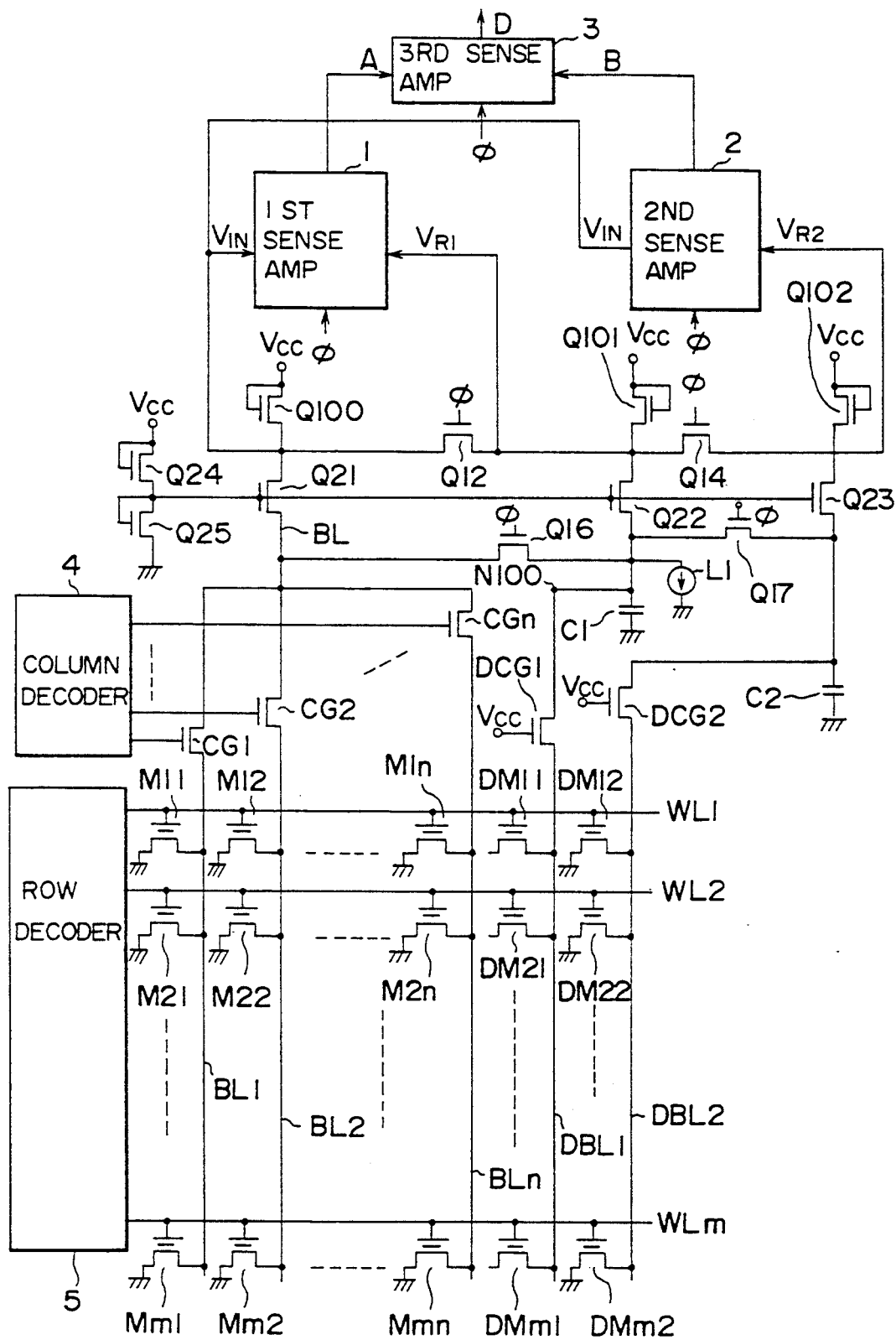
FIG. 14 is a circuit diagram showing an embodiment in which equalizing transistors are omitted.

Referring to FIG. 14, there is shown a seventh embodiment.

This embodiment differs from the embodiment of FIG. 1 in that precharging transistors Q11, Q13 and Q15 are omitted. The reason why such an omission has been made is as follows. As the result of the fact that inventors manufactured the semiconductor memory shown in FIG. 14 on an experimental basis and evaluated this memory, the following fact was made clear. Since equalizing transistors Q12, Q14, Q16 and Q17 set potentials VIN, VR1 and VR2 to the same potential, output signals A and B from the first and second sense amplifiers vary in correspondence with data stored in the memory cells, so correct data is sensed. Thus, precharging transistors Q11, Q13 and Q15 are not necessarily required.

Accordingly, the number of elements is reduced in the construction of this embodiment. Thus, a semiconductor memory having a good area efficiency will be provided.

As the result of the fact that the inventors further manufactured the semiconductor memory shown in FIG. 1 on an experimental basis and evaluated this memory, it has been found that minimum operable power supply voltages vary at every memory cell. As described above, it has been found that, even in the case of an integrated circuit in which respective cells are to be of the same structure and to be in the same state, currents flowing therein slightly vary at every memory cell, so the minimum operable power supply voltage is high in memory cells where a current less than that in reference cells turned ON flows.

Generally, it is desirable that a semiconductor integrated circuit device is operable even at a low power supply voltage. However, when the power supply voltage Vcc is lowered, a difference between a potential of the signal A and that of the signal B becomes small, and a difference between potentials of signals A and B and the power supply voltage Vcc also becomes small. If the latter difference is smaller than the threshold voltages of the transistors S5 and S6, these transistors S5 and S6 are turned OFF and are thus inoperative. In this case, it has been found that a rate showing that a difference between a potential of the signal B and the power supply voltage Vcc becomes small with lowering of the power supply voltage becomes higher. Namely, it has been found that a rate showing that a difference between the potential of the signal B and the power supply voltage becomes small, is higher than that of other memory cells, since a potential of VR2 is lower than that of VIN for memory cells, and that the minimum value of the operable power supply voltage is higher than those of other memory cells. Thus, if a potential of VIN is lower than that of VR2, the readout speed is fast as previously described, and the memory device is operable at a lower power supply voltage. Conversely, if the former is larger than the latter, there results the problem that the power supply margin is narrowed.

Figure 15:
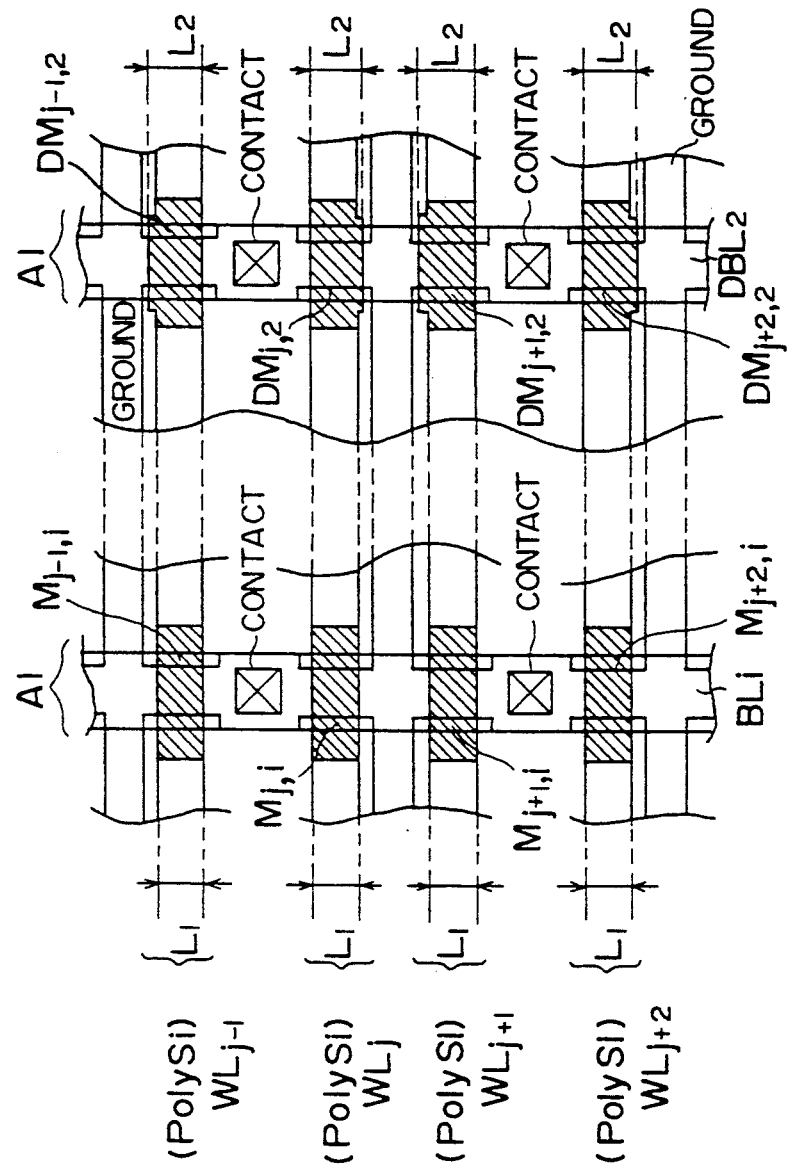
FIG. 15 is a plan view of the device showing the relationship between the gate lengths of the memory cell and the reference cell.

An eighth embodiment of this invention shown in FIG. 15 has been made with the above circumstances in view. An object of this embodiment is to provide a semiconductor memory operable at a lower power supply voltage even if the current flowing in the memory cell is small. In this embodiment, a setting is made such that the channel length ($L_2$) of transistors constituting the reference cell is longer than the channel length ($L_1$) of transistors constituting the memory cell. By employing such a setting, the current value of the reference cell can be smaller at all times than the current values of the memory cells. As a result, a setting can be made such that a potential of VR2 is higher than that of VIN. For this reason, the rate showing that a difference between a potential of the signal B and that of Vcc becomes small is lower than the rate in the prior art. Accordingly, it is possible to operate the memory device at a lower power supply voltage.

In such an embodiment, it is sufficient that a current flowing in the reference cell is smaller than a smallest memory cell current of the memory cell currents. Accordingly, it is unnecessary to set the channel length of the reference cell to a value which is much longer than the channel length of the memory cell. It is sufficient that the channel length of the reference cell is longer than the channel length of the memory cell by about 10%. For example, if the channel length of the memory cell is 1 $\mu$m, it is sufficient that the channel length of the reference cell is about 1.1 $\mu$m. In this case, if a difference between the channel lengths of the memory cell and that of the reference cell is too large, there occurs a difference in responses for power supply noise between VIN and VR2. This gives the cause of an erroneous operation. Accordingly, providing a so large difference is not preferable.

In accordance with this embodiment, a semiconductor memory having a large voltage margin can be provided.

Figure 16:
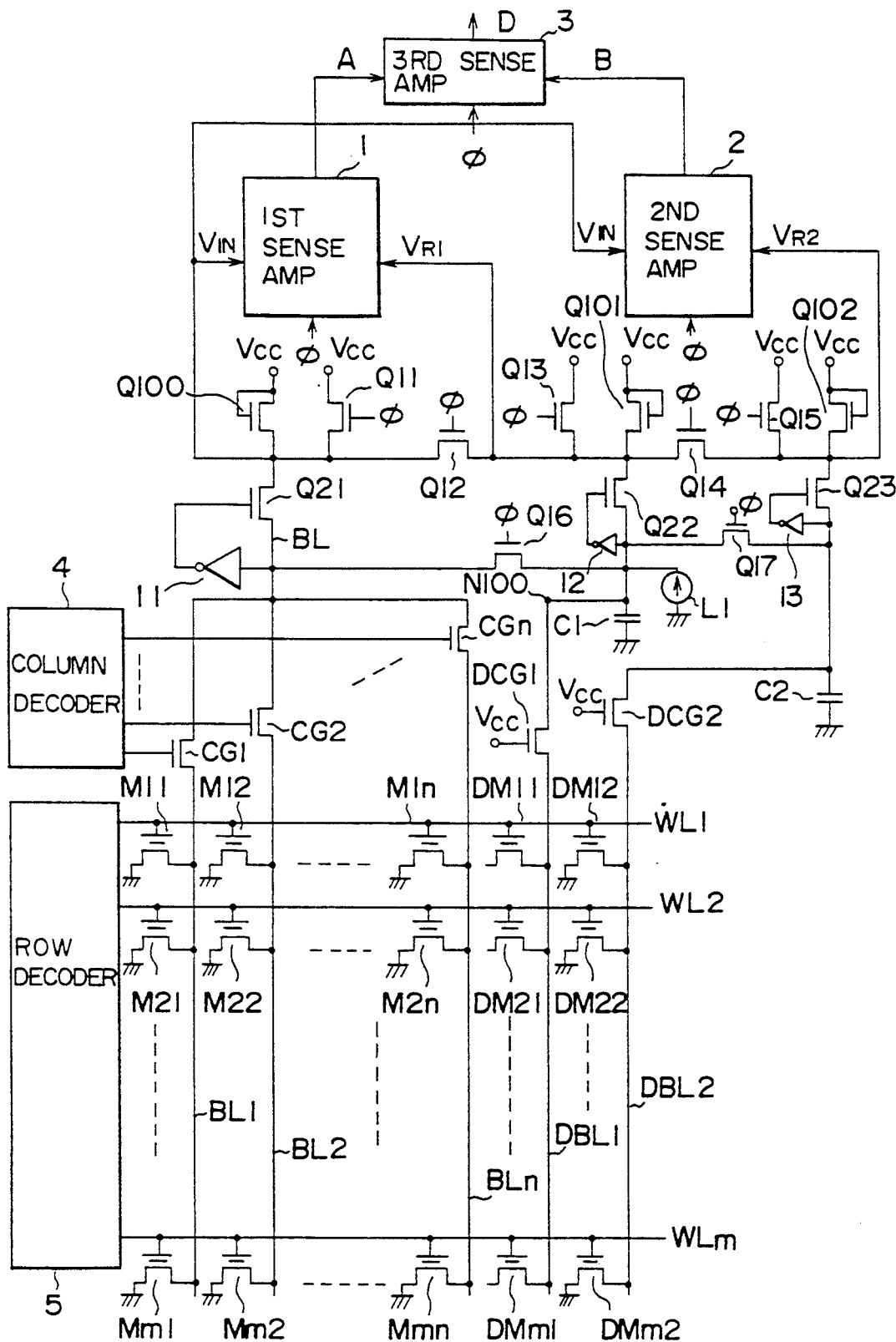
FIG. 16 is a circuit diagram showing an embodiment using a feedback type bias.

Referring to FIG. 16, there is shown a ninth embodiment of this invention. In place of the fixed bias system made up by transistors Q24 and Q25 shown in FIG. 1, well known feedback bias circuits including inverters 11, 12 and 13 are used.

As the result of the fact that this circuit is manufactured on an experimental basis and the manufactured circuit is evaluated, the time required for precharging the bit line or the reference bit line in the case where the feedback bias circuit shown in FIG. 16 is used could be shorter than that in the case where the fixed bias circuit shown in FIG. 1 is used. For this reason, the time required until data is outputted after the address is inputted in the case of the feedback bias system shown in FIG. 16 can be shorter than that in the case of the fixed bias system. Thus, it has been found that a higher speed operation can be performed.

For performing a higher speed operation, the inventors employed a scheme to optimize equalization and precharging times in the circuit shown in FIG. 16, and to set the transistor size of the output stage of the output buffer circuit to a larger value in order to get the shorter charge/discharge time on the external terminal. Thus, a semiconductor memory which performs a higher speed operation is provided. However, since the current drive capability of the output stage transistor is large there occurred the new problem that the power supply voltage varies to much more extent at the time of data output by the inductance component of the package or the power supply wiring, giving rise to an erroneous operation by such a power supply noise in the case where a memory cell in which "0" data is stored is selected. In this case, according to the inventors' analysis, it has been found that the reason why an erroneous operation occurs by the power supply noise is that the width of the precharge pulse is short. This reason is considered as follows.

Generally, for the time required for precharging the bit line, it takes the maximum time in the case of precharging the bit line in a discharged state. On the contrary, since the reference bit line DBL1 is already in a charged state, it is sufficient that the time required for precharging is short. Where "0" data is outputted after precharge is completed, if a power supply voltage changes, outputs from inverters 11, 12 and 13 also undergo the influence of the changes in the power supply voltage and change accordingly. At this time, if the power supply voltage Vcc is lowered, an output from the inverter 12 changes in a direction of "0" level, so the conduction resistance values of the transistors Q21 and Q22 become large. The time required for precharging the bit line BL is long. So, since the resistance value of the transistor Q21 becomes large, the bit line BL is not brought into a complete precharged state. But the reference bit lines are sufficiently precharged even if the precharge time is short. Thus, there occurs a difference between a potential of VIN and that of VR1. Consequently, after equalizing operation is completed, the potential of VIN becomes lower than that of VR1. As a result, the first sense amplifier outputs erroneous data. Thus, the semiconductor memory erroneously operated.

With the above circumstances in view, the embodiment shown below contemplates providing a semiconductor memory which is free from an erroneous operation due to the power supply noise and is operable at a high speed.

Figure 17:
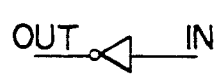
FIG. 17 is a view showing an inverter used for feedback.
Figure 18:
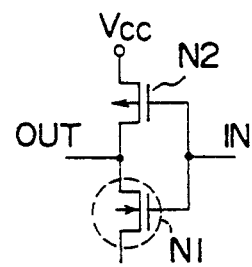
FIGS. 18 to 24 are circuit diagrams showing various embodiments of inverters shown in FIG. 17, respectively.

FIG. 17 is a circuit symbol showing inverters 11 to 13 used in the embodiment of FIG. 16 and FIG. 18 shows the circuit configuration thereof. By varying the threshold voltage of the transistor N1 constituting these inverters or the ratio of size between the P-channel transistor N2 and the N-channel transistor N1, the potential on the bit line can be optimized. It is desirable that, e.g., the threshold voltage of the transistor N1 is about zero volts.

Figure 19:
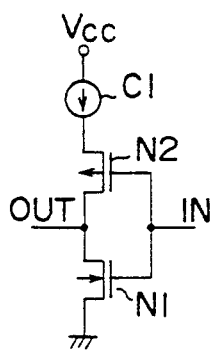

FIG. 19 shows an embodiment in which a measure is taken for the above-described erroneous operation by inserting a constant current source C1 between the power supply of the inverter of FIG. 18 and the transistor N2. In such an arrangement, even if the power supply voltage Vcc changes by an output of data at the time when data is outputted from the output buffer, the current value is invariant because the constant current source C1 exists. Thus, an output OUT of the inverter does not change, so an erroneous operation as described above is not produced.

Figure 20:
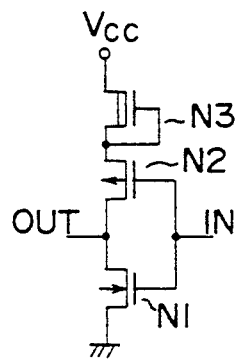

FIG. 20 shows an embodiment in which a depletion type transistor N3 is used as the constant current source. By connecting the source and the gate, a constant current characteristic is provided.

Figure 21:
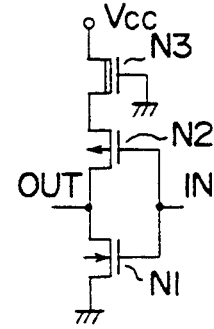

FIG. 21 shows an embodiment in which the gate of the transistor shown in FIG. 20 is grounded. Since the transistor N3 operates in a saturation region, a constant current characteristic is provided.

Figure 22:
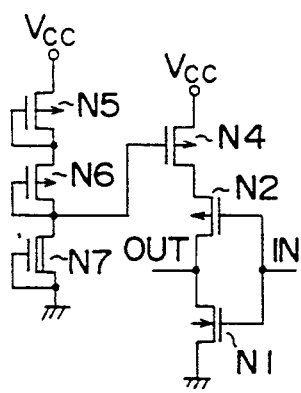

FIG. 22 shows an embodiment in which a P-channel transistor N4 is used to provide a constant current characteristic. In this embodiment, a series connection circuit comprising P-channel transistors N5 and N6 of which drains and gates are respectively connected, and a depletion type transistor N7 is connected between the power supply Vcc and ground, and the gate of a transistor N4 is connected to the junction of the transistors N6 and N7. In this case, the gate voltage of the transistor N4 is expressed as $Vcc - |Vthn\ 5| - |Vthn\ 6|$, so the gate voltage of the transistor N4 similarly changes with changes in the power supply voltage, resulting in a constant current characteristic.

Vthn 5 and Vthn 6 represent threshold voltages of the transistors N5 and N6, respectively.

Figure 23:
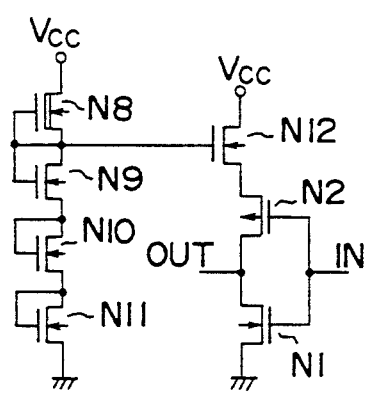
Figure 24:
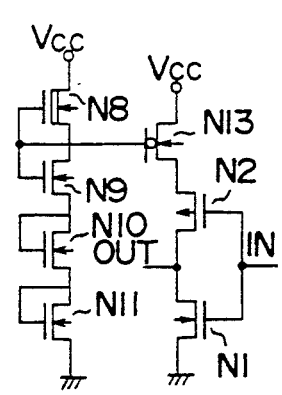

FIGS. 23 and 24 show embodiments in which a series connection circuit comprising an N-channel depletion type transistor N8 of which gate and source are connected, and three N-channel transistors N9, N10 and N11 of which gates and drains are respectively connected is connected between the power supply Vcc and ground. By allowing an N-channel transistor N12 and an N-channel transistor N13 having the threshold value of substantially zero volts to be operative in a saturation region, a constant current characteristic is realized. For this reason, even if the power supply voltage Vcc changes, a current flowing does not change, resulting in no change in the output OUT of the inverter. Accordingly, the above-described erroneous operation does not occur.

As stated above, in these embodiments, even if there are changes in the power supply voltage, outputs of inverters I1 to I3 of the feedback bias circuit do not change, so the precharge time can be shortened. Thus, a semiconductor memory which operates at a high speed and is free from an erroneous operation can be provided.

Figure 25:
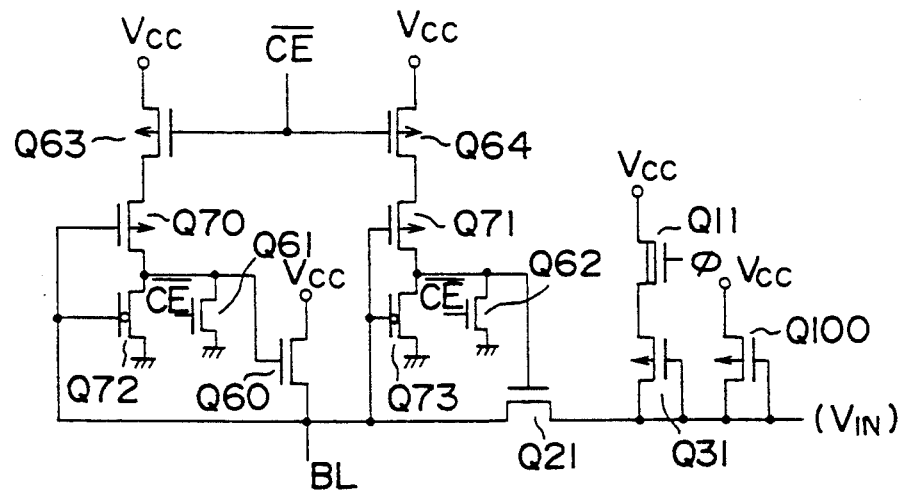
FIG. 25 is a circuit diagram showing another embodiment of a feedback type bit line bias circuit.

FIG. 25 is a circuit diagram showing a still further embodiment of the feedback bias circuit.

The feedback bias circuit of this embodiment is comprised of a first inverter circuit having an input connected to the bit line BL and an output connected to the gate electrode of the transistor Q21, and a second inverter circuit having an input connected to the bit line BL and an output connected to the gate electrode of the initial charging transistor Q60. More particularly, the first inverter circuit is comprised of P-channel transistors Q64 and Q71, and an N-channel transistor Q73 having the threshold voltage of substantially zero volts. Further, the second inverter circuit is comprised of a series connection circuit comprising P channel transistors Q63 and Q70 and an N-channel transistor Q72 having the threshold voltage of substantially zero volts. N-channel transistors Q61 and Q62 are connected between outputs of the second and first inverters and Ground, respectively. In this case, P-channel transistors Q63 and Q64 and N-channel transistors Q61 and Q62 are used with a view to reducing the power consumption of a chip when the chip is in a standby state. The initial charging transistor Q60 is used for charging the bit line at a high speed. A setting is made such that the output potential of the second inverter is lower than the output potential of the first inverter in order to allow the initial charging transistor Q60 to be cut OFF before the N-channel transistor Q21 is cut OFF after charging of the bit line is started. As stated above, by using the initial charging transistor Q60 in the feedback type bias circuit, the charge time from zero volts to a predetermined potential can be further shortened.

Figure 26:
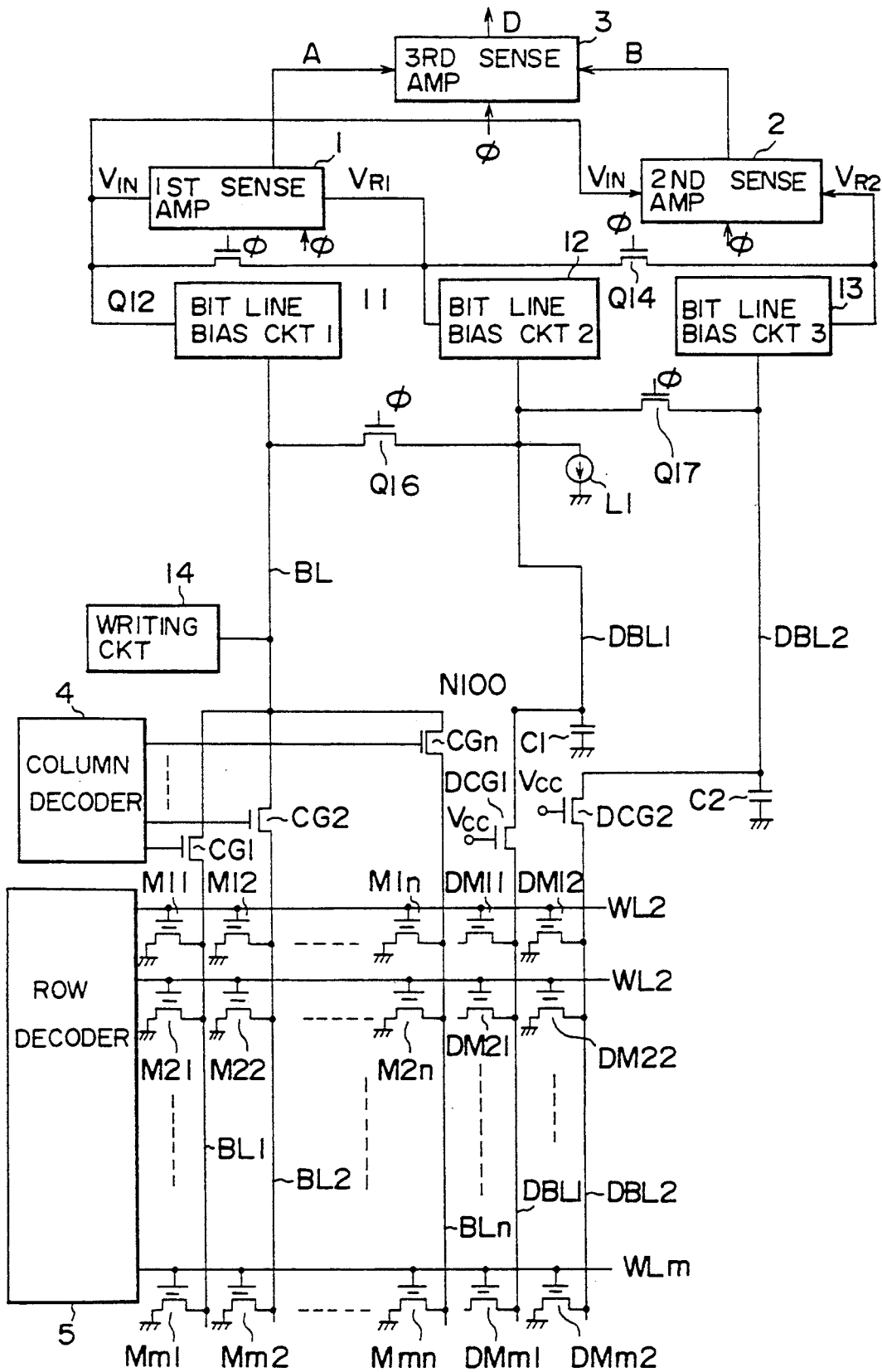
FIG. 26 is a circuit diagram showing the manner of connection in a semiconductor memory device of a bit line bias circuit.

FIG. 26 shows a tenth embodiment of this invention wherein how the bit line bias circuit shown in FIG. 25 is coupled to the sense amplifier, etc. in the semiconductor memory device is illustrated. By using a bias circuit of a structure similar to that in FIG. 25 also in the first and second reference bit lines DBL1 and DBL2, the bit line potential and the potential on the first reference bit line at the time of "0" data readout operation of the memory cell, and the bit line potential and the potential on the second reference bit line at the time of "1" data readout operation of the memory cell are equal to each other. Thus, the readout operation can be performed at a high speed.

Figure 27:
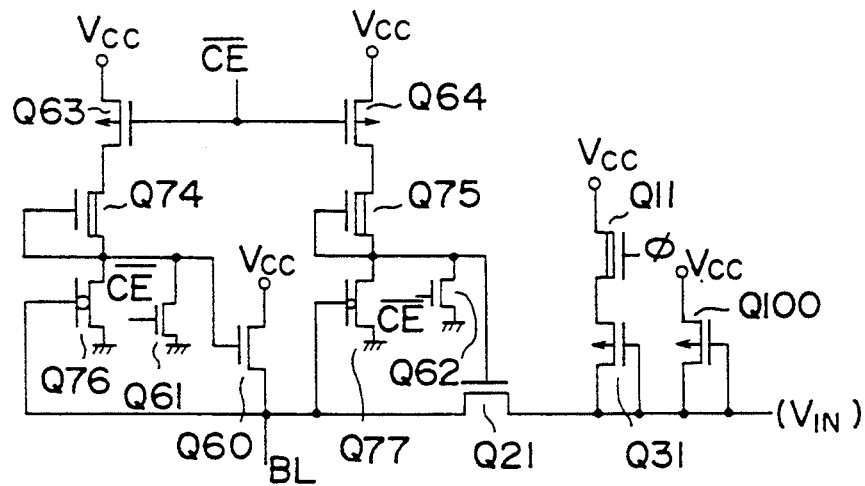
FIGS. 27 and 28 are circuit diagrams showing other embodiments of the bit line bias circuit, respectively.
Figure 28:
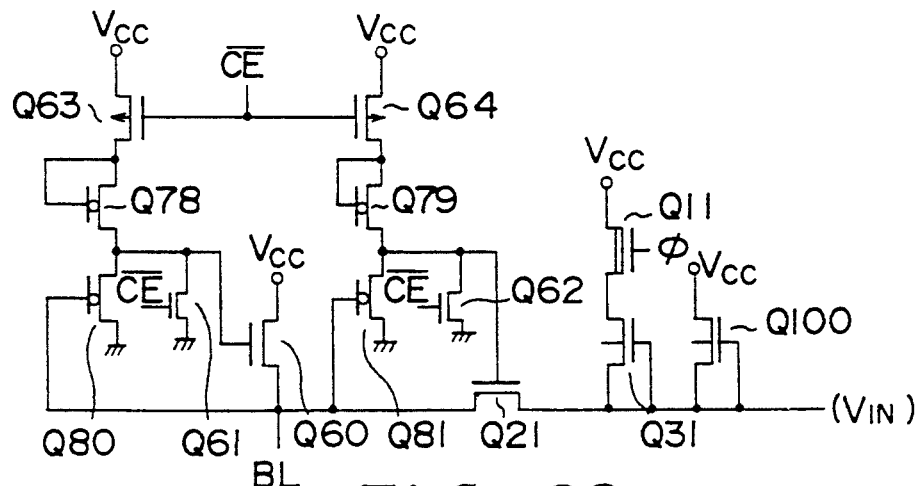

FIG. 27 shows a further embodiment of the bit line bias circuit of FIG. 26 wherein the P-channel transistor Q71 constituting the first inverter of FIG. 25 is replaced with a depletion type N-channel transistor Q75 of which gate electrode is connected to the source electrode and the P-channel transistor Q70 constituting the second inverter is replaced with a depletion type transistor Q74 of which gate electrode is connected to the source electrode. Further, FIG. 28 shows a still further embodiment of the bias circuit wherein the P-channel transistor Q71 of FIG. 25 is replaced with an N-channel transistor Q79 having the threshold voltage of substantially zero volts of which gate electrode is connected to the drain electrode, and the P-channel transistor Q70 is replaced with a transistor Q78 of which gate electrode is connected to the drain electrode.

As stated above, as the first and second inverters, various type of inverters used in the prior art may be used in addition to the inverters shown in FIGS. 20 to 24.

Figure 29:
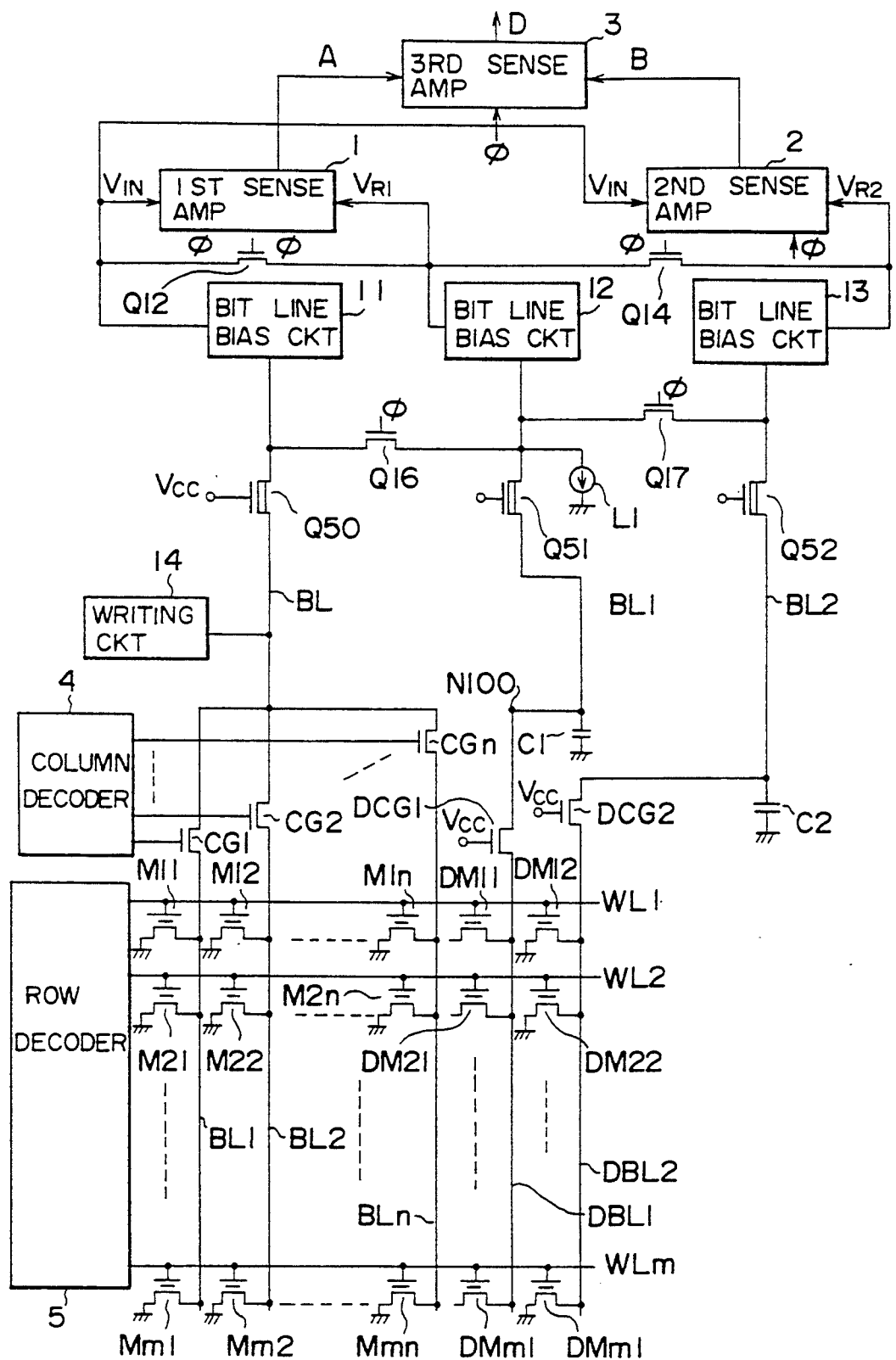
FIG. 29 is a circuit diagram showing an improved example of the embodiment shown in FIG. 27.
Figure 30:
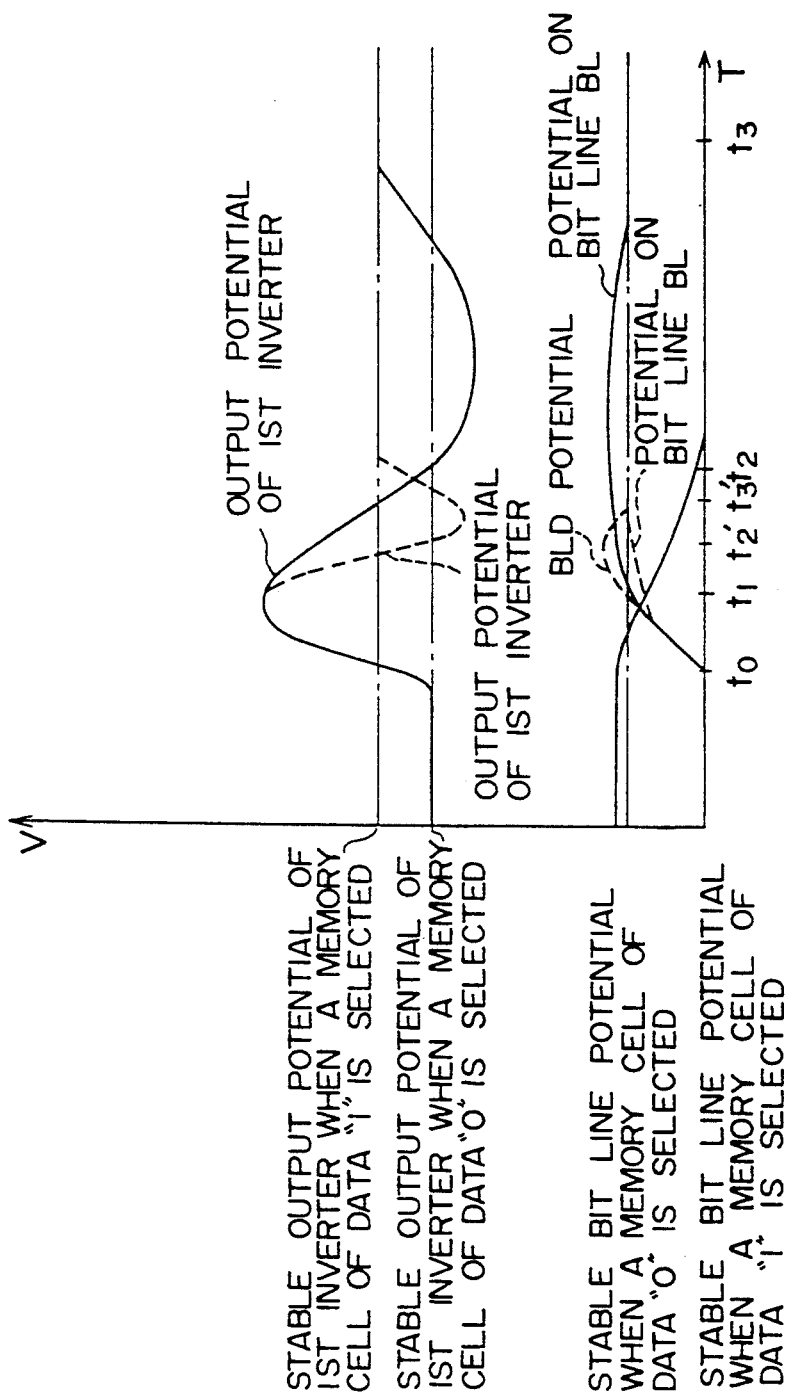
FIG. 30 is a graph showing the relationship between a bit line potential and a feedback potential of a bias circuit.

FIG. 30 shows changes in the bit line potential BL and changes in the output potential of the first inverter of the feedback bias circuit shown in FIGS. 25 and 26, when a bit line newly selected by switching between bit lines is charged. In FIG. 30, when charging of a newly selected bit line BL is initiated at time t0, an output potential of the first inverter rises in correspondence with a low potential of this bit line BL. At time t1, the bit line is charged up to a bit line potential when a memory cell in which data "1" is stored is selected. However, by a delay in the response speed of the inverter, the output potential of the first inverter at this time is higher than a predetermined stable potential, e.g., at time t3 of FIG. 30 when the memory cell of data "1" ("1" cell) is selected. For this reason, the bit line is charge up to a value more than the predetermined stable potential when the "1" cell is selected, i.e., at the time t3 shown in FIG. 30, and the output potential of the first inverter is lowered. As a result, the charging of the bit line is stopped. By the selected memory cell, the bit line is gradually discharged, but because the capacitance of the bit line is large, it is not recovered to the predetermined stable bit line potential where the "1" cell is selected until the time t3. As stated above, even if the potential on the bit line reaches the predetermined stable potential, a further excess charging is carried out (overcharging). As a result, this results in the problem that the readout speed of "1" data becomes slow. For this reason, in the tenth embodiment shown in FIG. 29, a depletion type N-channel transistor Q50 of which gate is connected to Vcc is inserted between the drain electrode of the column gate transistor and the input (BLD) of the bit line bias circuit.

The voltage waveform indicated by broken lines in FIG. 30 shows the potential on the bit line, the input potential of the bit line bias circuit and the output potential of the first inverter. Here, the input potential of the bit line bias circuit is represented by BLD.

Since the transistor Q50 in FIG. 29 acts as a resistor, when a newly selected bit line BL is charged, there occurs a potential difference between the drain (BLD) and the source of this transistor.

When switching between bit lines is carried out, so a newly selected bit line is charged, the potential on the input terminal of the bit line bias circuit becomes higher than the potential on the bit line (the source side of the transistor Q50).

For this reason, even if the input terminal of the bit line bias circuit is excessively charged up to a value more than the stable bit line potential when a memory cell of data "1" is selected, the bit line BL is not charged up to the stable bit line potential when the memory cell of data "1" is selected.

Further, after the input terminal of the bit line bias circuit is excessively charged, the input terminal of the bit line bias circuit is ceased to be charged. At this time, since the potential on the input terminal of the bit line bias circuit is a potential higher than that on the bit line BL, the bit line BL is further charged by charges excessively charged on the input terminal of the bit line bias circuit. Thus, the potentials on the input terminal of the bit line bias circuit and the bit line BL become the stable potential in the case where a memory cell of data "1" is selected.

By inserting the depletion type transistor Q50, it is possible to allow the potential on the input terminal of the bit line bias circuit to rise at a higher speed as compared to the potential on the input terminal of the bit line bias circuit in the case where no depletion type transistor Q50 is inserted. Thus, the output potential of the first inverter of the bit line bias circuit is lowered at a speed higher than that of the prior art as the result of the fact that the depletion type transistor Q50 is inserted.

As shown in FIG. 30, for example, the time required until the output potential of the first inverter lowers, so there is no charging on the bit line through the transistor Q21 is shortened by t2—t2' as the result of the fact that the depletion type transistor Q50 is inserted. Overcharging of the bit line due to delay of the response speed of the first inverter of the bit line bias circuit is prevented. Thus, the time required until the potential on the bit line BL reaches the stable bit line potential when a memory cell of data "1" is selected can be shortened.

As stated above, by inserting a D-type transistor of which gate is connected to the power supply Vcc between the input of the bit line bias circuit and the bit line BL to produce a potential difference between the bit line BL and the bias circuit input BLD, overcharging of the bit line is prevented. Thus, a high speed readout operation can be performed.

In the embodiment of FIG. 29, by inserting depletion type transistors between the reference bit line DBL1 and the bit line bias circuit 12 and between the reference bit line DBL2 and the bit line bias circuit 13, respectively, the potentials on the bit line and the first reference bit line at the time of "0" data readout operation of the memory cell and the potentials on the bit line and the second reference bit line at the time of "1" data readout operation of the memory cell are equalized. Thus, the readout operation is stabilized.

FIG. 31 shows an embodiment wherein the write control signal $\overline{H}$ is applied to the gate of the D-type transistor in the embodiment shown in FIG. 29. Ordinarily, in EPROM, in the case of writing "0" data into the memory cell, a high voltage of about 9 volts is applied to the bit line by the writing circuit.

In the circuit of this embodiment, by applying a signal $\overline{H}$ which becomes zero volts at the time of write operation to the gate electrode of the depletion type transistor Q50, a high voltage is prevented from being applied to the bias circuit. Further, since this signal $\overline{H}$ becomes equal to a potential of the power supply Vcc at the time of data read operation, the problem that the delaying of the data readout speed by excessive charging of the bit line which has been explained in the FIG. 2 embodiment is solved.

Figure 32:
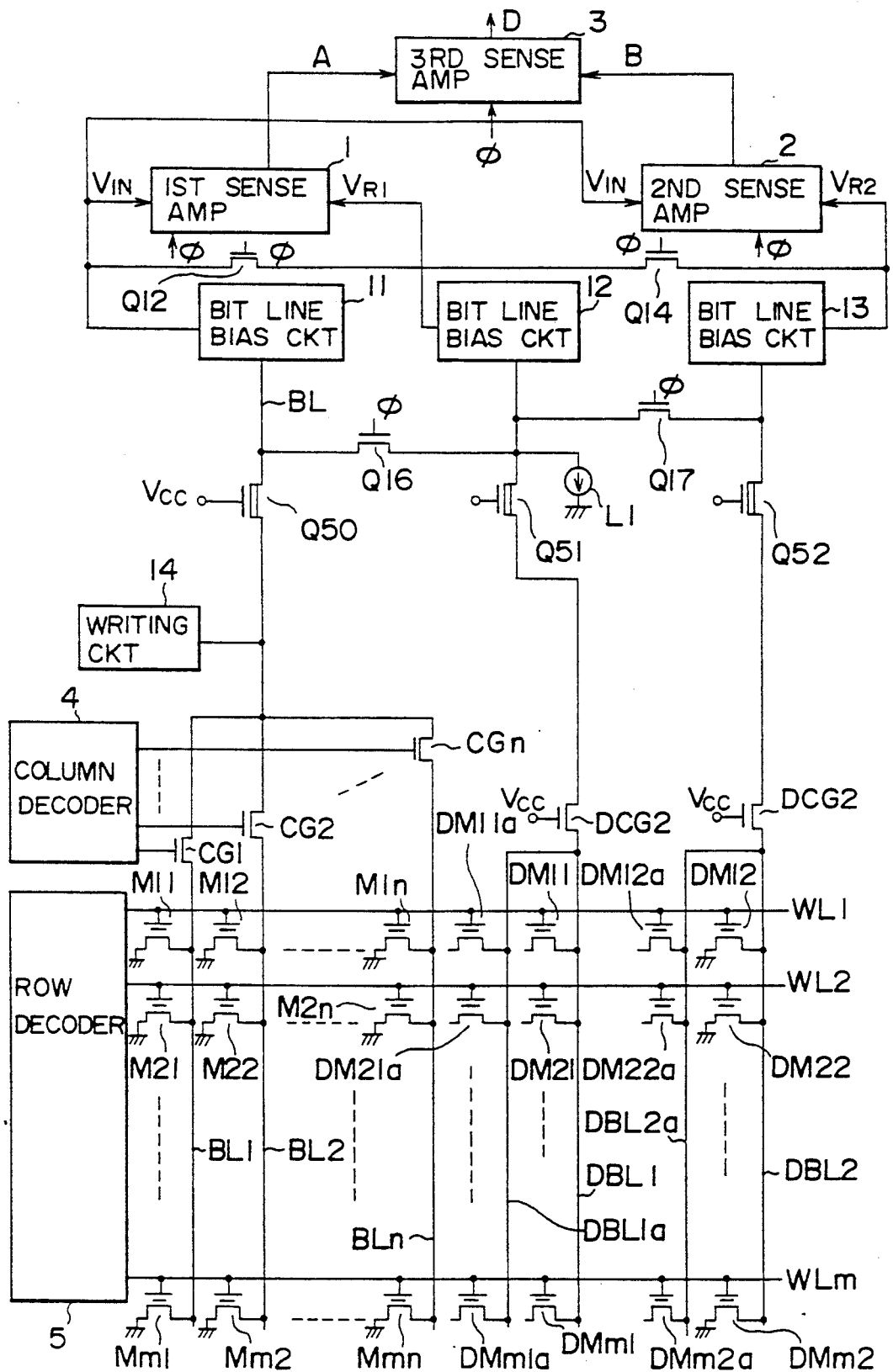
FIG. 32 is a circuit diagram showing an embodiment of this invention in which the circuit capacitors are replaced by the reference bit lines.

FIG. 32 shows a modified example of the embodiment shown in FIG. 29 wherein the capacitors C1 and C2 of the circuit shown in FIG. 29 are constituted by reference bit lines DBL1a and DBL2a. In this embodiment, by adjusting the number of reference cells DM11a, DM21a, DM12a, DM22a, . . . connected to the additional reference bit lines, parasitic capacitance existing on the column gates CG1 and CG2 . . . on the memory cell side is compensated. Thus, load capacities of the bit line and the reference bit line are set so that they are equal to each other.

FIG. 33 is a circuit diagram showing an eleventh embodiment of this invention, and gives an explanation of the equalization system in the memory device of this invention. In this embodiment, transistors Q200 and Q201 for performing equalizing operation are added between the bit line BL and the reference bit line DBL2.

In the semiconductor memory shown in FIG. 33, let consider the case where, e.g., the bit line BL and the first and second reference bit lines DBL1 and DBL2 are all equalized. In this case, the path connected by transistors Q12, Q14, Q201 and Q16, Q17, Q200 is shown as a schematic view in FIG. 34(A).

How potentials on respective bit lines vary will now be described in connection with the case where "0" data is read out and the case where "1" data is read out with references FIGS. 34(A) to 34(D).

Let us first consider the case where a selected memory cell stores "0" data. In this case, this memory cell and the first reference cell is cut OFF, and the second reference cell is turned ON. Accordingly, it only the second reference bit line of the bit line BL, and the first and second reference bit lines DBL1 and DBL2 that memory cells turned ON are connected. For this reason, a path along which a current flows from the bit line and the first reference bit line to the second reference bit line is formed.

After the equalizing operation is completed, potentials on the bit line BL, the first reference bit line DBL1 and the second reference bit line DBL2 vary in correspondence with data stored in the memory cell and the first and second reference cells. Further, first, second and third sense amplifiers sense the changes of potentials on the bit line BL and first and second reference bit lines DBL1 and DBL2 to sense data stored in the memory cells.

For sensing data stored in the memory cell at a higher speed, as understood from the detailed circuit configuration of the first, second and third sense amplifiers, it is desirable that the potential on the bit line BL is higher than the potential on the first reference bit line DBL1 when the equalizing operation is completed in the case of sensing "0" data stored in the memory cell (the memory cell is cut OFF). Conversely, in the case of sensing "1" data stored in the memory cell (the memory cell is turned ON), it is desirable that the potential on the bit line BL is lower than the potential on the reference bit line DBL2 when the equalizing operation is completed.

On the contrary, when the potential on the bit line BL is lower than the potential on the first reference bit line DBL1 at the time of completion of equalizing operation in the case of sensing "0" data stored in the memory cell, data sense speed becomes slow. Further, when the potential on the bit line BL is higher than the potential on the second reference bit line DBL2 in the case of sensing "1" data, data sense speed also becomes slow.

Figure 34A:
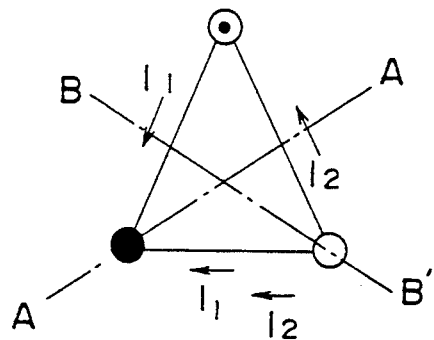
FIGS. 34(A) to 34(D) are explanatory views showing the relationship between bit lines and reference bit lines equalized.

As described above, since the memory cell and the first reference cell are both cut OFF in FIG. 34(A), the electrically symmetrical relationship holds along the lines A—A' of FIG. 34(A).

For this reason, the value of a current flowing from the bit line BL to the second reference bit line DBL2 and the value of a current flowing from the first reference bit line DBL1 to the second reference bit line DBL2 are equal to each other. Each current takes a value of I1.

Further, since currents flowing out from the bit line BL and the first reference bit line DBL1 take the same value, the potential on the bit line BL and the potential on the first reference bit line DBL1 when a memory cell of "0" data is selected are equal to each other. In the case of sensing "0" data, when the equalizing operation is completed, there is no possibility that the potential on the bit line becomes lower than the potential on the first reference bit line DBL1. As a result, data sense speed does not become slow.

Let us consider the case where a selected memory cell stores "1" data.

In this case, since this memory cell and the second reference cell are turned ON, and the first reference cell is cut OFF, the electrically symmetrical state holds along the lines B—B' as shown in FIG. 34(A). For this reason, since the value of a current flowing into these bit lines BL and the value of a current flowing into the second reference bit line DBL2 take a value of I2 equal to each other, the potential on the bit line and the potential on the second reference bit line DBL2 when a memory cell of "1" data is selected are equal to each other. As a result, there is no possibility that the potential on the bit line BL becomes higher than the potential on the second reference bit line DBL2 in the case of sensing "1" data. As a result, data sense speed does not become slow.

As stated above, by employing an equalization system as shown in FIG. 34(A) in the construction of FIG. 33, even if data stored in the memory cell is either "0" or "1", data sense speed does not become slow.

In addition, other equalization methods will be described by using schematic views of FIGS. 34(B) to (D).

Figure 34B:
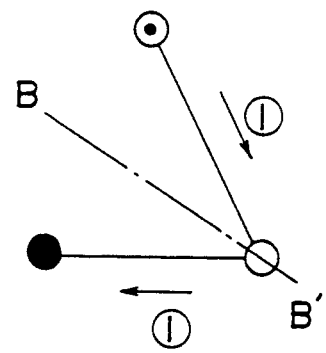

Initially, let consider the case where transistors Q200 and Q201 are not connected between the bit line BL and the second reference bit line DBL2 as shown in FIG. 34(B).

Where a selected memory cell stores "0" data, this memory cell is cut OFF. Accordingly, a current flows through only second reference cells turned ON. For this reason, the current path ① is formed. Thus, a current flows in order of the bit line BL, the first reference bit line DBL1, and the second reference bit line DBL2. As a result, the potential on the bit line BL becomes higher than the potential on the first reference bit line DBL1. As previously described, in the case of reading the "0" data, when the potential on the bit line BL is higher than the potential on the first reference bit line DBL1, more improved read margin results.

Where a selected memory cell stores "1" data, the electrically symmetrical relationship holds along the lines B—B' in the same manner as in the case of FIG. 34(A). Thus, the same effects as those described with reference to FIG. 34(A) are provided.

As described above, by employing an equalization method as shown in FIG. 34(B), even if data stored in the memory cell is "0" or "1", data sense speed does not become slow.

Figure 34C:
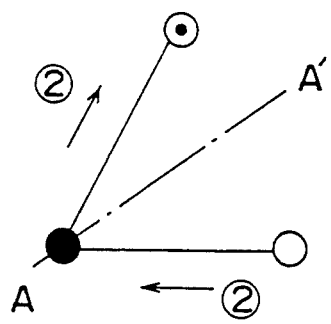

Let consider the case where transistors Q16 and Q12 are not connected between the bit line BL and the first reference bit line as shown in FIG. 34(C).

Where a selected memory cell stores "0" data, the electrically symmetrical relationship holds along the lines A—A' as shown in FIG. 34(A). The same effects as those in FIG. 34(A) are provided.

Where a selected memory cell stores "1" data, this memory cell is in an ON state. The current path ② is formed. Thus, a current flows in order of the first reference bit line DBL1, the second reference bit line DBL2, and the bit line BL. As a result, the potential on the bit line BL becomes lower than the potential on the second reference bit line. As previously described, in the case of reading "1" data, when the potential on the bit line BL is lower than the potential on the second reference bit line, more improved read margin results.

As described above, by employing an equalization method as shown in FIG. 34(C), even if data stored in the memory cell is "0" or "1", data sense speed does not become slow.

Figure 34D:
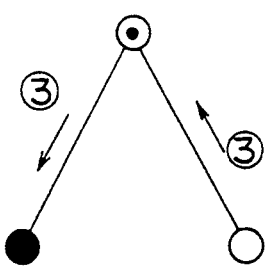

FIG. 34(D) shows the case where transistors Q17 and Q14 are not connected between the first reference bit line DBL1 and the second reference bit line DBL2.

In FIG. 34(D), even if a selected memory cell stores "0" data or "1" data, a current path ③ is formed. In this instance, when the selected memory cell stores "0" data, the potential on the bit line BL becomes lower than the potential on the first reference bit line DBL1. On the other hand, when the selected memory cell stores "1" data, the potential on the bit line BL becomes higher than the potential on the second reference bit line.

For the above-described reason, in the case of FIG. 34(D), irrespective of whether data stored in the memory cell is either "0" or "1", the readout operation becomes active in a direction where there is less read margin.

Since a sufficient equalization time is taken in an actual readout operation, differences between potentials on respective bit lines are extremely small. For this reason, there appears no difference by differences between the equalization methods of FIGS. 34(A) to (D).

However, where a higher speed operation is required, it is necessary to shorten the equalization time. In that case, since there appear differences by differences between equalization methods as described above, it is desirable that the equalization method employs one of the systems of FIGS. 34(A) to (C).

Further, it is not necessary that a set of transistors Q12, Q14 and Q201 and a set of transistors Q16, Q17 and Q200 both take any one of connections of FIGS. 34(A) to (C). Such connections may be applied to only either of the above-mentioned sets. In addition, connections of FIGS. 34(A) to (C) combined so that they are different from each other may be used.

Figure 35:
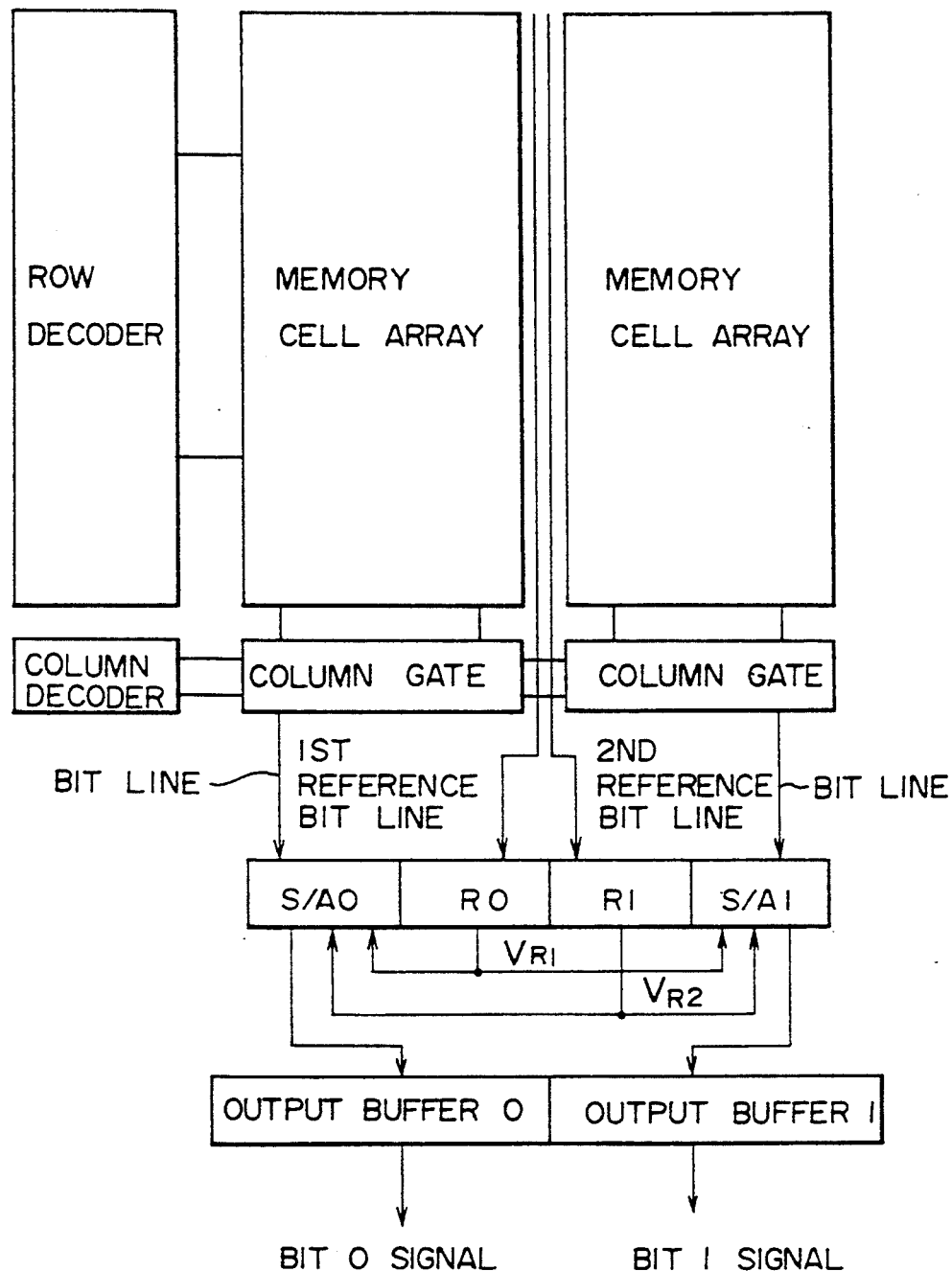
FIG. 35 is a block diagram schematically showing the configuration of a semiconductor memory device of 2 bit structure for explaining the relationship between bit lines and reference bit lines equalized.

Let us now consider the equalization method in the case where the first reference bit line DBL1 and the second reference bit line DBL2 are arranged with respect to 2 bits, respectively, as shown in FIG. 35.

Figure 36:
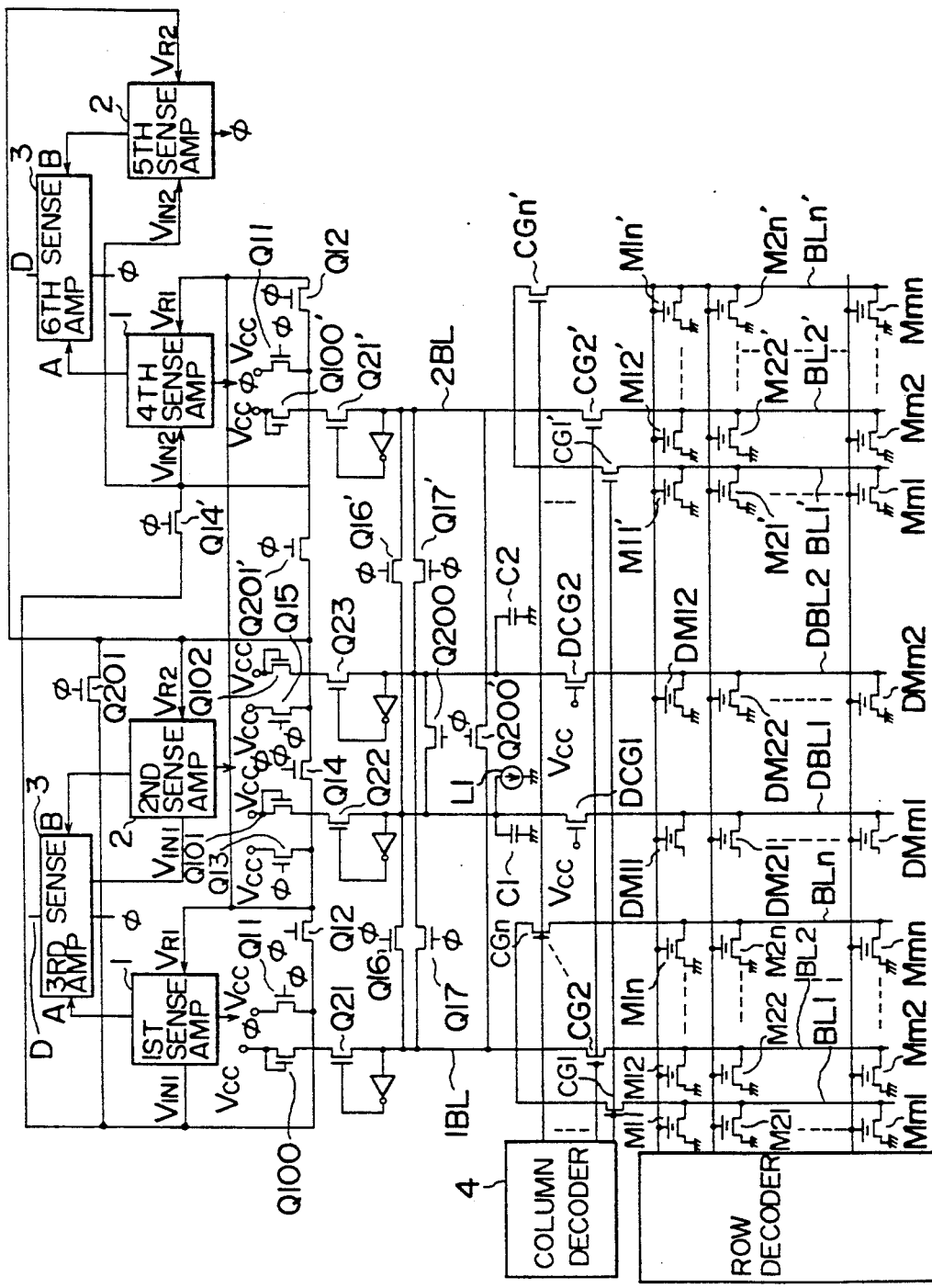
FIG. 36 is a circuit diagram showing, partially in detail, the configuration of the device shown in FIG. 35.

FIG. 36 is a circuit diagram showing the eleventh embodiment of this invention, which is a detailed circuit diagram corresponding to 2 bits in FIG. 35.

In this embodiment, transistors Q16, Q17, Q200, Q16', Q17' Q200' and Q12, Q14, Q201, Q12', Q14', Q201' for connecting respective lines are provided. By suitably operating these transistors, potentials on respective lines can be equalized.

Figure 37:
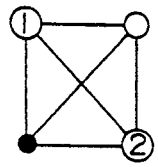
FIGS. 37(1) to 37(23), 37(1-0) and 37(1-1) are explanatory views showing the relationship of bit lines and reference bit lines equalized.
Figure 37:
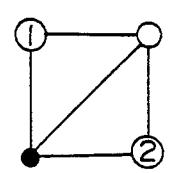
Figure 37:
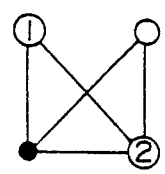
Figure 37:
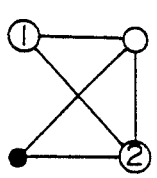
Figure 37:
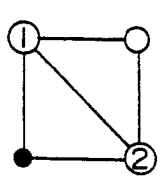
Figure 37:
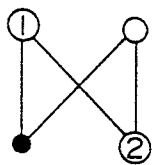
Figure 37:
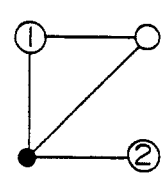
Figure 37:
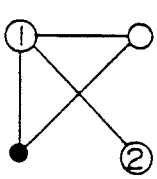
Figure 37:
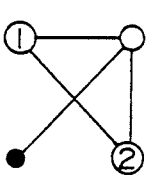
Figure 37:
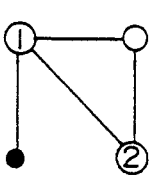
Figure 37:
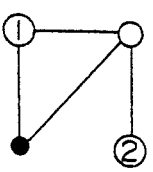
Figure 37:
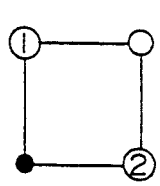
Figure 37:
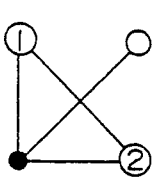
Figure 37:
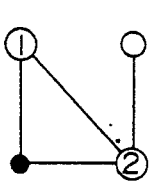
Figure 37:
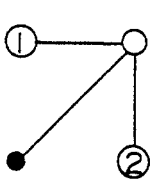
Figure 37:
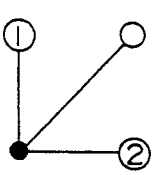
Figure 37:
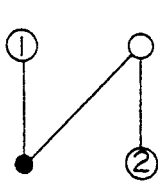
Figure 37:
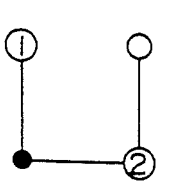
Figure 37:
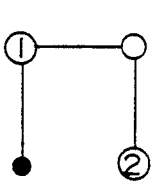
Figure 37:
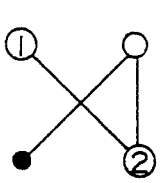
Figure 37:
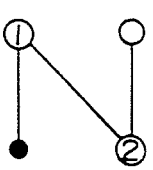
Figure 37:
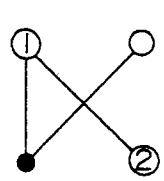
Figure 37:
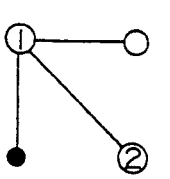

In the semiconductor memory shown in FIG. 36, let consider the case where, e.g., the first bit line 1BL, the second bit line 2BL, the first reference bit line DBL1 and the second reference bit line DBL2 are equalized. The path connected at this time is shown in FIG. 37(1) as a schematic diagram.

The case of FIG. 37(1) will now be described below.

Initially, let consider the case where a selected memory cell connected to the first bit line 1BL and a selected memory cell connected to the second bit line 2BL both store "0" data.

Since these memory cells are cut OFF, it is only the second reference bit line of the first and second bit lines 1BL and 2BL and the first and second reference bit lines DBL1 and DBL2 that the memory cell turned ON is connected to. For this reason, a path of a current flowing from the first and second bit lines 1BL and 2BL and the first reference bit line DBL to the second reference bit line is formed. The relationship between the first bit line 1BL and the second reference bit line DBL2, the relationship between the second bit line 2BL and the second reference bit line DBL2, and the relationship between the first reference bit line DBL1 and the second reference bit line DBL2 are electrically equal to each other.

When the diagram of FIG. 37(1) is modified in order to clarify this state, a diagram as shown in FIG. 37(1-0) is provided. A current flowing from the first bit line 1BL to the second reference bit line DBL2, a current flowing from the second bit line 2BL to the second reference bit line DBL2, and a current flowing from the first reference bit line DBL1 to the second reference bit line are equal to each other. Accordingly, since currents flowing from the first bit line 1BL, the second bit line 2BL, and the first reference bit line DBL1 have values equal to each other, the potential on the first bit line 1BL, the potential on the second bit line 2BL, and the potential on the first reference bit line are equal to each other. Where selected memory cells connected to the first and second bit lines 1BL and 2BL both store "0" data, there is no possibility that the potential on the first bit line 1BL and the potential on the second bit line 2BL becomes lower than the potential on the first reference bit line DBL1. Thus, data sense speed does not become slow.

Further, as apparent from FIG. 37(1-0), since potentials on the first bit line 1BL, the second bit line 2BL, and the first reference bit line DBL1 are equal to each other, there is no current flowing along the paths A, B and C of FIG. 37(1-0). Since no current exists along the paths A, B and C, if any one of paths A, B and C is removed, the electrical states of the first and second bit lines 1BL and 2BL and the first reference bit line DBL1 do not differ from those in the case where the paths A, B and C are connected. Where data stored in selected two memory cells both represent "0" level, the same electrical states are provided irrespective of whether or not paths A, B and C are present.

Let us now consider the case where a selected memory cell connected to the first bit line 1BL and a selected memory cell connected to the second bit line 2BL both store "1" data. Since these memory cells are turned ON, a path of a current flowing from the first reference bit line DBL1 to the first and second bit lines 1BL and 2BL, and the second reference bit line DBL2 is formed. The relationship between the first bit line 1BL and the first reference bit line DBL1, the relationship between the second bit line 2BL and the first reference bit line DBL1, and the relationship between the second reference bit line DBL2 and the first reference bit line DBL1 are electrically equal to each other. When the diagram of FIG. 37(1) is modified in order to clarify this state, the diagram shown in FIG. 37(1-1) is provided. For this reason, a current flowing from the first reference bit line DBL1 to the first bit line 1BL, a current flowing from the first reference bit line DBL1 to the second bit line 2BL, and a current flowing from the first reference bit line DBL1 to the second reference bit line DBL2 are equal to each other. Since a current flowing into the first bit line 1BL, a current flowing into the second bit line 2BL, and a current flowing into the second reference bit line DBL2 have values equal to each other, the potential on the first bit line 1BL, the potential on the second bit line 2BL, and the potential on the first reference bit line DBL1 are equal to each other. Namely, where memory cells connected to the first and second bit lines 1BL and 2BL both store "1" data, there is no possibility that the potential on the first bit line 1BL and the potential on the second bit line 2BL become higher than the potential on the second reference bit line DBL2. Thus, the data sense speed does not become slow. Further, as apparent from FIG. 37(1-1), since potentials on the first and second bit lines 1BL and 2BL, and the potential on the second reference bit line DBL2 are equal to each other, there is no current flowing along the paths D, E and F of FIG. 37(1-1). Since no current exists along the paths D, E and F, if any one of paths D, E and F is removed, the electrical states of the first and second bit lines 1BL and 2BL and the first reference bit line DBL1 do not differ from those in the case where the paths D, E and F are connected. Namely, where data stored in selected two memory cells both represent "1" level, the same electrical states are provided irrespective of whether or not paths D, E and F are present.

Let us now consider the case where a selected memory cell connected to the first bit line 1BL stores "1" data and a selected memory cell connected to the second bit line 2BL stores "0" data. In this case, it is only the first bit line 1BL and the second reference bit line DBL2 that memory cells turned on are connected to. For this reason, there are formed a path of a current flowing from the second bit line 2BL to the first bit line 1BL and the second reference bit line DBL2, and a path of a current flowing from the first reference bit line DBL1 to the first bit line 1BL and the second reference bit line DBL2. The relationship between the second bit line 2BL and the first bit line 1BL and the second reference bit line DBL2, and the relationship between the first reference bit line DBL1 and the first bit line 1BL and the second reference bit line DBL2 are electrically equal to each other. As a result, a current flowing from the second bit line 2BL to the first bit line 1BL and the second reference bit line DBL2, and a current flowing from the first reference bit line DBL1 to the first bit line 1BL and the second reference bit line DBL2 are equal to each other. Since a current flowing into the first bit line 1BL and a current flowing into the second reference bit line DBL2 have values equal to each other, the potential on the first bit line 1BL and the potential on the second reference bit line DBL2 are equal to each other. Namely, since there is no possibility that the potential on the first bit line 1BL to which a selected memory cell in which "1" data is stored is connected becomes higher than the potential on the second reference bit line DBL2, data sense speed does not become slow. Further, since a current flowing out from the second bit line 2BL and a current flowing out from the first reference bit line DBL1 have values equal to each other, the potential on the second bit line 2BL and the potential on the first reference bit line DBL1 are equal to each other. Namely, since there is no possibility that the potential on the second bit line 2BL to which a selected memory cell in which "0" data is stored is connected becomes lower than the potential on the first reference bit line DBL1, the data sense speed does not become slow.

Where a selected memory cell connected to the first bit line 1BL stores "0" data and a selected memory cell connected to the second bit line 2BL stores "1" data, data sense speeds do not both become slow in the same manner.

As stated above, by employing an equalization method as shown in FIG. 37(1), irrespective of whether data stored in the memory cell is "0" or "1", data sense speed does not become slow.

The method of performing an equalizing operation as shown in FIG. 37(2) will now be described.

Initially, let consider the case where a selected memory cell connected to the first bit line 1BL and a selected memory cell connected to the second bit line 2BL both store "0" data. This case corresponds to the case where the path of C is omitted from FIG. 37(1-0). In this case, potentials on the first bit line 1BL, the second bit line 2BL, and the first reference bit line DBL1 are equal to each other. Since there is no possibility that the potentials on the first and second bit lines 1BL and 2BL become lower than the potential on the first reference bit line DBL1, data sense speed does not become slow.

Let us now consider the case where a selected memory cell connected to the first bit line 1BL and a selected memory cell connected to the second bit line 2BL both store "1" data. This case corresponds to the case where the path of F is omitted from FIG. 37(1-1). In this case, potentials on the first bit line 1BL, the second bit line 2BL, and the second reference bit line DBL2 are equal to each other. Since there is no possibility that the potential on the first bit line 1BL and the potential on the second bit line 2BL become higher than the potential on the second reference bit line DBL2, data sense speed does not become slow.

Let us now consider the case where a selected memory cell connected to the first bit line 1BL stores "1" data and a selected memory cell connected to the second bit line 2BL stores "0" data. In this case, a current flows from the first reference bit line DBL1 to the first bit line 1BL. Further, a current flows from the first reference bit line DBL1 and the second bit line 2BL to the second reference bit line DBL2. As a result, the potential on the first bit line 1BL to which a selected memory cell in which "1" data is stored is connected becomes lower than the potential on the second reference bit line DBL2. As previously described, in the case of reading "1" data, when the potential on the bit line is lower than that on he second reference bit line, the read margin is still more improved. Further, a current flows from the second bit line 2BL to the second reference bit line DBL2. In addition, a current flows from the first bit line 1BL to the second reference bit line DBL2 and the first bit line 1BL. As a result, the potential on the second bit line 2BL to which a selected memory cell in which "0" data is stored is connected becomes higher than the potential on the first reference bit line DBL1. As previously described, in the case of reading "0" data, when the potential on the bit line is higher than that on the first reference bit line, the read margin is still more improved. Where a selected memory cell connected to the first bit line 1BL stores "0" data and a selected memory cell connected to the second bit line 2BL stores "1" data, the read margins are both improved in the same manner.

As described above, by employing an equalization method as shown in FIG. 37(2), irrespective of whether data stored in the memory cell is "0" or "1", data sense speed does not become slow.

The case of FIG. 37(3) will now be described.

Let us consider the case where a selected memory cell connected to the first bit line 1BL and a selected memory cell connected to the second bit line 2BL both store "0" data. This case corresponds to the case where the path of A is omitted from the diagram of FIG. 37(1-0). In this case, potentials on the first bit line 1BL, the second bit line 2BL, and the second reference bit line DBL2 are equal to each other. Since there is no possibility that the potential on the first bit line 1BL and the potential on the second bit line 2BL become lower than the potential on the first bit line DBL1, data sense speed does not become slow.

Let us consider the case where a selected memory cell connected to the first bit line 1BL and a selected memory connected to the second bit line 2BL both store "1" data. In this case, a current flows from the first reference bit line DBL1 to the second bit line 2BL and the second reference bit line DBL2. On the contrary, no current directly flows from the first reference bit line DBL1 to the first bit line 1BL. As a result, the potential on the second bit line 2BL is equal to the potential on the second reference bit line DBL2, and the potential on the first bit line 1BL becomes lower than the potential on the second reference bit line DBL2. Accordingly, for the previously described reason, the read margin is improved.

Let us consider the case where a selected memory cell connected to the first bit line 1BL stores "1" data and a selected memory cell connected to the second bit line 2BL stores "0" data. In this case, a current flows from the first reference bit line DBL1 to the first bit line 1BL. Further, a current flows from the first reference bit line DBL1 and the second bit line 2BL to the second reference bit line DBL2. As a result, the potential on the first bit line 1BL to which a selected memory cell in which "1" data is stored is connected becomes lower than the potential on the second reference bit line DBL2. Accordingly, for the previously described reason, the read margin is improved. Further, a current flows from the second bit line 2BL to the second reference bit line DBL2 and the first bit line 1BL. In addition, a current flows from the first reference bit line DBL1 to the second reference bit line DBL2. As a result, the potential on the second bit line 2BL to which a selected memory cell in which "0" data is stored is connected becomes lower than the potential on the first reference bit line DBL1. In this case, for the previously described reason, the readout operation becomes active in a direction where there is less read margin.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. Further, a current flows from the first reference bit line DBL1 to the second bit line 2BL and the second reference bit line DBL2. As a result, the potential on the first bit line 1BL to which a selected memory cell in which "0" data is stored is connected is equal to the potential on the first reference bit line DBL1. For the previously described reason, data sense speed does not become slow. Further, a current flows from the first bit line 1BL and the first reference bit line DBL1 to the second bit line 2BL. In addition, a current flows from the first bit line 1BL and the first reference bit line DBL1 to the second reference bit line DBL2. As a result, the potential on the second bit line 2BL to which a selected memory cell in which "1" data is stored is connected is equal to the potential on the second reference bit line DBL2. For the previously described reason, data sense speed does not become slow.

The case of FIG. 37(4) will now be described.

Let us consider the case where a selected memory cell connected to the first bit line 1BL and a selected memory cell connected to the second bit line 2BL both store "0" data. In this case, a current flows from the second bit line 2BL and the first reference bit line DBL1 to the second reference bit line DBL2, but no current directly flows from the first bit line 1BL to the second reference bit line DBL2. For this reason, the potential on the second bit line 2BL is equal to the potential on the first reference bit line DBL1, whereas the potential on the first bit line 1BL becomes higher than the potential on the second reference bit line DBL2. Accordingly, for the previously described, the read margin is improved.

Let us consider the case where a selected memory cell connected to the first bit line 1BL and a selected memory cell connected to the second bit line 2BL both store "1" data. This case corresponds to the case where the path of D is omitted from FIG. 37(1-1) wherein potentials on the first and second bit lines 1BL and 2BL, and the second reference bit line DBL2 are equal to each other. Since there is no possibility that the potential on the first bit line 1BL and the potential on the second bit line 2BL become higher than the potential on the second reference bit line DBL2, data sense speed does not become slow.

Let us consider the case where a selected memory cell connected to the first bit line 1BL stores "1" data and a selected memory cell connected to the second bit line 2BL stores "0" data. In this case, a current flows from the second bit line 2BL and the first reference bit line DBL1 to the first bit line 1BL. Further, a current flows from the second bit line 2BL and the first reference bit line DBL1 also to the second reference bit line DBL2. For this reason, the potential on the first bit line 1BL and the potential on the second reference bit line DBL2 are equal to each other. For the previously described reason, data sense speed does not become slow. Further, a current flows from the second bit line 2BL to the first bit line 1BL and the second reference bit line DBL2, and a current flows also from the first reference bit line DBL1 to the first bit line 1BL and the second reference bit line DBL2. As a result, the potential on the second bit line 2BL to which a selected memory cell in which "0" data is stored is connected is equal to the potential on the first reference bit line DBL1. For the previously described reason, data sense speed does not become slow.

Let us consider the case where a selected memory cell connected to first bit line 1BL stores "0" data and a selected memory cell connected to the second bit line 2BL stores "1" data. In this case, a current flows from the first bit line 1BL to the second bit line 2BL, and a current flows from the first reference bit line DBL1 to the second bit line 2BL and the second reference bit line DBL2. As a result, the potential on the first bit line 1BL becomes higher than the potential on the first reference bit line DBL1. Accordingly, for previously described reason, the read margin is improved. Further, a current flows from the first bit line 1BL and the first reference bit line DBL1 to the second bit line 2BL, and a current flows from the first reference bit line DBL1 to the second reference bit line DBL2. As a result, the potential on the second bit line 2BL becomes higher than the potential on the second reference bit line DBL2. Accordingly, for the previously described reason, the readout operation becomes active in a direction where there is less read margin.

The case of FIG. 37(5) will now be described.

Let us consider the case where a selected memory cell connected to the first bit line 1BL and a memory cell connected to the second bit line 2BL both store "0" data. In this case, a current flows from the first and second bit lines 1BL and 2BL to the second reference bit line DBL2, but no current flows from the first reference bit line DBL1 directly to the second reference bit line DBL2. As a result, the potential on the first bit line 1BL and the potential on the second bit line 2BL becomes lower than the potential on the first reference bit line DBL1. Accordingly, for previously described reason, the readout operation becomes active in a direction where there is less read margin.

Let us consider the case where a selected memory cell connected to the first bit line 1BL and a selected memory cell connected to the second bit line 2BL both store "1" data. In this case, a current flows from the first reference bit line DBL1 to the first and second bit lines 1BL and 2BL, but no current flows directly from the first reference bit line DBL1 to the second reference bit line DBL2. As a result, the potential on the first bit line 1BL and the potential on the second bit line 2BL become higher than the potential on the second reference bit line DBL2. Accordingly, for the previously described reason, the readout operation becomes active in a direction where there is less read margin.

Let us consider the case where a selected memory cell connected to the first bit line 1BL stores "1" data and a selected memory cell connected to the second bit line 2BL stores "0" data. In this case, a current flows from the first reference bit line DBL1 and the second bit line 2BL to the first bit line 1BL, but a current flows from the second reference bit line DBL2 only to the first reference bit line DBL1. As a result, the potential on the first bit line 1BL to which a memory cell in which "1" data is stored is connected becomes higher than the potential on the second reference bit line DBL2. Accordingly, for the previously described reason, the readout operation becomes active in a direction where there is less read margin. Further, a current flows from the second bit line 2BL to the second reference bit line DBL2 and the first bit line 1BL. On the other hand, a current flows from the first reference bit line DBL1 only to the first bit line 1BL. As a result, the potential on the second bit line 2BL to which a selected memory cell in which "0" data is stored is connected becomes lower than the potential on the first reference bit line DBL1. Accordingly, for the previously described reason, the readout operation becomes active in a direction where there is less read margin in this case.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. Further, a current flows also from the first reference bit line DBL1 to the second bit line 2BL. As a result, the potential on the first bit line 1BL to which a selected memory cell in which "0" data is stored is connected becomes lower than the potential on the first bit line 1BL. For the previously described reason, the readout operation becomes active in a direction where there is less read margin. Further, a current flows from the first bit line 1BL and the first reference bit line DBL1 to the second bit line 2BL. Further, a current flows only from the first bit line 1BL to the second reference bit line DBL2. As a result, the potential on the second bit line 2BL to which a selected memory cell in which "1" data is stored becomes lower than the potential on the second reference bit line DBL2. For the previously described reason, the readout operation becomes active in a direction where there is less read margin.

The case of FIG. 37(6) will now be described.

Let us consider the case where a selected memory cell connected to the first bit line 1BL and a selected memory cell connected to the second bit line 2BL both store "0" data. In this case, a current flows from the second reference bit line DBL2 to the first bit line 1BL and the first reference bit line DBL1. However, no current flows from the second bit line 2BL to the second reference bit line DBL2. As a result, the potential on the first bit line 1BL and the potential on the first reference bit line DBL1 are equal to each other, and the potential on the second bit line 2BL becomes higher than the potential on the first reference bit line DBL1. Accordingly, for the previously described reason, the data sense speed does not become slow in connection with the first and second bit lines 1BL and 2BL in this case.

Let us consider the case where a selected memory cell connected to the first bit line 1BL and a selected memory cell connected to the second bit line 2BL both store "1" data. In this case, a current flows from the first reference bit line DBL1 to the second bit line 2BL and the second reference bit line DBL2, but no current flows directly from the first reference bit line DBL1 to the first bit line 1BL. As a result, the potential on the first bit line 1BL becomes lower than the potential on the second reference bit line DBL2, and the potential on the second bit line 2BL is equal to the second reference bit line DBL2. Accordingly, for the previously described reason, since the read margin is improved, data sense speed does not become slow in connection with both the first bit line 1BL and the second bit line 2BL in this case.

Let us consider the case where a selected memory cell connected to the first bit line 1BL stores "1" data, and a selected memory cell connected to the second bit line 2BL stores "0" data. In this case, a current flows from the second bit line 2BL to the first bit line 1BL, and a current flows from the first bit line 1BL to the second reference bit line DBL2. As a result, the potential on the first bit line 1BL to which a selected memory cell in which "1" data is stored is connected is equal to the potential on the second reference bit line DBL2. Thus, the data sense speed does not become slow. Further, a current flows from the second bit line 2BL to the first bit line 1BL, and a current flows from the first reference bit line DBL1 to the second reference bit line DBL2. As a result, the potential on the second bit line 2BL to which a selected memory cell in which "0" data is stored is connected is equal to the potential on the first reference bit line DBL1. Thus, the data sense speed does not become slow.

Let us consider the case where a selected memory cell connected to the first bit line 1BL stores "0" data, and a selected memory cell connected to the second bit line 2BL stores "1" data. In this case, a current flows from the first bit line 1BL to the second bit line 2BL and the second reference bit line DBL2, and a current flows also from the first reference bit line DBL1 to the second bit line 2BL and the second reference bit line DBL2. As a result, the potential on the first bit line 1BL to which a selected memory cell in which "0" data is stored is connected is equal to the potential on the first reference bit line DBL1. Thus, the data sense speed does not become slow. Further, a current flows from the first bit line 1BL and the first reference bit line DBL1 to the second bit line 2BL, and a current flows from the first bit line 1BL and the first reference bit line DBL1 also to the second reference bit line DBL2. For this reason, the potential on the second bit line 2BL to which "1" data is stored is connected is equal to the potential on the second reference bit line DBL2. Thus, the data sense speed does not become slow.

As described above, by employing an equalization method as shown in FIG. 37(6), irrespective of whether data stored in the memory cell is "0" or "1", the data sense speed does not become slow.

The case of FIG. 37(7) will now be described.

Let us consider the case where a selected memory cell connected to the first bit line 1BL and a selected memory cell connected to the second bit line 2BL both store "0" data. This case corresponds to the case where the paths of B and C are omitted from the diagram of FIG. 37(1-0). In this case, since potentials on the first bit line 1BL, the second bit line 2BL, and the first reference bit line DBL1 are equal to each other. Accordingly, data sense speed does not become slow.

Let us consider the case where a selected memory cell connected to the first bit line 1BL and a selected memory connected to the second bit line 2BL both store "1" data. In this case, a current flows from the first reference bit line DBL1 to the first bit line 1BL and the second reference bit line DBL2. On the contrary, no current directly flows from the first reference bit line DBL1 to the second bit line 2BL. As a result, the potential on the second bit line 2BL becomes lower than the potential on the second reference bit line DBL2. Accordingly, for the previously described reason, the read margin is improved so that data sense speed does not become slow. However, when the potentials on the first bit line 1BL and the second reference bit line DBL2, a current flows from the second reference bit line DBL2 to the second bit line 2BL, and no current flows from the first bit line 1BL to the second bit line 2BL directly. Accordingly, the readout operation becomes active in a direction where there is less read margin.

Let us consider the case where a selected memory cell connected to the first bit line 1BL stores "1" data and a selected memory cell connected to the second bit line 2BL stores "0" data. In this case, a current flows from the first reference bit line DBL1 to the first bit line 1BL. Further, a current flows from the first reference bit line DBL1 and the second bit line 2BL to the second reference bit line DBL2. As a result, the potential on the first bit line 1BL to which a selected memory cell in which "1" data is stored is connected becomes lower than the potential on the second reference bit line DBL2. Accordingly, for the previously described reason, the read margin is improved and data sense speed does not become slow. Further, a current flows from the second bit line 2BL to the second reference bit line DBL2 and from the first reference bit line DBL1 to the second reference bit line DBL2 and the first bit line 1BL. As a result, the potential on the second bit line 2BL to which a selected memory cell in which "0" data is stored is connected becomes higher than the potential on the first reference bit line DBL1. In this case, for the previously described reason, the data sense speed does not become slow.

Let us consider the case where a selected memory cell connected to the first bit line 1BL stores "0" data and a selected memory cell connected to the second bit line 2BL stores "1" data. In this case, a current flows from the first bit line 1BL to the second reference bit line DBL2. Further, a current also flows from the first reference bit line DBL1 to the second reference bit line DBL2. As a result, the potential on the first bit line 1BL to which a selected memory cell in which "0" data is stored is connected is equal to the potential on the first reference bit line DBL1. Accordingly, data sense speed does not become slow. Further, a current flows from the first bit line 1BL and the first reference bit line DBL1 to the second bit line 2BL, but for the previously described reason, no current directly flows from the first bit line 1BL and the first reference bit line DBL1 to the second reference bit line 2BL. As a result, the potential on the second bit line 2BL to which a selected memory cell in which "1" data is stored is connected becomes lower than the potential on the second reference bit line DBL2. For the previously described reason, data sense speed does not become slow.

The case of FIG. 37(8) will now be described.

Let us consider the case where a selected memory cell connected to the first bit line 1BL and a selected memory cell connected to the second bit line 2BL both store "0" data. In this case, a current flows from the first bit line 1BL and the first reference bit line DBL1 to the second reference bit line DBL2, but a current flows from the second bit line 1BL to the first bit line 1BL when its potential becomes lower. For this reason, the potential on the first bit line 1BL is higher than the potential on the first reference bit line DBL1. Further since the potential on the second bit line 2BL is higher than the potential on the first bit line 1BL, the potential on the second bit line 2BL becomes higher than the potential on the first reference bit line DBL1. Accordingly, for the previously described reason, the read margin is improved and data sense speed does not become slow.

Let us consider the case where a selected memory cell connected to the first bit line 1BL and a selected memory cell connected to the second bit line 2BL both store "1" data. In this case, a current flows from the second bit line 2BL and the first reference bit line DBL1 to the first bit line 1BL and also a current flows from the first reference bit line to the second reference bit line DBL2. As a result, the potential on the first bit line 1BL to which a selected memory cell in which "1" data is stored is connected becomes higher than the potential on the second reference bit line DBL2. As previously described, the readout operation becomes active in a direction where there is less read margin. Further, a current flows from the second bit line 2BL to the first bit line 1BL and the second reference bit line DBL2. In addition, a current flows from the first reference bit line DBL1 to the second reference bit line DBL2 and the first bit line 1BL. As a result, the potential on the second bit line 2BL to which a selected memory cell in which "0" data is stored is connected becomes higher than the potential on the first reference bit line DBL1. As previously described, the read margin is still more improved and data sense speed does not become slow.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. Further, a current flows from the first reference bit line DBL1 to the second reference bit line DBL2. For this reason, the potential on the first bit line 1BL to which a selected memory cell in which "0" data is stored is connected becomes lower than the potential on the first reference bit line DBL1. For the previously described reason, the readout operation becomes active in a direction where there is less read margin. Further, a current flows from the first bit line 1BL to the second bit line 2BL, and a current flows also from the first bit line 1BL and the first reference bit line DBL1 to the second reference bit line DBL2. As a result, the potential on the second bit line 2BL to which a selected memory cell in which "0" data is stored is connected becomes lower than the potential on the second reference bit line DBL2. For the previously described reason, the read margin is improved and data sense speed does not become slow.

The case of FIG. 37(9) will now be described.

Let us consider the case where a selected memory cell connected to the first bit line 1BL and a memory cell connected to the second bit line 2BL both store "0" data. In this case, a current flows from the first reference bit line DBL1 to the second reference bit line DBL2, but no current flows from the first bit line 1BL and the second bit line 2BL directly to the second reference bit line DBL2. As a result, the potential on the first bit line 1BL and the potential on the second bit line 2BL becomes higher than the potential on the first reference bit line DBL1. Accordingly, for previously described reason, the readout margin is improved and data sense speed does not become slow.

Let us now consider the case where a selected memory cell connected to the first bit line 1BL and a selected memory cell connected to the second bit line 2BL both store "1" data. This case corresponds to the case where the paths of D and E are omitted from FIG. 37(1-1). In this case, since potentials on the first bit line 1BL, the second bit line 2BL, and the second reference bit line DBL2 are equal to each other, data sense speed does not become slow.

Let us now consider the case where a selected memory cell connected to the first bit line 1BL stores "1" data and a selected memory cell connected to the second bit line 2BL stores "0" data. In this case, a current flows from the first reference bit line DBL1 and the second bit line 2BL to the first bit line 1BL, and a current flows from the first reference bit line DBL1 to the second reference bit line DBL2. As a result, the potential on the first bit line 1BL to which a memory cell in which "1" data is stored is connected becomes higher than the potential on the second reference bit line DBL2. Accordingly, for the previously described reason, the readout operation becomes active in a direction where there is no read margin. Further, a current slows from the second bit line 2BL to the first reference bit line DBL1. On the other hand, a current flows from the first reference bit line DBL1 to the first bit line 1BL and the second reference bit line DBL2. As a result, the potential on the second bit line 2BL to which a selected memory cell in which "0" data is stored is connected becomes higher than the potential on the first reference bit line DBL1. Accordingly, for previously described reason, the readout margin is improved and data sense speed does not become slow.

Let us consider the case where a selected memory cell connected to first bit line 1BL stores "0" data and a selected memory cell connected to the second bit line 2BL stores "1" data. In this case, a current flows from the first bit line 1BL to the second bit line 2BL, and a current flows from the first reference bit line DBL1 to the second bit line 2BL and the second reference bit line DBL2. As a result, the potential on the first bit line 1BL to which a selected memory cell in which "0" data is stored is connected becomes higher than the potential on the first reference bit line DBL1. Accordingly, for previously described reason, the read margin is improved and data sense speed does not become slow. Further, a current flows from the first bit line 1BL and the first reference bit line DBL1 to the second bit line 2BL, and a current flows from the first reference bit line DBL1 to the second reference bit line DBL2. As a result, the potential on the second bit line 2BL to which a selected memory cell in which "1" data is stored is connected becomes higher than the potential on the second reference bit line DBL2. Accordingly, for the previously described reason, the readout operation becomes active in a direction where there is no read margin.

The case of FIG. 37(10) will now be described.

Let us consider the case where a selected memory cell connected to the first bit line 1BL and a memory cell connected to the second bit line 2BL both store "0" data. In this case, a current flows from the first bit line 1BL to the second reference bit line DBL2, but no current flows from the first reference bit line DBL1 and the second bit line 2BL directly to the second reference bit line DBL2. As a result, the potential on the first bit line 1BL becomes lower than the potential on the first reference bit line DBL1. Accordingly, for previously described reason, the readout operation becomes active in a direction where there is no read margin. Since potential on the second bit line 2BL is equal to the potential on the second reference bit line DBL2, data sense speed does not become slow.

Let us consider the case where a selected memory cell connected to the first bit line 1BL and a selected memory cell connected to the second bit line 2BL both store "1" data. In this case, a current flows from the first reference bit line DBL1 to the first and second bit lines 1BL and 2BL, but no current flows directly from the first reference bit line DBL1 to the second reference bit line DBL2. As a result, the potential on the first bit line 1BL and the potential on the second bit line 2BL become higher than the potential on the second reference bit line DBL2. Accordingly, for the previously described reason, the readout operation on both the first and second bit lines 1BL and 2BL becomes active in a direction where there is less read margin.

Let us consider the case where a selected memory cell connected to the first bit line 1BL stores "1" data and a selected memory cell connected to the second bit line 2BL stores "0" data. In this case, a current flows from the first reference bit line DBL1 and the second bit line 2BL to the first bit line 1BL, but no current flows from the second bit line 2BL and the first reference bit line DBL1 to the second reference bit line DBL2. As a result, the potential on the first bit line 1BL to which a memory cell in which "1" data is stored is connected becomes higher than the potential on the second reference bit line DBL2. Accordingly, for the previously described reason, the readout operation becomes active in a direction where there is no read margin. Further, a current flows from the second bit line 2BL to the first bit line 1BL. On the other hand, a current also flows from the first reference bit line DBL1 to the first bit line 1BL. As a result, the potential on the second bit line 2BL to which a selected memory cell in which "0" data is equal to the potential on the first reference bit line DBL1. Accordingly, data sense speed does not become slow.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. Further, a current also flows from the first reference bit line DBL1 to the second bit line 2BL. As a result, the potential on the first bit line 1BL to which a selected memory cell in which "0" data is stored is connected becomes lower than the potential on the first reference bit line DBL1. Further, a current flows from the first bit line 1BL to the second reference bit line DBL2. As a result, the potential on the second bit line 2BL to which a selected memory cell in which "1" data is stored is connected becomes higher than the potential on the second reference bit line DBL2. For the previously described reason, the readout operation becomes active in a direction where there is less read margin.

The case of FIG. 37(11) will now be described.

Let us consider the case where a selected memory cell connected to the first bit line 1BL and a selected memory cell connected to the second bit line 2BL both store "0" data. In this case, a current flows from the first bit line 1BL and the first reference bit line DBL1 to the second bit line 2BL. However, a current flows from the second bit line 2BL to the first reference bit line DBL1 when the potential thereof becomes low. As a result, the potential on the first bit line 1BL becomes lower than the potential on the first reference bit line DBL1. Accordingly, for the previously described reason, the readout operation becomes active in a direction where there is no read margin. On the other hand, since the potential on the second bit line 2BL is higher than the potential on the first reference bit line DBL1, read margin is improved and data sense speed does not become slow.

Let us consider the case where a selected memory cell connected to the first bit line 1BL and a selected memory cell connected to the second bit line 2BL both store "1" data. This case corresponds to the case where the paths of E and F are omitted from FIG. 37(1-1) wherein potentials on the first and second bit lines 1BL and 2BL, and the second reference bit line DBL2 are equal to each other. In this case, data sense speed does not become slow.

Let us consider the case where a selected memory cell connected to the first bit line 1BL stores "1" data and a selected memory cell connected to the second bit line 2BL stores "0" data. In this case, a current flows from the first reference bit line DBL1 to the first bit line 1BL. Further, a current also flows from the first reference bit line DBL1 to the second reference bit line DBL2. As a result, the potential on the first bit line 1BL to which the selected memory cell in which "1" data is stored is connected and the potential on the second reference bit line DBL2 are equal to each other so that data sense speed does not become slow. Further, a current flows from the first reference bit line DBL1 to the first bit line 1BL and the second reference bit line DBL2. However, no current flows directly from the second bit line 2BL to the first bit line 1BL and the second reference bit line DBL2. As a result, the potential on the second bit line 2BL to which a selected memory cell in which "0" data is stored is connected becomes higher than the potential on the first reference bit line DBL1. Accordingly, for the previously described reason, read margin is improved and data sense speed does not become slow.

Let us consider the case where a selected memory cell connected to first bit line 1BL stores "0" data and a selected memory cell connected to the second bit line 2BL stores "1" data. In this case, a current flows from the first bit line 1BL to the second reference bit line DBL2, and a current flows from the first reference bit line DBL1 to the second bit line 2BL and the second reference bit line DBL2. As a result, the potential on the first bit line 1BL to which the selected memory cell in which "0" data is stored is connected becomes higher than the potential on the first reference bit line DBL1. Accordingly, for previously described reason, the read margin is improved and data sense speed does not become slow. Further, a current flows from the first reference bit line DBL1 to the second bit line 2BL, and a current flows from the first bit line 1BL and the first reference bit line DBL1 to the second reference bit line DBL2. As a result, the potential on the second bit line 2BL to which the selected cell in which "1" data is stored is connected becomes lower than the potential on the second reference bit line DBL2. Accordingly, for the previously described reason, the read margin is improved and data sense speed does not become slow.

The case of FIG. 37(12) will now be described.

Let us consider the case where a selected memory cell connected to the first bit line 1BL and a memory cell connected to the second bit line 2BL both store "0" data. In this case, a current flows from the first and second bit lines 1BL and 2BL to the second reference bit line DBL2, but no current flows from the first reference bit line DBL1 directly to the second reference bit line DBL2. As a result, the potential on the first bit line 1BL and the potential on the second bit line 2BL become lower than the potential on the first reference bit line DBL1. Accordingly, for previously described reason, as to both the first bit line 1BL and the second bit line 2BL, the readout operation becomes active in a direction where there is less read margin.

Let us consider the case where a selected memory cell connected to the first bit line 1BL and a selected memory cell connected to the second bit line 2BL both store "1" data. In this case, a current flows from the first reference bit line DBL1 to the first and second bit lines 1BL and 2BL, but no current flows directly from the first reference bit line DBL1 to the second reference bit line DBL2. As a result, the potential on the first bit line 1BL and the potential on the second bit line 2BL become higher than the potential on the second reference bit line DBL2. Accordingly, for the previously described reason, as to both the first bit line 1BL and the second bit line 2BL, the readout operation becomes active in a direction where there is less read margin.

Let us consider the case where a selected memory cell connected to the first bit line 1BL stores "1" data and a selected memory cell connected to the second bit line 2BL stores "0" data. In this case, a current flows from the first reference bit line DBL1 to the first bit line 1BL, and a current flows from the second bit line 2BL to the second reference bit line DBL2. As a result, the potential on the first bit line 1BL to which a memory cell in which "1" data is stored is connected becomes equal to the potential on the second reference bit line DBL2. Accordingly, data sense speed does not become slow. Further, a current flows from the first reference bit line DBL1 to the first bit line 1BL and a current flows from the second bit line 2BL to the second reference bit line DBL2. As a result, the potential on the second bit line 2BL to which a selected memory cell in which "0" data is stored is connected is equal to the potential on the first reference bit line DBL1. Accordingly, data sense speed does not become slow.

Let us consider the case where a selected memory cell connected to the first bit line 1BL stores "0" data and a selected memory cell connected to the second bit line 2BL stores "1" data. In this case, a current flows from the first bit line 1BL to the second reference bit line DBL2. Further, a current flows also from the first reference bit line DBL1 to the second bit line 2BL. As a result, the potential on the first bit line 1BL to which a selected memory cell in which "0" data is stored is connected is equal to the potential on the first reference bit line DBL1 Accordingly, data sense speed does not become slow. Further, a current flows from the first reference bit line DBL1 to the second bit line 2BL. Further, a current flows from the first bit line 1BL to the second reference bit line DBL2. As a result, the potential on the second bit line 2BL to which a selected memory cell in which "1" data is stored is equal to the potential on the second reference bit line DBL2. Accordingly, data sense speed does not become slow.

The case of FIG. 37(13) will now be described.

Let us consider the case where a selected memory cell connected to the first bit line 1BL and a selected memory cell connected to the second bit line 2BL both store "0" data. This case corresponds to the case where the paths of A and B are omitted from the diagram of FIG. 37(1-0). In this case, potentials on the first bit line 1BL, the second bit line 2BL, and the first reference bit line DBL1 are equal to each other. Accordingly, data sense speed does not become slow.

Let us consider the case where a selected memory cell connected to the first bit line 1BL and a selected memory connected to the second bit line 2BL both store "1" data. In this case, a current flows from the first reference bit line DBL1 to the second reference bit line DBL2. On the contrary, no current directly flows from the first reference bit line DBL1 to the first bit line 1BL and the second bit line 2BL. As a result, the potential on the first bit line 1BL and on the second bit line 2BL becomes lower than the potential on the second reference bit line DBL2. Accordingly, for the previously described reason, the the read margin is improved.

Let us consider the case where a selected memory cell connected to the first bit line 1BL stores "1" data and a selected memory cell connected to the second bit line 2BL stores "0" data. In this case, a current flows from the second reference bit line DBL2 to the first bit line 1BL. Further, a current flows from the first reference bit line DBL1 and the second bit line 2BL to the second reference bit line DBL2. As a result, the potential on the first bit line 1BL to which a selected memory cell in which "1" data is stored is connected becomes lower than the potential on the second reference bit line DBL2. Accordingly, for the previously described reason, the read margin is improved and data sense speed does not become slow. Further, a current flows from the second bit line 2BL to the second reference bit line DBL2 and the first bit line 1BL. In addition, a current flows from the first reference bit line to the second reference bit line DBL2. As a result, the potential on the second bit line 2BL to which a selected memory cell in which "0" data is stored is connected becomes lower than the potential on the first reference bit line DBL1. In this case, for the previously described reason, the readout operation becomes active in a direction where there is no read margin.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. Further, a current flows from the first reference bit line DBL1 to the second reference bit line DBL2. As a result, the potential on the first bit line 1BL to which a selected memory cell in which "0" data is stored is connected becomes lower than the potential on the first reference bit line DBL1. Accordingly, for the previously described reason, the readout operation becomes active in a direction where there is less read margin. Further, a current flows from the first bit line 1BL to the second bit line 2BL. In addition, a current flows from the first bit line 1BL and the first reference bit line DBL1 to the second reference bit line DBL2. As a result, the potential on the first bit line 1BL to which a selected memory cell in which "1" data is stored is connected becomes lower than the potential on the second reference bit line DBL2. For the previously described reason, data sense speed does not become slow.

The case of FIG. 37(14) will now be described.

Let us consider the case where a selected memory cell connected to the first bit line 1BL and a selected memory cell connected to the second bit line 2BL both store "0" data. In this case, a current flows from the first bit line 1BL and the second bit line 2BL to the second reference bit line DBL2, but no current directly flows from the first reference bit line DBL1 to the second reference bit line DBL2. As a result, the potential on the first bit line 1BL and the potential on the second bit line 2BL become lower than the potential on the first reference bit line DBL1. Accordingly, the readout operation becomes active in a direction where there is no read margin.

Let us consider the case where a selected memory cell connected to the first bit line 1BL and a selected memory cell connected to the second bit line 2BL both store "1" data. In this case, a current flows from the first reference bit line DBL1 to the second bit line 2BL, but no current flows directly from the first reference bit line DBL1 to the first bit line 1BL and the second reference bit line DBL2. As a result, the potential on the first bit line 1BL is equal to the potential on the second reference bit line DBL2. Accordingly, data sense speed does not become slow. However, the potential on the second bit line 2BL becomes higher than the potential on the second reference bit line DBL2. Accordingly, for the previously described reason, the readout operation becomes active in a direction where there is less read margin.

Let us consider the case where a selected memory cell connected to the first bit line 1BL stores "1" data and a selected memory cell connected to the second bit line 2BL stores "0" data. In this case, a current flows from the second bit line 2BL to the first bit line 1BL, and a current also flows from the second bit line 2BL to the second reference bit line DBL2. As a result, the potential on the first bit line 1BL to which a memory cell in which "1" data is stored is connected is equal to the potential on the second reference bit line DBL2. Accordingly, data sense speed does not become slow. Further, a current flows from the second bit line 2BL to the second reference bit line DBL2. On the other hand, no current flows from the first reference bit line DBL1 to the first bit line 1BL and the second reference bit line DBL2. As a result, the potential on the second bit line 2BL to which a selected memory cell in which "0" data is stored is connected becomes lower than the potential on the first reference bit line DBL1. Accordingly, for the previously described reason, the readout operation becomes active in a direction where there is less read margin in this case.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. Further, a current flows also from the first reference bit line DBL1 to the second bit line 2BL. As a result, the potential on the first bit line 1BL to which a selected memory cell in which "0" data is stored is connected becomes lower than the potential on the first reference bit line DBL1. For the previously described reason, the readout operation becomes active in a direction where there is less read margin. Further, a current flows from the first bit line 1BL and the first reference bit line DBL1 to the second bit line 2BL. Further, a current flows only from the first bit line 1BL to the second reference bit line DBL2. As a result, the potential on the second bit line 2BL to which a selected memory cell in which "1" data is stored becomes lower than the potential on the second reference bit line DBL2. For the previously described reason, the readout operation becomes active in a direction where there is less read margin.

The case of FIG. 37(15) will now be described.

Let us consider the case where a selected memory cell connected to the first bit line 1BL and a selected memory cell connected to the second bit line 2BL both store "0" data. In this case, no current flows from the first bit line 1BL and the second bit line 2BL to the second reference bit line DBL2. However, a current flows from the first reference bit line DBL1 to the second reference bit line DBL2. As a result, the potential on the first bit line 1BL and the potential on the second bit line 2BL becomes higher than the potential on the first reference bit line DBL1. Accordingly, for the previously described reason, the read margin is improved and the data sense speed does not become slow.

Let us consider the case where a selected memory cell connected to the first bit line 1BL and a selected memory cell connected to the second bit line 2BL both store "1" data. In this case, a current flows from the first reference bit line DBL1 into the first bit line 1BL, the second bit line 2BL and the second reference bit line DBL2, but no current flows directly from the first reference bit line DBL1. As a result, this case corresponds to the case where the paths of D, E and F are omitted from FIG. 37(1-1) wherein potentials on the first and second bit lines 1BL and 2BL, and the second reference bit line DBL2 are equal to each other. Accordingly, data sense speed does not become slow.

Let us consider the case where a selected memory cell connected to the first bit line 1BL stores "1" data and a selected memory cell connected to the second bit line 2BL stores "0" data. In this case, a current flows from the first reference bit line DBL1 to the first bit line 1BL and the second reference bit line DBL2. As a result, the potential on the first bit line 1BL to which a selected memory cell in which "1" data is stored is connected is equal to the potential on the second reference bit line DBL2. Further, a current flows from the first reference bit line DBL1 to the first bit line 1BL and the second reference bit line DBL2. However, no current flows from the second bit line 2BL to the first bit line 1BL and the second reference bit line DBL2. As a result, the potential on the second bit line 2BL to which a selected memory cell in which "0" data is stored is connected becomes higher than the potential on the first reference bit line DBL1. For the previously described reason, data sense speed does not become slow.

Let us consider the case where a selected memory cell connected to the first bit line 1BL stores "0" data and a selected memory cell connected to the second bit line 2BL stores "1" data. In this case, a current flows from the first reference bit line DBL1 to the first bit line 1BL and the second reference bit line DBL2. However, no current directly flows from the first bit line 1BL to the second bit line 2BL and the second reference bit line DBL2. As a result, the potential on the first bit line 1BL to which a selected memory cell in which "0" data is stored is connected becomes higher than the potential on the first reference bit line DBL1. Accordingly, for the previously described reason, the read margin is improved and data sense speed does not become slow. Further, a current flows from the second reference bit line DBL2 to the second bit line 2BL and the second reference bit line DBL2. As a result, the potential on the second bit line 2BL to which a selected memory cell in which "1" data is stored is connected is equal to the potential on the second reference bit line DBL2. Accordingly, data sense speed does not become slow.

As stated above, by employing an equalization method as shown in FIG. 37(15), irrespective of whether data stored in the memory cell is "0" or "1", data sense speed does not become slow.

The case of FIG. 37(16) will now be described.

Let us consider the case where a selected memory cell connected to the first bit line 1BL and a selected memory cell connected to the second bit line 2BL both store "0" data. This case corresponds to the case where the paths of A, B and C are omitted from the diagram of FIG. 37(1-0). In this case, potentials on the first bit line 1BL, the second bit line 2BL, and the first reference bit line DBL1 are equal to each other. Accordingly, data sense speed does not become slow.

Let us consider the case where a selected memory cell connected to the first bit line 1BL and a selected memory connected to the second bit line 2BL both store "1" data. In this case, a current flows from the first reference bit line DBL1 to the second reference bit line DBL2. On the contrary, no current directly flows from the first reference bit line DBL1 to the first bit line 1BL and the second bit line 2BL. As a result, the potentials on the first bit line 1BL and the second bit line 2BL become lower than the potential on the second reference bit line DBL2. Accordingly, for the previously described reason, the read margin is improved and the data sense speed does not become slow.

Let us consider the case where a selected memory cell connected to the first bit line 1BL stores "1" data and a selected memory cell connected to the second bit line 2BL stores "0" data. In this case, a current flows from the second bit line 2BL and the first reference bit line DBL1 to the second reference bit line DBL2. However, no current flows from the first reference bit line DBL1 and the second bit line 2BL to the first bit line 1BL. As a result, the potential on the first bit line 1BL to which a selected memory cell in which "1" data is stored is connected becomes lower than the potential on the second reference bit line DBL2. Accordingly, for the previously described reason, the read margin is improved and the data sense speed does not become slow. Further, a current flows from the second bit line 2BL and the first reference bit line DBL1 to the second reference bit line DBL2. As a result, the potential on the second bit line 2BL to which a selected memory cell in which "0" data is stored is connected is equal to the potential on the first reference bit line DBL1. In this case, for the previously described reason, the data sense speed does not become slow.

Let us consider the case where a selected memory cell connected to the first bit line 1BL stores "0" data and a selected memory cell connected to the second bit line 2BL stores "1" data. In this case, a current flows from the first bit line 1BL and the first reference bit line DBL1 to the second reference bit line DBL2. As a result, the potential on the first bit line 1BL to which a selected memory cell in which "0" data is stored is connected is equal to the potential on the first reference bit line DBL1. Further, a current flows from the first bit line 1BL and the first reference bit line DBL1 to the second reference bit line DBL2. However, no current flows from the first bit line 1BL and the first reference bit line DBL1 to the second bit line 2BL. As a result, the potential on the second bit line 2BL to which a selected memory cell in which "1" data is stored is connected becomes lower than the potential on the second reference bit line DBL2. Accordingly, for the previously described reason, data sense speed does not become slow.

As stated above, by employing an equalization method as shown in FIG. 37(16), irrespective of whether data stored in the memory cell is "0" or "1", data sense speed does not become slow.

The case of FIG. 37(17) will now be described.

Let us consider the case where a selected memory cell connected to the first bit line 1BL and a selected memory cell connected to the second bit line 2BL both store "0" data. In this case, a current flows from the first bit line 1BL and the first reference bit line DBL1 to the second reference bit line DBL2. Further, a current flows from the second bit line 2BL to the first reference bit line DBL1 when its potential becomes low. As a result, the potential on the first bit line 1BL becomes lower than the potential on the first reference bit line DBL1. Accordingly, for the previously described reason, the readout operation becomes active in a direction where there is less read margin. Further, the potential on the second bit line 2BL becomes higher than the potential on the first reference bit line DBL1. Accordingly, data sense speed does not become slow.

Let us consider the case where a selected memory cell connected to the first bit line 1BL and a selected memory cell connected to the second bit line 2BL both store "1" data. In this case, a current flows from the first reference bit line DBL1 to the second bit line 2BL and the second reference bit line DBL2. When the potential on the second reference bit line becomes high, a current flows from the second reference bit line DBL2 to the second bit line 2BL. As a result, the potential on the second bit line 2BL becomes higher than the potential on the second reference bit line DBL2. Accordingly, for the previously described reason, the readout operation becomes active in a direction where there is less read margin.

The potential on the first bit line 1BL becomes lower than the potential on the second reference line DBL2. Accordingly, data sense speed does not become slow.

Let us consider the case where a selected memory cell a selected memory cell connected to the second bit line 2BL stores "0" data. In this case, a current path where current flows from the second bit line 2BL, the first reference bit line DBL1, to the first bit line 1BL is formed. As a result, the potential on the first bit line 1BL to which a selected memory cell in which "1" data is stored is connected becomes lower than the potential on the second reference bit line DBL2. Accordingly, since the read margin is increased for the previously described reason, data sense speed does not become slow. Furthermore, since the second bit line 2BL is connected to the first reference bit line, the potential on the second bit line 2BL to which a selected memory cell in which "0" data is stored is connected becomes higher than the potential on the first reference bit line DBL1. Thus, for the previously described reason the data sense speed does not become slow.

Let us consider the case where a selected memory cell connected to the first bit line 1BL stores "0" data and a selected memory cell connected to the second bit line 2BL stores "1" data. In this case, a current flows from the first bit line 1BL to the second reference bit line DBL2 and from the first reference bit line DBL1 to the second reference bit line DBL2 and the second bit line 2BL. Further, a current flows also from the first reference bit line DBL1 to the second bit line 2BL. As a result, the potential on the first bit line 1BL to which a selected memory cell in which "0" data is stored is connected becomes higher than the potential on the first reference bit line DBL1. Accordingly, for the previously described reason, since the read margin is increased, the data sense speed does not become slow. Further, a current flows from the first reference bit line DBL1 to the second bit line 2BL. Further, a current flows from the first bit line 1BL and the first reference bit line DBL1 to the second reference bit line DBL2. As a result, the potential on the second bit line 2BL to which a selected memory cell in which "1" data is stored is connected becomes lower than the potential on the second reference bit line DBL2. For the previously described reason, since the read margin is increased the data sense speed does not become slow.

The case of FIG. 37(18) will now be described.

Let us consider the case where a selected memory cell connected to the first bit line 1BL and a selected memory cell connected to the second bit line 2BL both store "0" data. In this case, a current flows from the first bit line 1BL and the second bit line 2BL to the second reference bit line DBL2. However, no current flows from the first reference bit line DBL1 to the second reference bit line DBL2. As a result, the potential on the first bit line 1BL and the potential on the second bit line 2BL becomes lower than the potential on the first reference bit line DBL1. Accordingly, for the previously described reason, the readout operation becomes active in a direction where there is less read margin.

Let us consider the case where a selected memory cell connected to the first bit line 1BL and a selected memory cell connected to the second bit line 2BL both store "1" data. In this case, since the first reference bit line DBL1 is the only line to which an OFF state memory cell is connected, a current flows in the order of the first reference bit line DBL1, the second bit line 2BL, the second reference bit line DBL2 and the first bit line 1BL. Thus the potential on the second bit line 2BL becomes higher than the potential on the second reference bit line. Accordingly, for the previously described reason, the readout operation becomes active in a direction where there is less read margin. Since the potential on the first bit line 1BL is lower than the potential on the second reference bit line DBL2, data sense speed does not become slow.

Let us consider the case where a selected memory cell connected to the first bit line 1BL stores "1" data and a selected memory cell connected to the second bit line 2BL stores "0" data. In this case, a current path where a current flows from the first reference bit line DBL1, the second bit line 2BL, the second reference bit line 1BL and the first reference bit line 1BL is formed. Thus, the potential on the first bit line 1BL to which a selected memory cell in which "1" data is stored is connected becomes lower than the potential on the second reference bit line DBL2. Accordingly, for the previously described reason, since the read margin is improved, data sense speed does not become slow.

Furthermore, the potential on the second bit line 2BL to which a selected memory cell in which "0" data is stored is connected becomes lower than the potential on the first reference bit line DBL1. Accordingly, since the read margin is increased for the previously described reason, the readout operation becomes active in a direction where there is no read margin.

Let us consider the case where a selected memory cell connected to the first bit line 1BL stores "0" data and a selected memory connected to the second bit line 2BL stores "1" data. In this case, a current flows from the first bit line 1BL to the second reference bit line DBL2. As a result, the potential on the first bit line 1BL to which a selected memory cell storing "0" data is equal to the potential on the first reference bit line DBL1, data sense speed does not become slow. Further, a current flows from the first reference bit line DBL1 to the second bit line 2BL. In addition, a current flows from the first bit line 1BL to the second reference bit line DBL2. As a result, since the potential on the second bit line 2BL to which a selected memory cell in which "1" data is stored is connected is equal to the potential on the second reference bit line DBL2, data sense speed does not become slow.

The case of FIG. 37(19) will now be described.

Let us consider the case where a selected memory cell connected to the first bit line 1BL and a selected memory cell connected to the second bit line 2BL both store "0" data. In this case, since the second reference bit line DBL2 is the only line to which an ON state memory cell is connected, a current flows in the order of the second bit line, the first reference bit line DBL1, the first bit line 1BL and the second reference bit line DBL2. As a result, the potential on the first bit line 1BL becomes lower than the potential on the first reference bit line DBL1. Accordingly, since the read margin is increased for the previously described reason, the readout operation becomes active in a direction where there is less read margin. Since the potential on the second bit line 2BL is higher than the potential on the first reference bit line DBL1, the data sense speed does not become slow.

Let us consider the case where a selected memory cell connected to the first bit line 1BL and a selected memory cell connected to the second bit line 2BL both store "1" data. In this case, a current flows from the first reference bit line DBL1 to the first bit line 1BL and the second bit line 2BL. However, a current does not flow from the first reference bit line DBL1 to the second reference bit line DBL2. As a result, the potentials on the first bit line 1BL and the second bit line 2BL become higher than the potential on the second reference bit line DBL2. Accordingly, for the previously described reason, the readout operation becomes active in a direction where there is no read margin.

Let us consider the case where a selected memory cell connected to the first bit line 1BL stores "1" data, and a selected memory cell connected to the second bit line 2BL stores "0" data. In this case, a current path where a current flows in the order of the second bit line 2BL, the first reference bit line DBL1, the first bit line 1BL and the second reference bit line DBL2 is formed. As a result, the potential on the first bit line 1BL to which a selected memory cell in which "1" data is stored is connected becomes higher than the potential on the second reference bit line DBL2. Accordingly, the readout operation becomes active in a direction where there is less read margin. Furthermore, the potential on the second bit line 2BL to which a selected memory cell in which "0" data is stored is connected becomes higher than the potential on the first reference bit line DBL1. Thus, since the read margin is increased for the previously described reason, the data sense speed does not become slow.

Let us consider the case where a selected memory cell connected to first bit line 1BL stores "0" data and a selected memory cell connected to the second bit line 2BL stores "1" data. In this case, a current flows from the first bit line 1BL to the second bit line 2BL, and a current flows from the first reference bit line DBL1 to the second reference bit line DBL2. As a result, since the potential on the first bit line 1BL to which a selected memory cell in which "0" data is stored is connected is equal to the potential on the first reference bit line DBL1, data sense speed does not become slow. Further, a current flows from the first reference bit line DBL1 to the second bit line 2BL and from the first bit line 1BL also to the second reference bit line DBL2. As a result, since the potential on the second bit line 2BL to which a selected memory cell in which "1" data is stored is connected is equal to the potential on the second reference bit line DBL2, data sense speed does not become slow.

The case of FIG. 37(20) will now be described.

Let us consider the case where a selected memory cell connected to the first bit line 1BL and a selected memory cell connected to the second bit line 2BL both store "0" data. In this case, since the second reference bit line is the only line to which an ON state memory cell is connected, a current flows in the order of the first bit line 1BL, the second bit line 2BL, the first reference bit line DBL1 and the second reference bit line DBL2. Thus, the potential on the first bit line 1BL and the potential on the second bit line 2BL become higher than the potential on the first reference bit line DBL1. Accordingly, for the previously described reason, since the read margin is increased the data sense speed does not become slow.

Let us consider the case where a selected memory cell connected to the first bit line 1BL and a selected memory cell connected to the second bit line 2BL both store "1" data. In this case, a current flows from the first reference bit line DBL1 to the second bit line 2BL and the second reference bit line DBL2, and a current flows from the second bit line 2BL to the first bit line 1BL as the potential on the second bit line increases.

As a result, the potential on the second bit line 2BL becomes lower than the potential on the second reference bit line DBL2.

Furthermore, since a current flows from the first reference bit line DBL1 to the first bit line 1BL through the second bit line 2BL, the potential on the first bit line 1BL is lower than the potential on the second reference bit line DBL2. Thus, for the previously described reason, the data sense speed does not become slow on both bit lines.

Let us consider the case where a selected memory cell connected to the first bit line 1BL stores "1" data, and a selected memory cell connected to the second bit line 2BL stores "0" data. In this case, a current flows from the second bit line 2BL to the first bit line 1BL, and a current flows from the first reference bit line DBL1 to the second reference bit line DBL2. As a result, the potential on the first bit line 1BL to which a selected memory cell in which "1" data is stored is connected is equal to the potential on the second reference bit line DBL2. Thus, the data sense speed does not become slow. Further, a current flows from the second bit line 2BL to the first bit line 1BL, and a current flows from the first reference bit line DBL1 to the second reference bit line DBL2. As a result, the potential on the second bit line 1BL to which a selected memory cell in which "0" data is stored is connected is equal to the potential on the first reference bit line DBL1. Thus, the data sense speed does not become slow.

Let us consider the case where a selected memory cell connected to the first bit line 1BL stores "0" data, and a selected memory cell connected to the second bit line 2BL stores "1" data. In this case, a current flows from the first bit line 1BL to the second bit line 2BL, and a current flows also from the first reference bit line DBL1 to the second bit line 2BL and the second reference bit line DBL2.

As a result, the potential on the first bit line 1BL to which a selected memory cell in which "0" data is stored is connected is equal to the potential on the first reference bit line DBL1. Thus, the read margin increases, the data sense speed does not become slow. Furthermore, a current flows from the first bit line 1BL and the first reference bit line DBL1 to the second bit line 2BL, and a current flows from the first reference bit line DBL1 to the second reference bit line DBL2. As a result, the potential on the second bit line 2BL to which "1" data is stored is connected becomes higher than the potential on the second reference bit line DBL2. Accordingly, for previously described reason, the readout operation becomes active in a direction where there is no read margin.

The case of FIG. 37(21) will now be described.

Let us consider the case where a selected memory cell connected to the first bit line 1BL and a memory cell connected to the second bit line 2BL both store "0" data. In this case, since the second reference bit line DBL2 is only line to which an ON state memory cell is connected, a current flows in the order of the first reference bit lines DBL1, the second bit line 2BL, the first bit line 1BL and the second reference bit line DBL2. As a result, the potential on the first bit line 1BL and the potential on the second bit line 2BL becomes lower than the potential on the first reference bit line DBL1. Accordingly, for previously described reason, the readout operation becomes active in a direction where there is no read margin.

Let us consider the case where a selected memory cell connected to the first bit line 1BL and a selected memory cell connected to the second bit line 2BL both store "1" data. In this case, since the first reference bit line DBL1 is the only line to which an OFF state memory cell is connected, a current path where a current flows in the order of the first reference bit line DBL1, the second bit line 2BL, the first bit line 1BL and the second reference bit line DBL2 is formed. As a result, the potential on the first bit line 1BL and the potential on the second bit line 2BL become higher than the potential on the second reference bit line DBL2. Accordingly, for the previously described reason, the readout operation becomes active in a direction where there is no read margin.

Let us consider the case where a selected memory cell connected to the first bit line 1BL stores "1" data and a selected memory cell connected to the second bit line 2BL stores "0" data. In this case, a current path where a current flows in the order of the first reference bit line DBL1, the second bit line 2BL, the first bit line 1BL and the second reference bit line DBL2 is formed.

As a result, the potential on the first bit line 1BL to which a memory cell in which "1" data is stored is connected becomes higher than the potential on the second reference bit line DBL2. Accordingly, for the previously described reason, the readout operation becomes active in a direction where there is less read margin. Furthermore, since the second bit line 2BL is connected to the first reference bit line DBL1, the potential on the second bit line 2BL to which a memory cell in which "0" data is stored is connected becomes higher than the potential on the first reference bit line DBL1. Accordingly, for the previously described reason, the readout operation becomes active in a direction where there is no read margin.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. A current also flows from the first reference bit line DBL1 to the second bit line 2BL. As a result, the potential on the first bit line 1BL to which a selected memory cell in which "0" data is stored is connected becomes lower than the potential on the first reference bit line DBL1. For the previously described reason, the readout operation becomes active in a direction where there is no read margin. Furthermore, a current flows from the first bit line 1BL and the first reference bit line DBL1 to the second bit line 2BL. A current also flows from the first bit line 1BL to the second reference bit line DBL2. As a result, the potential on the second bit line 2BL to which a selected memory cell in which "1" data is stored becomes higher than the potential on the second reference bit line DBL2.

Accordingly, for the previously described reason, the readout operation becomes active in a direction where there is less read margin.

The case of FIG. 37(22) will now be described.

Let us consider the case where a selected memory cell connected to the first bit line 1BL and a selected memory cell connected to the second bit line 2BL both store "0" data. In this case, a current flows from first bit line 1BL and the first reference bit line DBL1 to the second reference bit line DBL2. However, a current flows from the second bit line 2BL to the first bit line 1BL when the potential thereof is lowered. As a result, the potential on the first bit line 1BL becomes higher than the potential on the first reference bit line DBL1. Furthermore, no current flows from the second bit line 2BL to the second reference bit line DBL2 directly. Thus the potential on the second bit line 2BL becomes higher than the potential on the first reference bit line DBL1. Accordingly, for the previously described reason, since the read margin is increased, the data sense speed does not become slow in connection with the first and second bit lines 1BL and 2BL.

Let us consider the case where a selected memory cell connected to the first bit line 1BL and a selected memory cell connected to the second bit line 2BL both store "1" data. In this case, since the first reference bit line is the only line to which an OFF state memory cell is connected, a current flows in the order of the first reference bit line DBL1, the second reference bit line DBL2, the first bit line 1BL and the second bit line 2BL. As a result, the potentials on the first bit line 1BL and the second bit line 2BL become lower than the potential on the second reference bit line DBL2. Accordingly, for the previously described reason, since the read margin is increased, data sense speed does not become slow in connection with both the first bit line 1BL and the second bit line 2BL in this case.

Let us consider the case where a selected memory cell connected to the first bit line 1BL stores "1" data, and a selected memory cell connected to the second bit line 2BL stores "0" data. In this case, a current flows from the second bit line 2BL to the first bit line 1BL, and a current flows from the first reference bit line DBL1 to the second reference bit line DBL2. As a result, the potential on the first bit line 1BL to which a selected memory cell in which "1" data is stored is connected is equal to the potential on the second reference bit line DBL2. Thus, the data sense speed does not become slow. Furthermore, a current flows from the second bit line 2BL to the first bit line 1BL, and a current flows from the first reference bit line DBL1 to the second reference bit line DBL2. As a result, the potential on the second bit line 2BL to which a selected memory cell in which "0" data is stored is connected is equal to the potential on the first reference bit line DBL1. Thus, the data sense speed does not become slow.

Let us consider the case where a selected memory cell connected to the first bit line 1BL stores "0" data, and a selected memory cell connected to the second bit line 2BL stores "1" data. In this case, a current flows from the first bit line 1BL to the second bit line 2BL and the second reference bit line DBL2. Further, a current flows from the first reference bit line DBL1 to the second reference bit line DBL2. As a result, the potential on the first bit line 1BL to which a selected memory cell in which "0" data is stored is connected becomes lower than the potential on the first reference bit line DBL1. Accordingly, for the previously described reason, the readout operation becomes active in a direction where there is less read margin. Further, a current flows from the first bit line 1BL to the second bit line 2BL. In addition, a current flows from the first bit line 1BL and the first reference bit line DBL1 to the second reference bit line DBL2. As a result, the potential on the second bit line 2BL to which a selected memory cell in which "1" data is stored is connected becomes lower than the potential on the second reference bit line DBL2.

Accordingly, for the previously described reason, data sense speed does not become slow.

The case of FIG. 37(23) will now be described.

Let us consider the case where a selected memory cell connected to the first bit line 1BL and a selected memory cell connected to the second bit line 2BL both store "0" data. In this case, a current flows from the first bit line 1BL to the second reference bit line DBL2, but no current directly flows from the second bit line 2BL and the first reference bit line DBL1 to the second reference bit line. As a result, the potential on the first bit line 1BL becomes lower than the potential on the first reference bit line DBL1. Accordingly, for the previously described reason, the readout operation becomes active in a direction where there is less read margin. Since the potential on the second bit line 2BL is equal to the potential on the first reference bit line DBL1, data sense speed does not become slow.

Let us consider the case where a selected memory cell connected to the first bit line 1BL and a selected memory cell connected to the second bit line 2BL both store "1" data. In this case, a current flows from the first reference bit line DBL1 to the first bit line 1BL, but no current flows directly from the first reference bit line DBL1 to the second bit line 2BL and the second reference bit line DBL2. As a result, the potential on the first bit line 1BL becomes higher than the potential on the second reference bit line DBL2. Accordingly, for the previously described reason, the readout operation becomes active in a direction where there is no read margin. Since the potential on the second bit line 2BL is equal to the potential on the second reference bit line DBL2, the data sense speed does not become slow.

Let us consider the case where a selected memory cell connected to the first bit line 1BL stores "1" data and a selected memory cell connected to the second bit line 2BL stores "0" data. In this case, a current flows from the first reference bit line DBL1 and the second bit line 2BL to the first bit line 1BL, but no current flows directly from the first bit line 1BL and the first reference bit line DBL1 to the second reference bit line DBL2. As a result, the potential on the first bit line 1BL to which a memory cell in which "1" data is stored is connected becomes higher than the potential on the second reference bit line DBL2. Accordingly, for the previously described reason, the readout operation becomes active in a direction where there is no read margin. Furthermore, a current flows from the second bit line 2BL and the first reference bit line DBL1 to the first bit line 1BL. As a result, the potential on the second bit line 2BL to which a selected memory cell in which "0" data is stored is connected is equal to the potential on the first reference bit line DBL1. Thus, data sense speed does not become slow in this case.

Let us consider the case where a selected memory cell connected to the first bit line 1BL stores "0" data and a selected memory cell connected to the second bit line 2BL stores "1" data. In this case, a current flows from the first bit line 1BL to the second bit line 2BL and the second reference bit line DBL2. But, no current flows from the first reference bit line DBL1 to the second bit line 2BL and the second reference bit line DBL2. As a result, the potential on the first bit line 1BL to which a selected memory cell in which "0" data is stored is connected becomes lower than the potential on the first reference bit line DBL1. Accordingly, for the previously described reason, the readout operation becomes active in a direction where there is no read margin. Furthermore, a current flows from the first bit line 1BL to the second reference bit line DBL2 and the second bit line 2BL. As a result, the potential on the second bit line 2BL to which a selected memory cell in which "1" data is stored is equal to the potential on the second reference bit line DBL2. Thus, data sense speed does not become slow in this case.

Summarizing the results obtained by conducting studies as described above, irrespective of how data is, the data sense speed does not become slow in the cases of FIGS. 37(1), (2), (6), (15) and (16).

Namely, in FIG. 37(1), the first bit line 1BL is equalized with the second bit line 2BL and the first and second reference bit lines DBL1 and DBL2; the second bit line 2BL is equalized with the first bit line 1BL and the first and second reference bit lines; the first reference bit line DBL1 is equalized with the first and second bit lines 1BL and 2BL and the second reference bit line DBL2; and the second reference bit line DBL2 is equalized with the first and second bit lines 1BL and 2BL and the first reference bit line DBL1. However, it is not required to evenly equalize the first and second bit lines 1BL and 2BL and the first and second reference bit lines DBL1 and DBL2 as shown in FIG.37(1). There occurs a difference between data sense speeds depending upon the kind of equalization methods. In practice, if the equalization time is set to a sufficiently large value, any difference based on the difference between the equalization methods as described above is not produced because potential differences every bit lines are very small. However, here is a need to shorten the equalization time in order to attain a high speed operation. In that case, there occurs a difference based on the difference between the equalization methods as stated above. Accordingly, it is desirable to adopt one of systems of (1), (2), (6), (15) and (16) as the equalization method. Even if the number of paths for equalizing operation is reduced as in these respective cases, a margin equal to that in the case of FIG. 37(1) can be ensured. Such an equalization method is effective when there is a need to reduce the number of transistors for the equalizing operation because of restricted pattern occupation area. Further, other equalization methods are conceivable except for the above. Such methods also have the same principle of operation as above.

Furthermore, it is not required that a set of transistors Q16, Q17, Q200, Q16', Q17' and Q200' and a set of transistors Q12, Q14, Q201, Q12', Q14' and Q201' both employ any one of systems of FIGS. 37(1), (2), (6), (15) and (16). Any one of these systems may be applied only to either of the above sets. In addition, a system obtained by suitably combining arbitrary different systems of those shown in FIGS. 37(1), (2), (6), (15) and (16) may be used for the respective sets.

An embodiment in which a memory device according to this invention is applied to a mask programmable ROM will now be described.

A mask programmable ROM is a memory device adapted to write data using a mask in the wafer process.

Generally, the mask programmable ROM is classified into NOR type ROM and NAND type ROM depending upon the circuit configuration of the memory cell array. The NOR type ROM is suitable for high speed operation, but has the drawback that the chip size becomes large. On the other hand, the NAND type ROM has the merit that the chip size can be reduced to a relatively small value. According as the memory capacity becomes equal to a large capacity of the order of mega bits, there have been an increased necessity of reducing the chip size from viewpoints of yield and cost. For this reason, there have been many occasions of employment of NAND type ROMs.

Figures 38, 39:
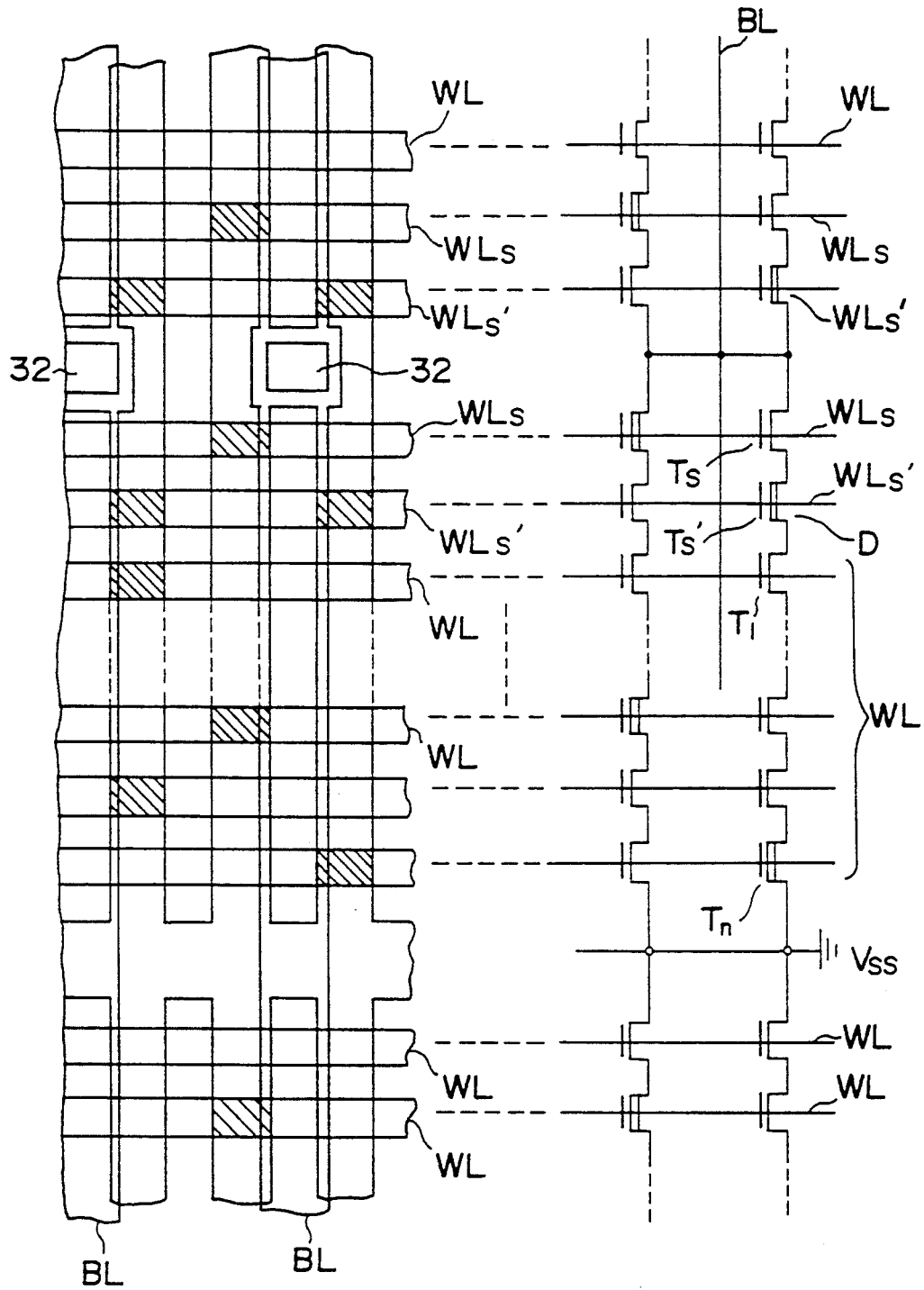
FIG. 38 is a view showing a pattern of a conventional NAND type ROM memory cell array.
FIG. 39 is a circuit diagram of the memory cell array shown in FIG. 38.

The plan pattern on a chip of a portion of a memory cell array of a conventional NAND type ROM and the circuit thereof are shown in FIGS. 38 and 39, respectively. In FIGS. 38 and 39, a common single bit line BL is provided between two transistor trains arranged in two columns. A single enhancement type (E-type) transistor Ts and a single depletion type (D-type) transistor Ts' for selecting a NAND bundle (transistors $T_1$ to $T_n$) are connected in series to the NAND bundle of each transistor train. Further, two word lines WLs and WLs' are connected to the transistors Ts and Ts', respectively, for selecting each NAND bundle. In this case, the transistors for selecting each NAND bundle in the transistor trains on the both sides of the bit line BL are such that the operating characteristics (the above-mentioned E-type and D-type) of transistors corresponding to each other are different from each other. Accordingly, in the case of selecting a memory cell to read out data stored therein, a word line WLs' corresponding to the D-type transistor Ts' of two NAND select transistors in a NAND bundle to which that memory cell belongs is caused to be at ground potential. Further, a word line WLs corresponding to the E-type transistor Ts is caused to be at a power supply potential Vcc (e.g., 5 volts). Furthermore, word lines WL corresponding to non-selected transistors of memory cell transistors $T_1$ to $T_n$ are caused to be at power supply potentials Vcc, respectively. In addition, a word line WL of the gate electrode of a selected memory cell transistor is caused to be at ground potential. Thus, data corresponding to the ON or OFF state of a selected cell transistor (e.g., $T_1$) of a selected NAND bundle appears on the bit line BL.

Since the memory cell transistor is made up by a D-type or E-type transistor in correspondence with the fact that the storage data is "0" or "1", non-selected cell transistors to which gates a power supply potential Vcc is applied are all turned ON. On the other hand, if selected cell transistors to which gates a ground potential is applied are of E type, they are cut OFF, while if those transistors are of D-type, they are turned ON. By sensing such ON or OFF, data readout operation is carried out.

It is to be noted that since an E-type transistor of two transistors for selecting a NAND bundle of an adjacent transistor train corresponding to a selected NAND bundle is turned OFF, no data is read out from this NAND bundle to the bit line BL.

In the pattern shown in FIG. 38, there is provided a contact portion 32 where the bit line BL and one end of the NAND bundle transistor train are in contact with each other, and the slanting line portions represent gate and channel regions of the D-type transistor Ts'.

Since a single bit line is provided for transistor trains in two columns in the arrangement shown in FIGS. 38 and 39, the number of bit lines can be reduced. This permits the chip size in a bit line wiring width direction to be reduced. Because of such a merit, memory devices of this structure have been most popularized at present time.

Let us consider the case where the memory cell according to this invention shown in FIG. 1 is replaced with such a mask ROM.

It is when a memory cell of the E-type is selected that the potential of the readout potential VIN from a memory cell represents "1" level. Further, it is when a memory cell of the D-type is selected that the potential represents "0" level. It is when only one memory cell of the D-type exists in the NAND bundle that the highest potential is provided at "0" level.

Generally, it is desirable for the memory device that they are operable even at a low power supply voltage. In the case of the semiconductor memory according to this invention shown in FIG. 1, when the power supply voltage Vcc is lowered, a difference between a potential of the signal A and that of the signal B is decreased, and a difference between potentials of the signals A and B and the power supply voltage Vcc is also decreased. If the difference of the latter becomes smaller than respective threshold voltages of the transistors S5 and S6 shown in FIG. 2, the transistors S5 and S6 are turned OFF and become inoperative. As previously described, in the case of a potential of VR2 dropped to a greater extent with respect to that of VIN, a rate showing that a difference between a potential of the signal B and the power supply voltage become small with lowering of the power supply voltage becomes higher. As stated above, it is desirable that a potential of VIN is lower than that of VR2. If the former is larger than the latter, there results the problem that the power supply margin is narrowed.

For this reason, it is preferable that the potential of VR2 in the reference cell become equal to a potential when there is one memory cell of the D-type in the memory NAND bundle which is the higher potential at "0" level.

Figure 40:
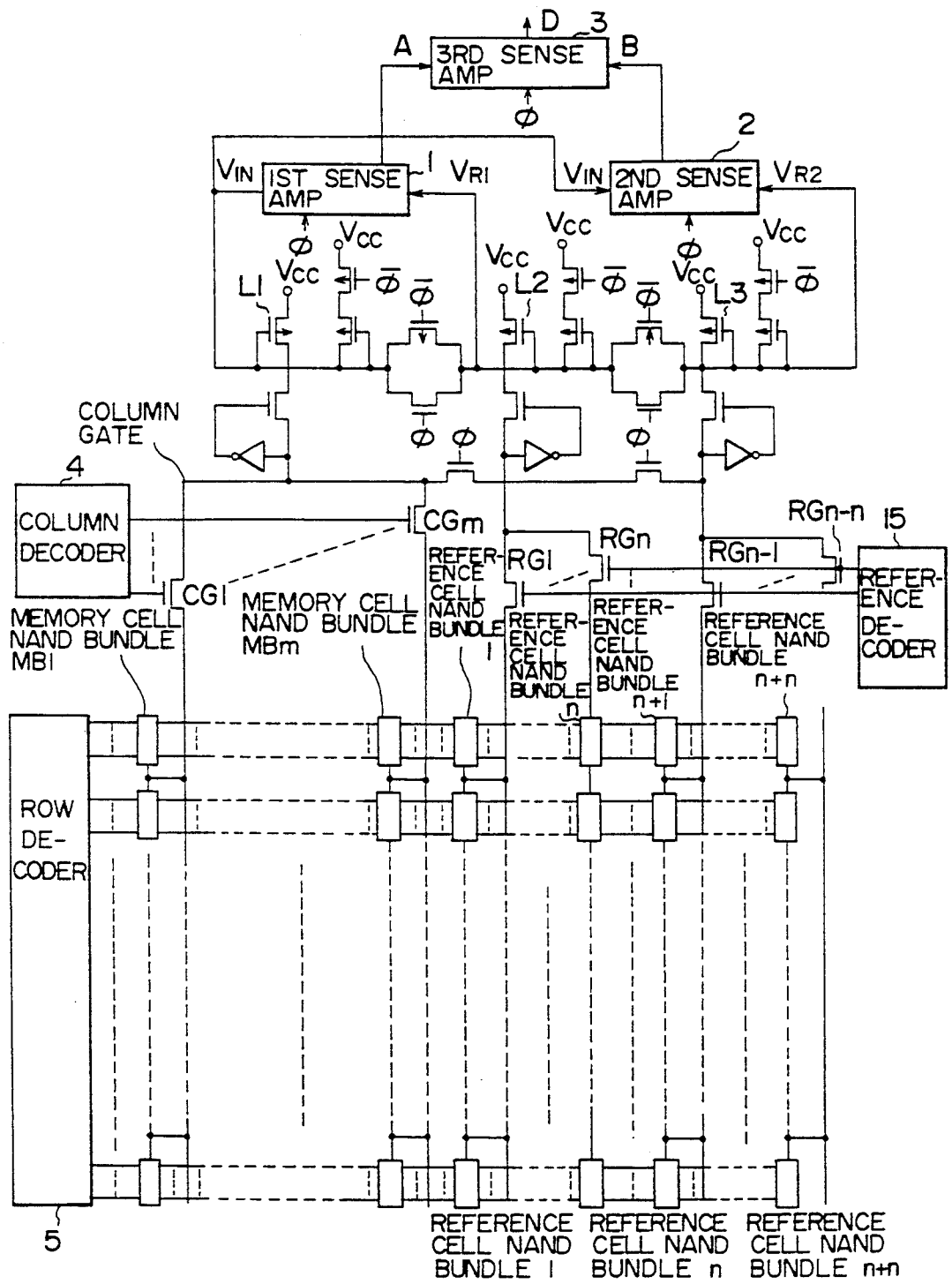
FIG. 40 is a circuit diagram showing how the memory device shown in FIG. 1 is realized by the NAND type ROM.

A twelfth embodiment of this invention shown in FIG. 40 has been made in view of the above circumstances and is constructed with a view to permitting the circuit configuration of FIG. 1 to be applied to a NAND type mask ROM.

Figure 41:
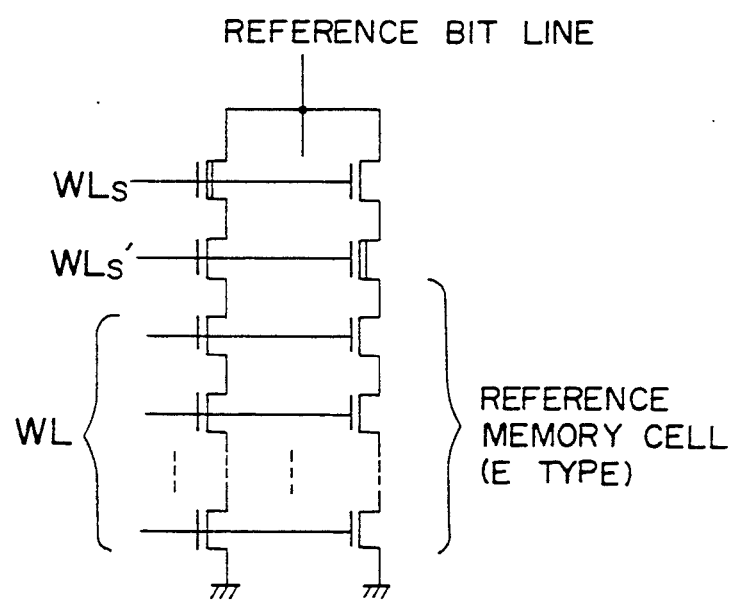
FIG. 41 is a circuit diagram showing an example of the configuration of reference cell NAND bundles 1 to n.

In correspondence with the reference cells shown in FIG. 1, reference cell NAND bundles DMB1 to DMBn, and DMBn+1 to DMBn+n are used. The reference cell NAND bundle DMB1 is connected to a common reference bit line and is also connected to a reference column gate RG1. The reference cell NAND bundle DMBn is connected to a common reference cell bit line and is also connected to a reference column gate RGn. The opposite sides of the reference column gates RG1 to RGn are commonly connected and are also connected to a load transistor L2, thus to prepare a reference potential VR1. The reference cell NAND bundle DMB1 to DMBn are constituted as shown in FIG. 41. Memory cell transistors in respective reference cell NAND bundles are all of E type. These reference cell NAND bundles 1 to n are equivalent to the memory cell NAND bundle in the case where a selected memory is E type transistor. Further, connection with word lines WLs and WLs' are the same as that in the prior art shown in FIG. 39.

In such a configuration, since the influences of power supply noise on the memory cells and the reference cells, the bit lines of the memory cells and the reference bit lines are caused to be equal to each other, the potential of VIN and that of VR1 when an E type memory cell is selected are equal to each other even in the case where power supply noise is present.

FIG. 42 shows one of reference cell NAND bundles DMB1 to DMBn in the case of n=8 wherein eight E type transistors are connected in series. FIG. 43 shows a decoder for selecting word lines WL1 to WL8 in the case of n=8, and FIG. 45 shows an embodiment of a reference decoder 15. FIG. 43 is a circuit diagram showing a NAND circuit wherein 8 NAND circuits are provided in correspondence with word lines WL1 to WL8, respectively. As shown in FIG. 44, inputs to P, Q, R are combination of address inputs A0 to A2 caused to be different with respect to respective word lines, whereby only one word line is selected and placed at "0" level, and other seven word lines are placed at "1" level of non-selection. FIG. 45 shows an embodiment of a reference decoder. As shown in FIG. 46, only one reference column gate is selected and turned ON by combination of address inputs A0 to A2. As seen from FIGS. 43 to 46, when WL1 is selected, RG1 is selected. When WL8 is selected, RG8 is selected.

Figure 47:
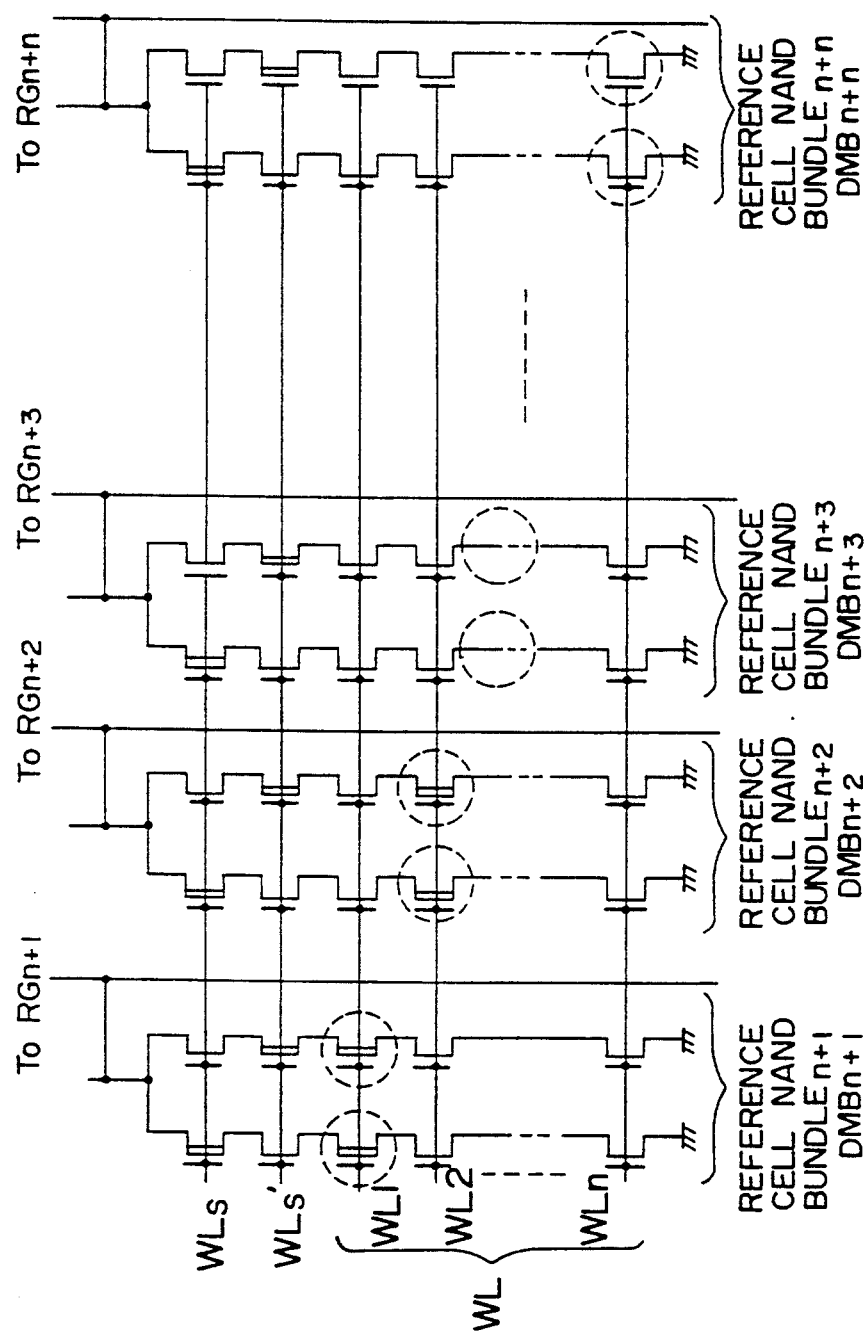
FIG. 47 is a circuit diagram showing the configuration of dummy cell NAND bundles n+1 to n+n.

On the contrary, reference cell NAND bundles DMBn+1 to DMBn+n are constituted as shown in FIG. 47. Only one of memory cell transistors included in respective reference cell bundles is of D-type, and the remaining transistors are of E-type. For example, only a memory cell connected to the word line WL1 is of D-type in the reference cell NAND bundle DMBn+1; only a memory cell connected to the word line WL2 is of D-type in the reference cell NAND bundle DMBn+2; and similarly, only a memory cell connected to the word line WLn is of D-type in the reference cell NAND bundle DMBn+n. As apparent from FIG. 40, the reference cell NAND bundle DMBn+1 is connected to a common reference bit line, and is further connected to the reference column gate RGn+1. Further, the reference cell NAND bundle n+n is connected to a common reference bit line, and is further connected to a reference column gate RGn+n. The opposite sides of the reference column gates RGn+1 to RGn+n are commonly connected to prepare a reference potential VR2.

In such a configuration, when, e.g., word line WL1 is selected, the reference column gate RGn+1 is selected by the reference decoder, so that RGn+1 is turned ON. Thus, a reference potential VR2 is prepared from the reference cell of the D-type connected to the word line WL1 of the reference cell NAND bundle DMBn+1. Similarly, when word line WLn is selected, the reference column gate RGn+n is selected by the reference decoder. Thus, a reference potential VR2 is prepared from the reference cell of the D-type connected to the word line WLn of the reference cell NAND bundle DMBn+n.

By employing such a configuration, reference cells can be prepared in the memory cell array. Further, the number of D-type memory cells in the reference cell NAND bundle can be reduced to only one.

In addition, when such a configuration is employed, since the reference cell is also controlled by the word line WL, there is no possibility that the potential of VR2 becomes lower than the potential of "0" level of VIN.

As stated above, this embodiment can provide a semiconductor memory which has a broad power supply margin, is operable at a high speed, and can tolerate power supply noise also in the NAND type mask ROM.

There are known semiconductor memories provided with auxiliary memory cells used in place of defective memory cells which may exist in the memory cell array.

An embodiment in which this invention is applied to a semiconductor memory having such a auxiliary memory cell will now be described.

Figure 48:
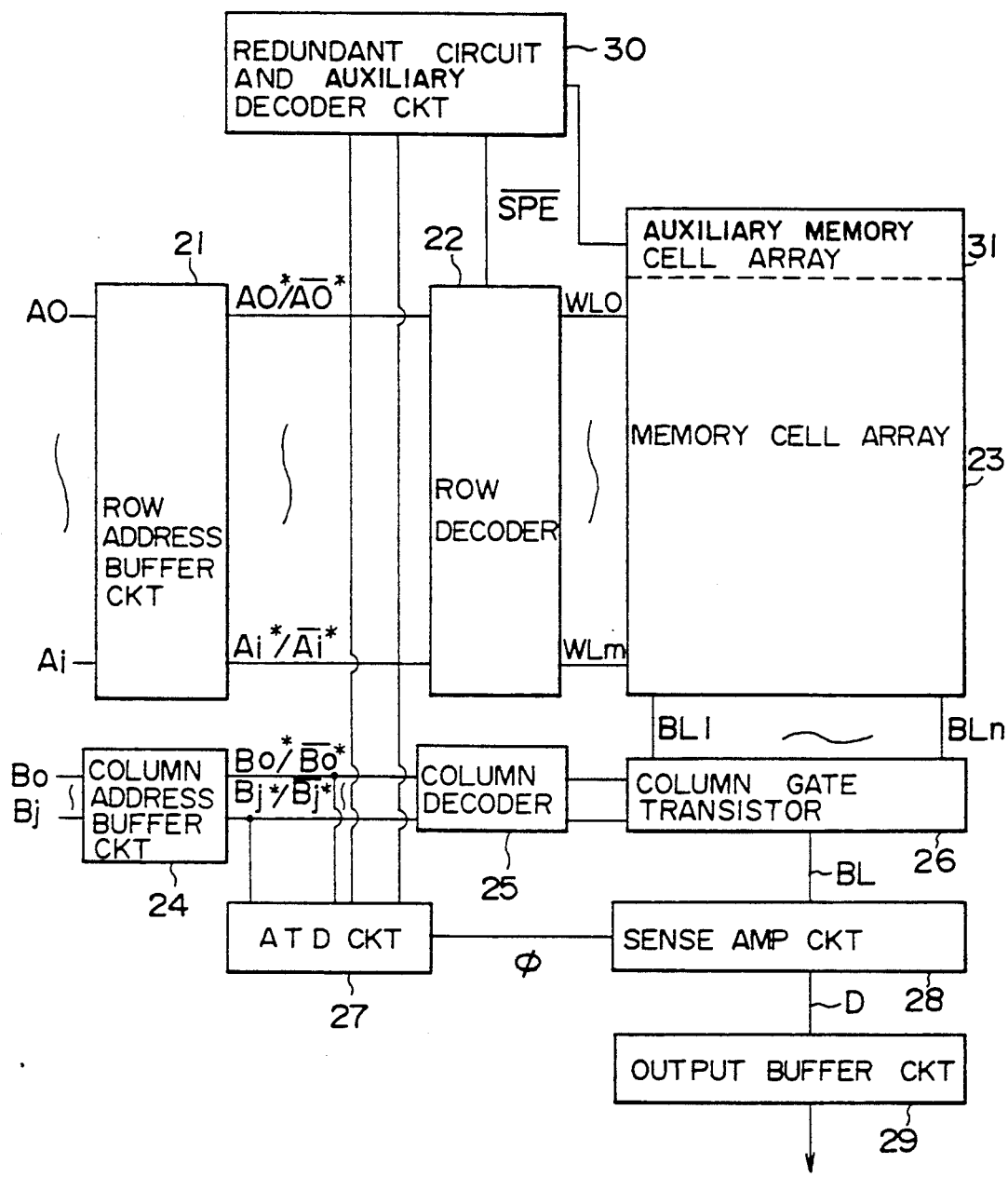
FIG. 48 is a block diagram showing a typical arrangement of EPROM.

FIG. 48 shows a typical configuration of, e.g., data erasable and programmable non-volatile semiconductor memory (hereinafter referred to as an EPROM). This configuration includes a row address buffer circuit 21, a row decoder circuit 22, a memory cell array 23, a column address buffer circuit 24, a column decoder 25, a column gate transistor 26, an address transition detecting (ATD) circuit 27, a sense amplifier circuit 28, an output buffer circuit 29, a redundant circuit and auxiliary decoder circuit 30, and a auxiliary memory cell array 31.

One of word lines WL0 to WLm is selected by the row decoder 22 to which row address signals A0 to Ai are inputted from the external, and one of bit lines BL0 to BLn is selected by the column decoder 25 to which column address input signals B0 to Bj are inputted from the external. Thus, a memory cell placed at the intersecting point of the selected word and bit lines.

Data of this memory cell is sensed and amplified by the sense amplifier, and is then outputted through the output buffer circuit to the external of the chip.

The sense amplifier circuit 28 shown in FIG. 48 has the configuration shown in FIGS. 1 and 2. By using an output signal $\phi$ from the ATD circuit 27 for detecting transition of the address signals, the equalizing and precharging operations of the bit line are carried out.

Figure 50:
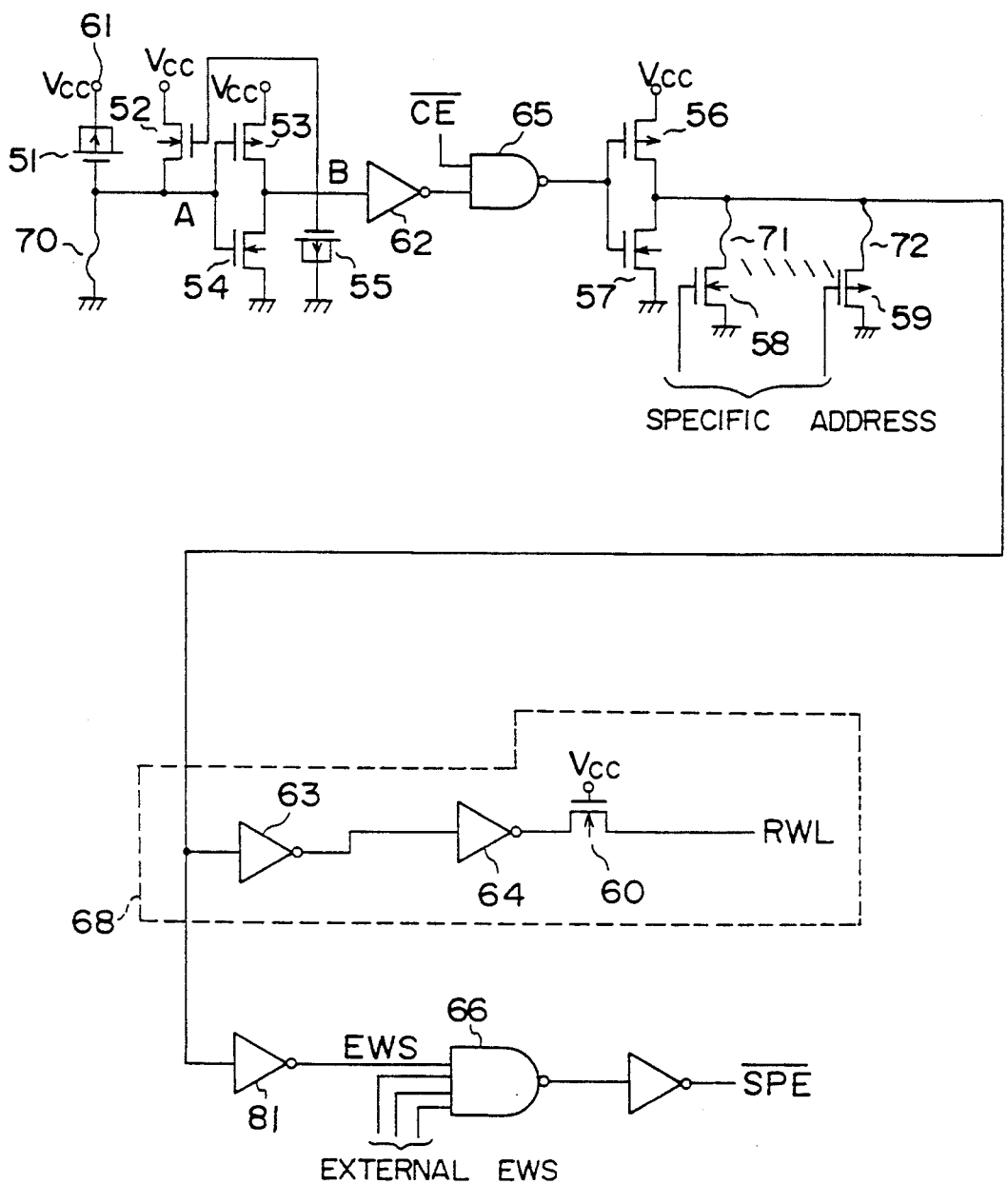
FIG. 50 is a circuit diagram showing an example of a redundant circuit.

FIG. 50 is a circuit diagram of the redundant circuit 30. This circuit includes enhancement type MOS transistors 51 to 60, a power supply terminal 61, inverters 62 to 64 and 81, NAND circuits 65 and 66, and fuses 70 to 72.

When the fuse 70 is blown, the redundant circuit and the auxiliary decoder 30 shown in FIG. 48 can be used.

By selectively blowing fuses 71 and 72, when an input address corresponding to a defective memory cell is inputted, an auxiliary word line is selected by the auxiliary row decoder. At the same time, selection of word lines by the row decoder normally used is inhibited.

Where there exists a defective memory cells in a cell array and an address corresponding to the defective memory cell is inputted, the signal $\overline{SPE}$ is changed to a logic "0" by a signal (EWS) for detecting establishment of the auxiliary decoder to inhibit the use of a word line including the defective memory cell for a period during which that address is inputted.

All word lines are in non-selected state by the signal $\overline{SPE}$ of a logic "0". At this time, the auxiliary word line (RWL) is selected. Thus, an auxiliary memory cell is selected.

However, where an auxiliary memory cell is selected in this way, the change of an address signal from the external is transmitted to the auxiliary memory cell via the row address buffer circuit 21 and the redundant circuit and auxiliary decoder circuit 30. Thus, the auxiliary memory cell is selected. On the other hand, that change of the address signal is also transmitted from the address buffer circuit 21 to the row decoder 22. The row decoder 22 is controlled by a signal $\overline{SPE}$ from the redundant circuit and auxiliary decoder circuit 30. Since the row decoder is controlled by a signal outputted via two circuits of the address buffer circuit 21 and the redundant circuit and auxiliary decoder circuit 30, a driving signal for word lines via two circuits of the address buffer circuit 21 and the row decoder 22 is also outputted. Accordingly, until the signal $\overline{SPE}$ from the redundant circuit and auxiliary decoder circuit 30 completely changes to logic "0", the word line selected by the row decoder 22 is placed at logic "1" level. Consequently, since word lines including defective memory cells are selected for a time period until the selecting of the word line normally used is inhibited, the defective memory cell would be selected.

For this reason, when any defective memory cell is selected, two memory cells of a auxiliary memory cell selected by the auxiliary word line and a defective memory cell selected by the word line would be selected.

It has been found out that where such a redundant circuit is used, use of the sense amplifiers of this invention shown in FIGS. 1 and 2 leads to the following problem.

In a semiconductor memory including such a auxiliary memory cell, even if one memory cell of a plurality of memory cells connected to the single word line is defective, a auxiliary memory cell is used in place of a defective memory cell by using a auxiliary word line in place of the word line. For this reason, the memory cell related to the word line in which the defective memory cell is included is replaced by the auxiliary memory cell. For example, in the case of EPROM of FIG. 1, since data is not written into a good memory cell of the word line in which the defective memory cell is included, no electron is injected into the floating gate of the good memory cell.

Electrons are injected into the floating gate of the auxiliary memory cell connected to the auxiliary word line. In the case where no electron is injected into a memory cell connected to a word line in which a defective memory cell is included, replaced by the auxiliary word line, there occurred the problem that the speed for reading data of the selected auxiliary memory cell becomes slow.

In the case where the auxiliary memory cell is used in a manner stated above, not only the selected auxiliary memory cell in which electrons are injected into a floating gate but also the memory cell Mm in which no electron is injected into the floating gate are connected to the bit line BL. The word line WL including a memory cell in which there occurs an unsatisfactory operation is connected to the gate of the memory cell Mm. This word line WL is temporarily selected as previously described. It has been found out that the word line WL is selected for 3 ns. For this reason, this memory cell Mm is placed in an ON state for 3 ns.

For this time period, the bit line BL is discharged by the memory cell Mm.

As a result, since the output A from the first sense amplifier of FIG. 2 changes to logic "1" level although it selects the auxiliary memory cell in which "0" data is stored, an output signal D of logic "0" level corresponding to the memory cell data of "1" data is outputted from the third sense amplifier.

When 3 nsec has passed, there is no discharging of the bit line BL by the memory cell Mm0. As the result of the fact that the potential on the bit line BL is charged up to the same potential as that on the first reference bit line, the P-channel transistors S1 and S2 of the first sense amplifier are brought into non-conductive state. Since the potential on the node N2 is substantially equal to the threshold voltage of the N-channel transistor, discharge speed of the node N2 by the N-channel transistor connected between Vss and the P-channel transistor S1 is slow. The output signal A from the first sense amplifier changes from logic "1" level to logic "0" level after, e.g., 20 nsec.

For this reason, the sense speed of "0" data was delayed by about 20 ns.

This embodiment has been carried out with a view to providing a semiconductor memory which can operate at a high speed even in the case where a auxiliary memory cell is selected because of the above-mentioned circumstances.

FIG. 49 shows conventional address buffer circuit 21 and ATD circuit 27.

Figure 49A:
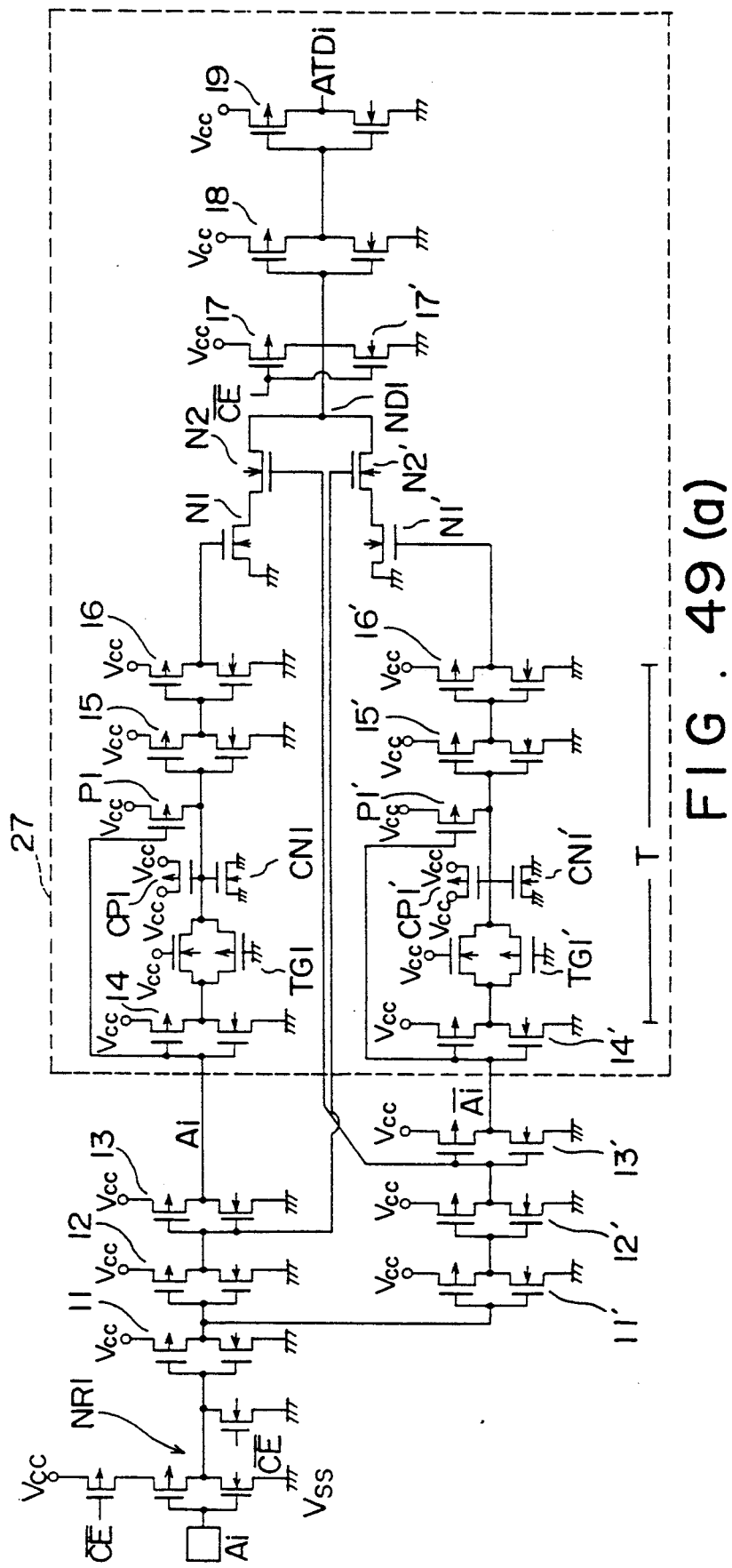
FIG. 49(a) is a circuit diagram showing an example of an address buffer circuit and an address transition detecting circuit.

In the address buffer circuit and the ATD circuit shown in FIG. 49(a), Ai represents an address input, $\overline{CEi}$ an internal chip enable signal for allowing the integrated circuit chip to be in an operative state or in a auxiliary state, which is generated by a chip enable buffer circuit (not shown) in response to a chip enable signal (or a chip select signal) from the external, Vcc a power supply potential, and Vss a ground potential. An Ai input and a signal $\overline{CE}$ are inputted to a two-input NOR gate NR1 in the address buffer circuit. Three stages of inverters 11 to 13 are connected to the output side of the NOR gate NR1. Further, three stages of inverters 11' to 13' are connected to the output side of the inverter 11. Output from the inverters 12 and 13 and outputs from the inverters 12' and 13' are inputted to the ATD circuit 27.

In the ATD circuit shown in FIG. 49(a), an output Ai from the inverter 13 is inputted to the inverter 14. Two stages of inverters 15 and 16 are connected to the output side of the inverter 14 through a transfer gate TG1 comprised of an N-channel transistor and a P-channel transistor connected in parallel wherein the Vcc potential is applied to the gate of the N-channel transistor and the Vss potential is applied to the gate of the P-channel transistor. A capacitor CP1 and a capacitor CN1 are connected to the output node of the transfer gate TG1. The capacitor CP1 is comprised of a P-channel transistor in which the Vcc potential is applied to the source/drain thereof and its gate is connected to the output node. On the other hand, the capacitor CN1 is comprised of an N-channel transistor in which the Vss potential is applied to the source/drain thereof and its gate is connected to the output node of TG1. Further, a P-channel transistor P1 is connected between the output node of the transfer gate TG1 and the Vcc potential wherein an output Ai from the inverter 13 is inputted to the gate of the transistor P1.

Moreover, the output terminal of the inverter 16 is connected to the gate of an N-channel transistor N1 of which source is connected to the Vss potential, and the source of an N channel transistor N2 of which gate is connected to the output terminal of the inverter 12' is connected to the drain of the N-channel transistor N1.

Further, an output $\overline{Ai}$ from the inverter 13' is inputted to an inverter 14'. Two stages of inverters 15' and 16' are connected to the output side of the inverter 14' through a transfer gate TG1' comprised of an N-channel transistor and a P-channel transistor connected in parallel wherein the Vcc potential is applied to the gate of the N-channel transistor and the Vss potential is applied to the gate of the P-channel transistor. A capacitor CP1' and a capacitor CN1' are connected to the output node of the transfer gate TG1'. The capacitor CP1' is comprised of a P-channel transistor in which the Vcc potential is applied to the source/drain thereof and its gate is connected to the output node of TG1'. On the other hand, the capacitor CN1' is comprised of an N-channel transistor in which the Vss potential is applied to the drain/source thereof and its gate is connected to the output node of TG1'. A P-channel transistor P1' is connected between the output node of the transfer gate TG1' and the Vcc potential. An output Ai from the inverter 13' is inputted to the gate of the transistor P1'.

The output terminal of the inverter 16' is connected to the gate of an N-channel transistor N1' of which source is connected to the Vss potential, and the source of an N-channel transistor N2' of which gate is connected to the output terminal of the inverter 12 is connected to the drain of the N-channel transistor N1'. The drains of the N-channel transistor N2' and the N-channel transistor N2 are connected to each other. The input terminal of an inverter 18 is connected to the junction (node ND1), and drain of a P-channel transistor 17 is connected thereto, wherein Vcc is connected to its source and a signal $\overline{CE}$ is inputted is connected to its gate.

Further, the drain of an N-channel transistor 17' is connected to the node ND1, the signal $\overline{CE}$ is inputted to the gate of the transistor 17', and the source is grounded.

It is to be noted that the circuit from the inverter 14 to the N-channel transistor N1 and the circuit from the inverter 14' to the N-channel transistor N1' form delay circuits T having predetermined delay times, respectively.

In the address buffer circuit and the ATD circuit shown in FIG. 49(a), when the signal $\overline{CE}$ shifts to logic "0" level, so the chip is placed in a selected state (in an operable state), the output node ND1 of the inverter 17 shifts to "1" level. At this time, when there is a transition in the address input Ai, a corresponding one of the N-channel transistor N2' and the N-channel transistor N2 is turned ON, so the node ND1 shifts to "0" level. After a predetermined delay time of the delay circuit T, a corresponding one of the N-channel transistor N1' and the N-channel transistor N1 is turned OFF, so the node ND1 shifts to "1" level for a second time. Thus, a signal ATDi of logic "0" level having a predetermined pulse width is outputted from the inverter 19. Further, signals ATDi from the address buffer circuit and the ATD circuit of FIG. 49(a) provided respectively in correspondence with bits of the address input are inputted to the NAND circuit shown in FIG. 49(b).

Figure 49B:
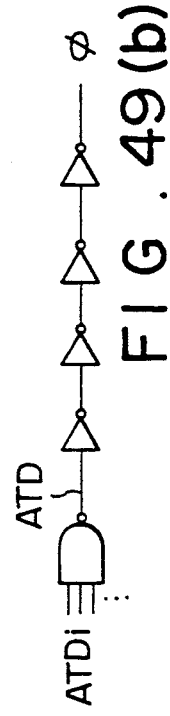
FIG. 49(b) is a circuit diagram showing a circuit which generates a pulse signal ATD.

This output signal ATD is subjected to waveform shaping and is amplified by four stages of inverters shown in FIG. 49(b). Its output signal $\phi$ is inputted to the precharge transistor and the equalizing transistor of the sense circuit.

Figure 51:
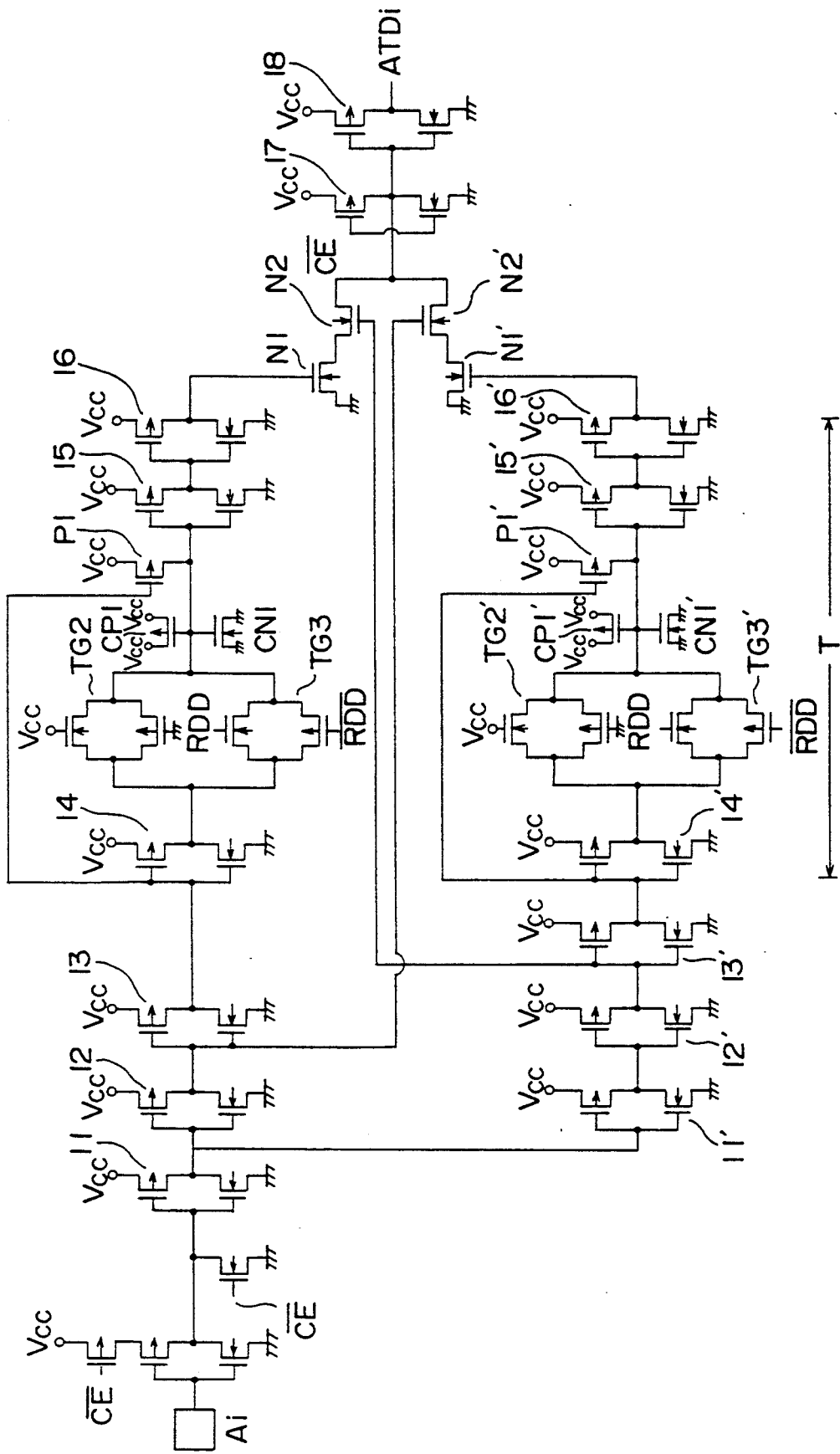
FIG. 51 is a circuit diagram showing an embodiment of this invention including a redundant circuit.

FIG. 51 shows a thirteenth embodiment of this invention. This embodiment differs from the conventional circuit shown in FIG. 49(a) in that transfer gates TG2 and TG3 are connected in parallel on the output side of the inverter 14 wherein the transfer gate TG2 is comprised of an N-channel transistor and a P-channel transistor connected in parallel, the Vcc potential and the Vss potential being applied to the gates of the N-channel transistor and the P-channel transistor, respectively, and wherein the transfer gate TG3 is comprised of an N-channel transistor and a P-channel transistor connected in parallel, the signal RDD and the signal $\overline{RDD}$ being applied to the gates of the N-channel transistor and the P-channel transistor, respectively. In addition, transfer gates TG2' and TG3' corresponding to the transfer gate TG3 are similarly connected in parallel also with the output terminal of the inverter 14'.

It is to be noted that a setting is made such that the resultant conduction resistance when transfer gates TG2 and TG3 are connected in parallel in the case where the transfer gate TG3 is turned ON when the signal RDD is at logic "1" level, and the signal $\overline{RDD}$ is at logic "0" level and the conduction resistance of the conventional transfer gate TG1 are equal to each other. Further, a setting should be made such that the resultant conduction resistance when transfer gates TG2' and TG3' are connected in parallel in the case where the transfer gate TG3' is turned ON and the conduction resistance of the conventional transfer gate TG1' are equal to each other.

Figure 52:
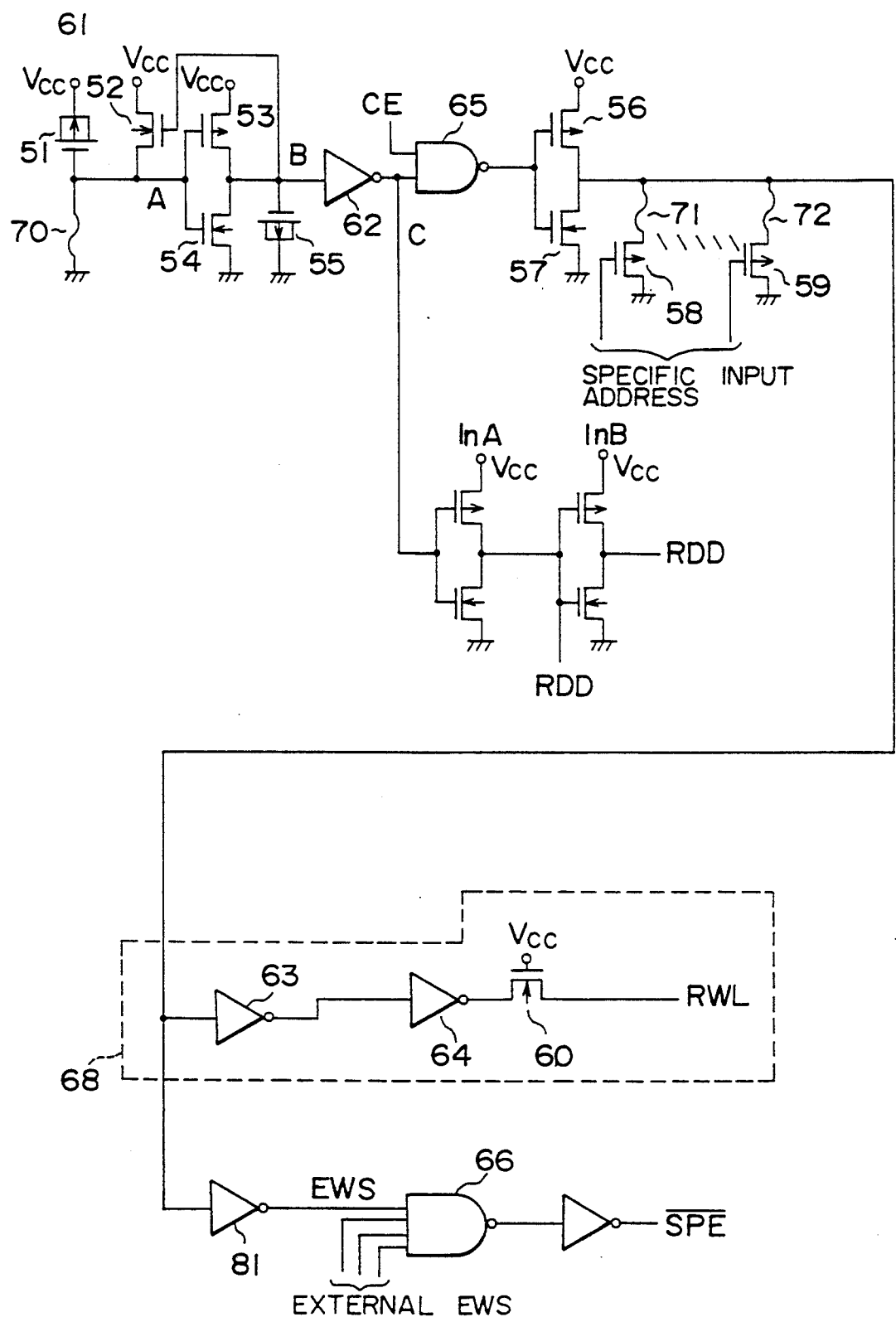
FIG. 52 is a circuit diagram showing a redundant circuit for outputting signals used in the embodiment shown in FIG. 51.

FIG. 52 shows a redundant circuit for outputting signals RDD and $\overline{RDD}$ wherein the same reference numerals are attached to the same components as those in FIG. 50, respectively.

By allowing the inverter InA to receive an output signal from the inverter 62, a signal RDD is provided as an output signal from the inverter 62. Then, by allowing the inverter InB to receive the signal RDD, a signal $\overline{RDD}$ is provided as an output signal from the inverter InB.

The operation of the above-mentioned embodiment will now be described.

In the case where no auxiliary memory cell is used, the node A is connected to the power supply Vss through the fuse 70 and is therefore at "0" level. Accordingly, the nodes BB and CC are at "1" and "0" levels, respectively. Thus, the signal RDD and the signal $\overline{RDD}$ represent logic "1" and "0" levels, respectively.

Responding to these signals RDD and $\overline{RDD}$, the transfer gates TG3 and TG3' become conductive, respectively.

As previously described, the pulse width of a signal $\phi$ which determines the equalizing time is determined by the delay circuit T. For this reason, the pulse width when no auxiliary memory cell is used is equal to the pulse width of the conventional circuit.

The operation when a auxiliary memory cell is used will now be described.

When the auxiliary memory cell is used, the fuse 70 is cut off. A potential on the node A is raised by a capacitor 51 connected to the power supply Vcc to invert the inverter of the next stage. As a result, the node BB shifts to logic "0" level. Responding to "0" level on the node BB, the transistor 52 is turned ON. As a result, the node AA shifts is connected to the power supply Vcc. Thus, logic "1" level is stably outputted. Further, the node CC shifts to logic "1" level. In addition, the signals RDD and $\overline{RDD}$ shift to logic "0" and "1" levels, respectively.

Responding to these signals RDD and $\overline{RDD}$, the transfer gates TG3 and TG3' become non-conductive. Thus, the delay time T is prolonged than that when no auxiliary memory cell is used.

When respective conduction resistance values of TG2, TG2' and TG3' are determined so that the delay time in the delay circuit T is prolonged by 3 nsec at the time when, e.g., TG3 and TG3' are in a non-conductive state, the pulse width of the equalization signal $\phi$ is prolonged by 3 ns.

Thus, the auxiliary memory cell is selected. When reading out data from the auxiliary memory cell, the precharging and equalizing times of the bit line BL and the reference bit lines DBL1 and DBL2 are prolonged by 3 nsec. A row line to which a defective memory cell is connected shifts to logic "1" level. Thus, the precharging and equalizing operations are continued for 3 nsec during which logic "0" level is provided by the signal SPE. For this reason, there is no possibility that an erroneous operation as previously described may take place.

In the above-described embodiment, by utilizing the ATD circuit shown in FIG. 51, the pulse width is prolonged when the auxiliary memory cell is used. In addition, the pulse width of the signal $\phi$ may be prolonged by making use of FIG. 49(b). This embodiment will now be described with reference to FIG. 53.

Figure 53:
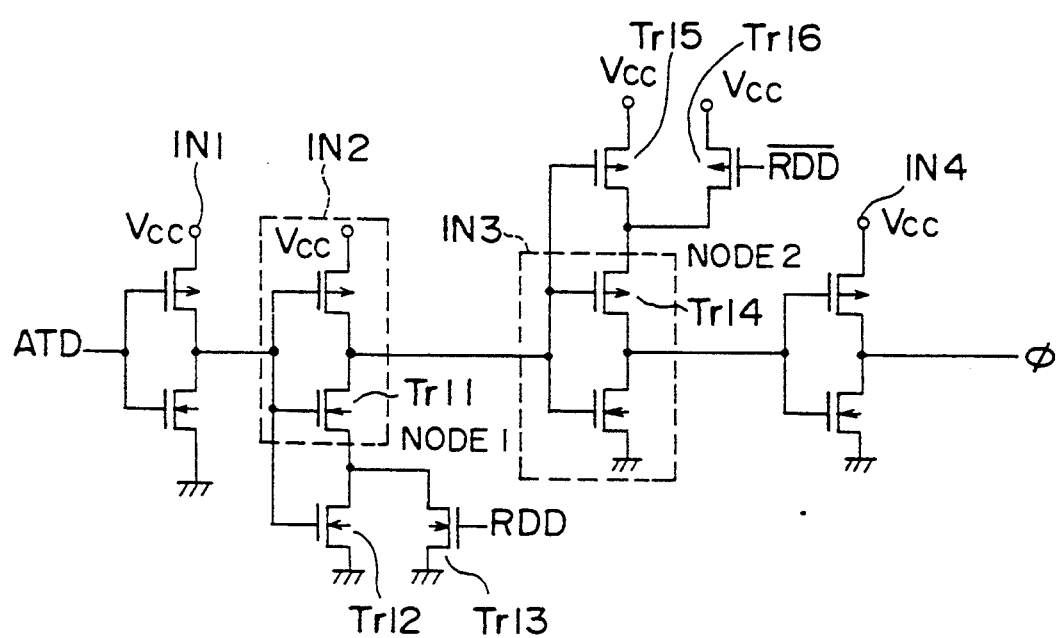
FIG. 53 is a circuit diagram showing a still further embodiment of this invention.
Figure 54:
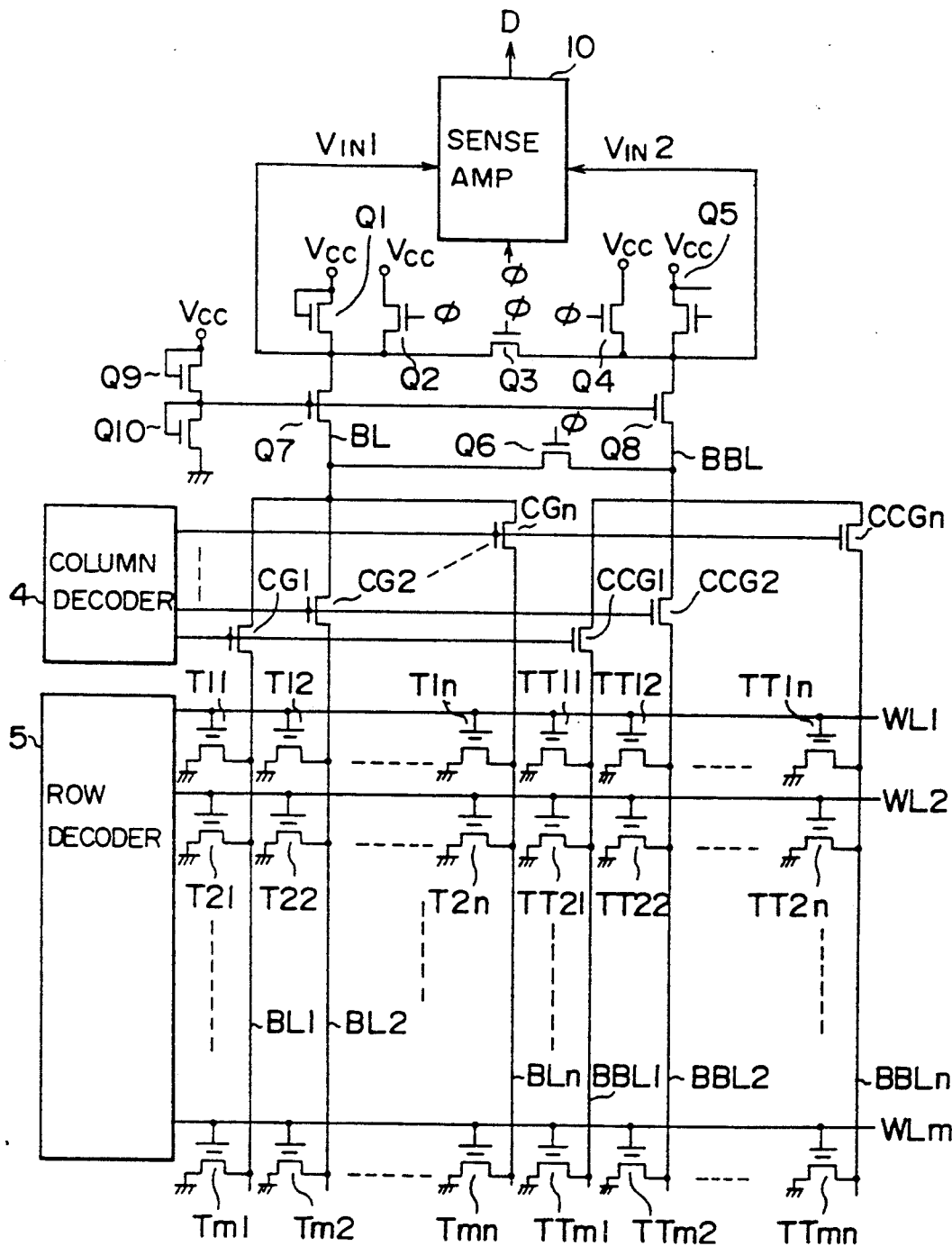
FIG. 54 is a circuit diagram showing the configuration of a conventional semiconductor memory device.
Figure 55:
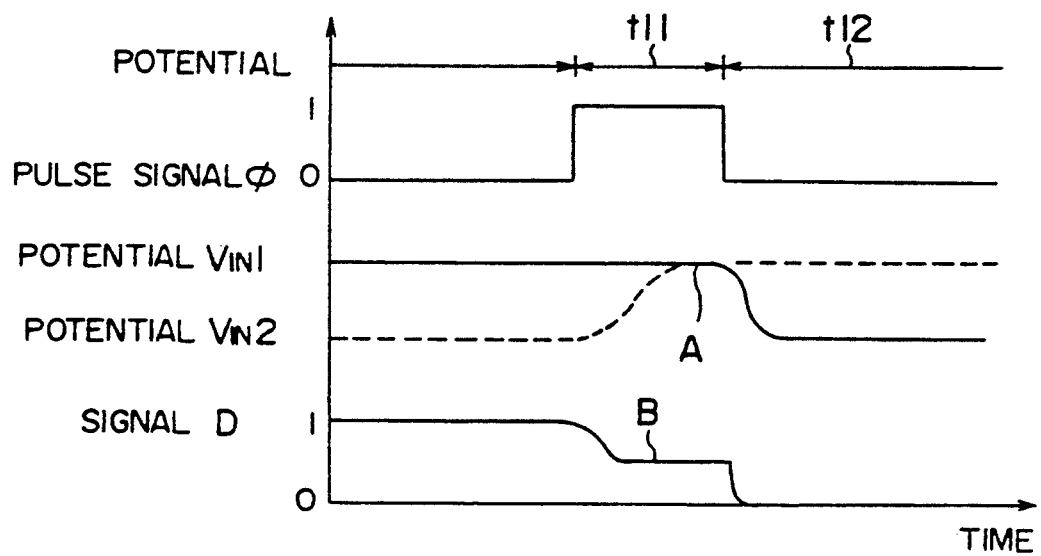
FIG. 55 is a timing chart showing the relationship of an equalization signal $\phi$, voltages VIN, VR1 and VR2 and signals A, B and D in the device shown in FIG. 54.

The embodiment shown in FIG. 53 is directed to improvement of inverters of the second and third stages of four stages of inverters for receiving a signal ATD of FIG. 49(b) of the prior art to form an equalization pulse $\phi$.

Between the source of an N-channel type transistor Tr11 of the inverter IN2 of the second stage and ground, an N-channel type transistor Tr12 having a large conduction resistance and an N-channel type transistor Tr13 having a small conduction resistance are connected in parallel.

Further, between the source of a P-channel type transistor Tr14 of the inverter IN3 of the third stage and the power supply Vcc, a P-channel type transistor Tr15 having a large conduction resistance and a P-channel type transistor Tr16 having a small conduction resistance are connected in parallel.

The signal RDD is inputted to the gate of the N-channel type transistor Tr13, and the signal $\overline{\text{RDD}}$ is inputted to the gate of the P-channel type transistor Tr16. The gate of the N-channel type transistor Tr12 is connected to the output terminal of the inverter IN1 of the first stage, and the gate of the P-channel type transistor Tr15 is connected to the output terminal of the inverter IN2.

The operation of the above-described circuit will now be described.

Let us now consider the case where the auxiliary memory cell is used.

In this case, as previously described, the signal RDD is at "0" level and the signal $\overline{\text{RDD}}$ is at "1" level. Accordingly, the transistors Tr13 and Tr16 are cut OFF.

For this reason, when the gate input of the inverter IN2 changes from "0" to "1" level, the output of the inverter IN2 is discharged through the transistors Tr11 and Tr12.

Further, when the gate input of the inverter IN3 changes from "1" level to "0" level, the output of the inverter IN3 is charged through transistors Tr15 and Tr14.

Since the output from the inverter IN2 is discharged through the transistor Tr12 having a large conduction resistance, the discharge speed of the output from the inverter IN2 is slower than the speed in the case of discharging, by using transistors Tr12 and Tr13, an output from the inverter when the transistor Tr13 is turned ON because the signal RDD which takes logic "1" level when no auxiliary memory cell is used is applied to the gate of the transistor Tr13.

Namely, the speed in the case of discharging the output from the inverter IN2 through transistors Tr11 to Tr13 is higher than the speed in the case of discharging the output from the inverter IN2 only through transistors Tr11 and Tr12.

Similarly, the speed in the case of charging the output from the inverter IN3 through transistors Tr14 to Tr16 is higher than the speed in the case of charging the output from the inverter IN3 only through transistors Tr14 and Tr15.

Thus, it is sufficient to set respective conduction resistance values of the transistors Tr11, Tr12, Tr13, Tr14, Tr15 and Tr16 so that the sum of the speed for discharging the output from the inverter IN2 and the speed for charging the output from the inverter when the auxiliary memory cell is used is slower than that when no auxiliary memory cell is used.

Accordingly, in the same manner as in the embodiment shown in FIG. 51, the equalizing pulse width $\phi$ when the auxiliary memory cell is used can be longer than that when no auxiliary memory cell is used, resulting in no erroneous operation. In the above-mentioned embodiment, the pulse width of the pulse signal $\phi$ when the auxiliary memory cell is used and that when no auxiliary memory cell is used are caused to be different from each other. However, not only the pulse width of the pulse signal $\phi$ but also those of other timing pulses may be varied. Namely, since it is possible to arbitrarily respective pulse widths so that the pulse widths of respective timing pulses become optimum when the auxiliary memory cell is used. Accordingly, even in the case where the auxiliary memory cell is used, the timing pulses are set in an optimum manner in correspondence with the signal path for selection of the auxiliary memory cell. Thus, the readout speed can be faster.

As stated above, in accordance with this invention, two kinds of first and second reference cells corresponding to the storage state of the memory cell are provided to make a comparison between the storage state of the memory cell and the storage state of the reference cell to thereby detect storage data in the memory cell. Thus, a memory device operable satisfactorily with a less number of required memory cells and of a high integration structure can be provided.

By allowing a very small current to flow in the first reference bit line, this reference bit line can be prevented from being brought into a floating state. Thus, an erroneous operation can be prevented.

In the case where leak means is provided, the relationship between potentials on the bit line and the reference bit line becomes reasonable. Thus, the sense operation is performed at a high speed and the margin is expanded.

In the case where equalizing means is provided, potentials on the bit line and the reference bit line are caused to be equal to each other, thus making it possible to stabilize the operation.

In the case where the precharge means is provided, changes in potentials on the bit line and the reference bit line by changes of the equalizing signal can be prevented when the equalizing operation is completed. Thus, occurrence of an erroneous operation can be prevented.

By storing data of one bit into two memory cells to take out data by reference cells in two states with respect to respective memory cells, high speed data sense operation can be performed. Further, by suitably carrying out the equalizing operation, a higher speed operation can be performed.

By setting, at the time of program verify read operation, an output voltage from the second bit line to a value higher than that at the time of an ordinary read operation to use an exclusive sense amplifier therefor, the quantity of electrons injected into the memory cell at the time of write operation is increased. Thus, the voltage margin can be extended.

By allowing a current flowing in the memory cell in which no electron is injected into the floating gate of the memory cell to be smaller than a current flowing in the second reference bit line, an output from the second amplifier reaches an intermediate potential between "0" and "1" at a faster speed. Thus, the data sense speed is improved.

By providing the voltage drop circuit adapted to output a voltage lower than the power supply voltage by a predetermined value, and the third reference cell in the state equivalent to that of the memory cell in which no electron is injected into the floating gate, the drain thereof being connected to the drain of the first reference cell, the gate thereof being connected to the output of the voltage drop circuit, the operation is performed at a faster speed.

By patterning "0" or "1" of binary data on a glass pattern, a ROM similar to the device based on the first aspect can be provided.

By constituting the memory cell with a non-volatile memory cell adapted to store data in response to whether the MOS transistor is of the depletion type or the enhancement type, and constituting the reference cell with a NAND bundle transistor train, a non-volatile semiconductor memory device can be provided.

The auxiliary memory cell is provided in association with the memory cell array. In the case where there is any defective cell, by allowing the equalizing time for equalizing the bit line and the reference bit line to be longer than that in an ordinary case, row lines defective in operation are securely brought into a non-selected state. Thus, the possibility that an erroneous operation takes place is reduced.

By applying elongation of the equalizing time, the possibility of occurrence of an erroneous operation is reduced.

What is claimed is:

1. A semiconductor memory device comprising:
   a memory cell for storing at least binary data;
   a first reference cell placed in a storage state equivalent to that of one logical state of the binary data;
   a second reference cell placed in a storage state equivalent to that of the other logical state of the binary data;
   a first sense amplifier section for comparing voltages changed in dependency upon respective storage states of said memory cell and said first reference cell to provide a first output corresponding to the compared result;
   a second sense amplifier section for comparing voltage changed in dependency upon respective storage states of said memory cell and said second reference cell to provide a second output corresponding to the compared result; and
   a third sense amplifier section for comparing said first and second outputs to thereby sense the storage state of said memory cell.

2. A semiconductor memory device as set forth in claim 1, wherein said memory cell includes a floating gate, said memory cell being adapted to store binary data in dependency upon whether or not electrons are injected into said floating gate.

3. A semiconductor memory device as set forth in claim 1, which further comprises:
   a bit line for outputting a voltage corresponding to the storage state of said memory cell when data stored in said memory cell is read out;
   a first reference bit line for outputting a voltage corresponding to the storage state of said first reference cell; and
   a second reference bit line for outputting a voltage corresponding to the storage state of said second reference cell;
   said first sense amplifier section being operative to compare a voltage on said bit line with that on said first reference bit line to thereby provide a first output corresponding to the storage state of said memory cell,
   said second sense amplifier section being operative to compare a voltage on said bit line with that on said second reference bit line to thereby provide a second output corresponding to the storage state of said memory cell,
   said third sense amplifier section being operative to comparing said first and second outputs to thereby sense the storage state of said memory cell.

4. A semiconductor memory device as set forth in claim 3, wherein said memory cell includes a floating gate, said memory cell being adapted to store binary data in dependency upon whether or not electrons are injected into said floating gate.

5. A semiconductor memory device as set forth in claim 4, wherein said first and second reference cell and said memory cell are electrically equivalently connected, said first reference cell having a high threshold value substantially the same as a threshold value of the memory cell into which electrons are injected.

6. A semiconductor memory device as set forth in claim 4, which further comprises bit line current leak means for respectively forming leak current paths in said bit line and said first and second reference bit lines so that a potential on said bit line is lower than both potentials on said first and second reference bit lines when no electron is injected into said floating gate of said memory cell.

7. A semiconductor memory device as set forth in claim 4, which further comprises bit line current leak means for respectively forming leak current paths in said bit line and said first and second reference bit lines so that a potential on said bit line is higher than both potentials on said first and second reference bit lines when electrons are injected into said floating gate of said memory cell.

8. A semiconductor memory device as set forth in claim 4, wherein the number of reference cells placed in a state equivalent to said memory cell in which electrons are injected into said floating gate is increased to provide a required circuit capacity for reference bit lines.

9. A semiconductor memory device as set forth in claim 3, which further comprises reference bit line leak means for allowing a very small current to flow in said first reference bit line to prevent said first reference bit line from being in a floating state.

10. A semiconductor memory device as set forth in claim 3, which further comprises precharge means wherein when an address for selecting said memory cell changes, as detected by an address transition detection means connected to said precharge means, said precharge means are brought into a conductive state for a predetermined period in correspondence with that address change, said precharge being connected between said bit line and a power supply, between said first reference bit line and said power supply, and between said second reference bit line and said power supply, thus to charge said bit line and said first and second reference bit lines so that they have predetermined potentials, respectively.

11. A semiconductor memory device as set forth in claim 10, wherein said precharge means for said bit line, and said first and second reference bit lines each comprises depletion transistors and a P-channel transistor connected in series, said depletion transistor being brought into a conductive state for a predetermined period, and having a gate connected to said power supply, said P-channel transistor being operative to set precharge voltages of said bit line, and said first and second reference bit lines to a value lower than a power supply voltage.

12. A semiconductor memory device as set forth in claim 11, wherein the precharge means connected to said bit line of said precharge means has a conduction resistance which is set to a value smaller than a conduction resistance of the precharge means connected to each of said reference bit lines.

13. A semiconductor memory device as set forth in claim 3, which further comprises equalizing means wherein when an address signal for selecting said memory cell changes, as detected by an address transition detection means connected to said equalizing means, said equalizing means is operative to equalize potentials on said bit line and said first and second reference bit lines, for a predetermined period in correspondence with that change.

14. A semiconductor memory device as set forth in claim 13, wherein equalizing transistors which become conductive for a predetermined time interval in correspondence with changes of said address signal are arranged between said bit line, and said first and second reference bit lines so that a potential on said bit line is above a potential on said first reference bit line at the time of sensing "0" data, and the potential on said bit line is below a potential on said second reference bit line at the time of sensing "1" data.

15. A semiconductor memory device as set forth in claim 13, wherein said equalizing means comprises a first equalizing transistor connected between said bit line and said first reference bit line, and a second equalizing transistor connected between said first reference bit line and said second reference bit lines.

16. A semiconductor memory device as set forth in claim 15, wherein said equalizing means further comprises a third equalizing transistor connected between said bit line and said second reference bit line.

17. A semiconductor memory device as set forth in claim 13, wherein said equalizing means comprises a first equalizing transistor connected between said bit line and said second reference bit line, and a second equalizing transistor connected between said first reference bit line and said second reference bit lines.

18. A semiconductor memory device as set forth in claim 3, which further comprises:
load means provided between power supply terminal and each of said bit line, said first and second reference bit lines, respectively, and
bias transistors provided between said load means and each of drains of said memory cell and said first and second reference cells to set drain voltages of said memory cell and said first and second reference cells so that they are below predetermined levels, respectively.

19. A semiconductor memory device as set forth in claim 18, wherein a constant voltage is delivered to the gate electrode of said bias transistors.

20. A semiconductor memory device as set forth in claim 18,
wherein an output of a first inverter for invert-amplifying a potential on the drain of said memory cell is connected to the gate electrode of said memory cell bias transistor,
wherein an output of a second inverter for invert-amplifying a potential on the drain of said first reference cell line is connected to the gate electrode of the bias transistor of said first reference cell line, and
wherein an output of a third inverter for invert-amplifying a potential on the drain of said second reference cell is connected to the gate electrode of the bias transistor of said second reference cell line.

21. A semiconductor memory device as set forth in claim 20, wherein said inverter is of a complementary structure comprising an N-channel transistor having a threshold voltage of substantially zero volts and a P-channel transistor connected in series.

22. A semiconductor memory device as set forth in claim 21, wherein a depletion type transistor having, as the gate input, a write control signal which is at a low logic level at the time of writing is connected between the drain of said memory cell and the bias transistor of said memory cell.

23. A semiconductor memory device as set forth in claim 20, wherein said bias transistors are of a complementary structure comprising an N-channel transistor and a P-channel transistor connected in series, a constant current source being connected between said P-channel transistor and the power supply voltage terminal.

24. A semiconductor memory device as set forth in claim 23, wherein said constant current source is comprised of a depletion type transistor, the source and the gate thereof being connected to each other.

25. A semiconductor memory device as set forth in claim 23, wherein said constant current source is comprised of a depletion type transistor of which gate is grounded.

26. A semiconductor memory device as set forth in claim 23, wherein said constant current source is comprised of a transistor between said complementary inverter and said power supply voltage terminal, said transistor having, as its gate input, a voltage obtained by dividing a power supply voltage by a plurality of series connected transistors.

27. A semiconductor memory device as set forth in claim 20, which further comprises a fourth inverter for invert-amplifying cell a change in a drain voltage of said memory cell to output a feedback signal lower than that of said first inverter, and a transistor connected between said bit line and said power supply, an output of said fourth inverter being delivered to the gate electrode thereof.

28. A semiconductor memory device as set forth in claim 20, wherein depletion type transistors having a power supply voltage as the gate input thereof are connected between drains of said memory cell, and said first and second reference bit lines and corresponding bias transistors.

29. A semiconductor memory device as set forth in claim 1, wherein a pull-up transistor is provided between the output terminal of said third sense amplifier section and the power supply voltage terminal.

30. A semiconductor memory device as set forth in claim 1, wherein said first reference cell has a threshold voltage which is set to a value lower than a threshold voltage of said memory cell in which electrons are injected into said floating gate.

31. A semiconductor memory device comprising:
first and second memory cells each including a floating gate and for storing binary data in dependency upon whether or not electrons are injected into said floating gate,
a first reference cell line placed in a storage state equivalent to said memory cell in which electrons are injected into said floating gate and a second reference cell line placed in a storage state equivalent to said memory cell in which no electron is injected into said floating gate,
a first bit line for outputting a voltage corresponding to the storage state of said first memory cell when reading out data stored in said first memory cell,
a second bit line for outputting a voltage corresponding to the storage state of said second memory cell when reading out data stored in said second memory cell,
a first reference bit line for outputting a voltage corresponding to the storage state of said first reference cell,
a second reference bit line for outputting a voltage corresponding to the storage state of said second reference cell,
a first sense amplifier section for comparing voltages on said first bit line and said first reference bit line to thereby produce a second output corresponding to the storage state of said first memory cell,
a second sense amplifier section for comparing voltages on said first bit line and said second reference bit line to thereby produce a second output corresponding to the storage state of said first memory cell,
a third sense amplifier section for comparing said first and second outputs to thereby sense the storage state of said first memory cell,
a fourth sense amplifier section for comparing voltages on said second bit line and said first reference bit line to thereby produce a fourth output corresponding to the storage state of said second memory cell,
a fifth sense amplifier section for comparing voltages on said second bit line and said second reference bit line to thereby produce a fifth output corresponding to the storage state of said second memory cell, and
a sixth sense amplifier section for comparing said fourth and fifth outputs to sense the storage state of said second memory cell.

32. A semiconductor memory device as set forth in claim 31, which further comprises equalizing means wherein when an address signal for selecting said memory cell changes, said equalizing means is operative to equalize potentials on said first and second bit lines and said first and second reference bit lines for a predetermined time period in correspondence with that change.

33. A semiconductor memory device as set forth in claim 32, wherein said equalizing means comprises a first equalizing transistor connected between said first bit line and said first reference bit line, a second equalizing transistor connected between said second bit line and said first reference bit line, and a third equalizing transistor connected between said first reference bit line and said second bit line.

34. A semiconductor memory device comprising:
a memory cell including a floating gate, and for storing binary data in dependency upon whether or not electrons are injected into said floating gate;
a first reference cell placed in a storage state equivalent to that of said memory cell in which electrons are injected into said floating gate;
a second reference cell placed in a storage state equivalent to that of said memory cell in which no electron is injected into said floating gate;
a bit line for outputting a voltage corresponding to the storage state of said memory cell when data stored in said memory cell is read out;
a first reference bit line for outputting a voltage corresponding to the storage state of said first reference cell;
a second reference bit line for outputting a voltage corresponding to the storage state of said second reference cell;
a first sense amplifier section for comparing a voltage on said bit line with a voltage on said first reference bit line to thereby provide a first output corresponding to the storage state of said memory cell;
a second sense amplifier section for comparing a voltage on said bit line with a voltage on said second reference bit line to thereby provide a second output corresponding to the storage state of said memory cell;
a third sense amplifier section for comparing said first and second outputs to thereby sense the storage state of said memory cell;
means for setting a voltage outputted from said second reference bit line at the time of a program verify data read operation carried out after data is written into said memory cell to a value higher than a voltage outputted from said second reference bit line at the time of an ordinary readout operation of data in said memory cell;
a fourth sense amplifier section for comparing a voltage outputted from said second reference bit line with a voltage outputted from said bit line at the time of said program verify data read operation to thereby sense the storage state of said memory cell, and
output switching means for outputting a sensed result from said third sense amplifier section at the time of reading out said data and for outputting a sensed result from said fourth sense amplifier section at the time of said program verify data read operation.

35. A semiconductor memory device comprising:
a memory cell including a floating gate, and for storing binary data in dependency upon whether or not electrons are injected into said floating gate;
a first reference cell placed in a storage state equivalent to that of said memory cell in which electrons are injected into said floating gate;
a second reference cell placed in a storage state equivalent to that of said memory cell in which no electron is injected into said floating gate;
a first sense amplifier section for comparing voltages changed in dependency upon respective storage states of said memory cell and said first reference cell to provide a first output corresponding to the compared result;

a second sense amplifier section for comparing voltages changed in dependency upon respective storage states of said memory cell and said second reference cell to provide a second output corresponding to the compared result; and a third sense amplifier section for comparing said first and second outputs to sense the storage state of said memory cell whereby a current flowing in the memory cell in which no electron is injected into the floating gate is less than a current flowing in said second reference bit line.

36. A non-volatile semiconductor memory comprising:

a memory cell including a floating gate, and for storing binary data in dependency upon whether or not electrons are injected into said floating gate;

a first reference cell placed in a storage state equivalent to that of said memory cell in which electrons are injected into said floating gate;

a second reference cell placed in a storage state equivalent to that of said memory cell in which no electron is injected into said floating gate;

a first sense amplifier section for comparing voltages changed in dependency upon respective storage states of said memory cell and said first reference cell to provide a first output corresponding to the compared result;

a second sense amplifier section for comparing voltages changed in dependency upon respective storage states of said memory cell and said second reference cell to provide a second output corresponding to the compared result;

a third sense amplifier section for comparing sad first and second outputs to thereby sense the storage state of said memory cell;

a voltage drop circuit for outputting a voltage corresponding to a power supply voltage, and lower than said power supply voltage by a predetermined value; and a third reference cell having a drain connected to the drain of said first reference cell and a gate connected to the output terminal of said voltage drop circuit, said third reference cell being placed in a state equivalent to that of said memory cell in which no electron is injected into said floating gate.

37. A semiconductor memory device comprising:

bit lines, word lines, a memory cell array including memory cells arranged on the intersecting points of said bit lines and said word lines, a auxiliary memory cell array provided in association with said memory cell array, programming means for storing that there are defective cells in said memory cell array, select means wherein when there is any defective cell in said memory cell array, said select means responds to an output from said programming means to select a auxiliary memory cell from said auxiliary memory cell array in place of said defective cell, a first reference cell placed in a storage state equivalent to said memory cell in which electrons are injected into said floating gate, a first reference bit line for producing a voltage corresponding to the storage state of said first reference cell, a second reference cell placed in a storage state equivalent to said memory cell in which no electron is injected into said floating gate, a second reference bit line for outputting a voltage corresponding to the storage state of said second reference cell, a first sense amplifier section for comparing voltages changed in dependency upon respective storage states of said memory cell and said first reference cell to provide a first output corresponding to the compared result, a second sense amplifier section for comparing voltages changed in dependency upon respective storage states of said memory cell and said second reference cell to provide a second output corresponding to the compared result, a third sense amplifier section for comparing said first and second outputs to thereby sense the storage state of said memory cell, equalizing means for equalizing said bit line and said first and second reference bit lines for a predetermined time at the time of data read operation, whereby when there is any defective cell in said memory cell, an equalizing time by said equalizing means is set to a value longer than said predetermined time in response to an output of said programming means.

38. A semiconductor memory device, comprising:

a memory cell for storing a binary data;

a first reference cell being in a storage state corresponding to a first logic level of a binary data;

a second reference cell being in a storage state corresponding to a second logic level of a binary data;

a first sense means for comparing a voltage changed in response to a storage state of said memory cell with voltages changed in response to respective storage states of said first and second reference cells, said first sense means coupled to said memory cell, said first reference cell and said second reference cell, and having at least two output terminals for outputting the compared result; and a second sense means coupled to said output terminals of said first sense means, for comparing the outputs of said first sense means, said second sense means outputting a data corresponding to a data stored to said memory cell.

39. A semiconductor memory device according to claim 38, wherein said first sense means includes a first sense section and a second sense section, said first sense section compares voltages changed in response to respective storage states of said memory cell and said first reference cell to provide a first output signal corresponding to the compared result to one of said output terminals, said second sense section compares voltages changed in response to respective storage states of said memory cell and said second reference cell to provide a second output signal corresponding to the compared result to the other of said output terminals.

40. A semiconductor memory device according to claim 39, further comprising:

a bit line connected to said memory cell, wherein said memory cell is connected to said first and second sense sections of said first sense means through said bit line;

a first reference bit line connected to said first reference cell, wherein said first reference cell is connected to said first sense section of said first sense means through said first reference bit line; and a second reference bit line connected to said second reference cell, wherein said second reference cell is connected to said second sense section of said first sense means through said second reference bit line.

41. A semiconductor memory device according to claim 40, which further comprises reference bit line leak means connected to said first reference bit line, for preventing said first reference bit line from being in an electrically floating state by flowing a leakage current in said first reference bit line.

42. A semiconductor memory device according to claim 40, wherein said memory cell has a first threshold voltage when said memory cell stores a data of the first logic level, said memory cell has a second threshold voltage when said memory cell stores a data of the second logic level, said first threshold voltage is higher than said second threshold voltage.

43. A semiconductor memory device according to claim 40, which further comprises bit line precharge means for precharging said bit line, first precharge means for precharging said first reference bit line, and second precharge means for precharging said second reference bit line, said bit line precharge means being connected between said bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said bit line precharge means, said first precharge means, and said second precharge means, said bit line precharge means, said first precharge means and said second precharge means precharge said bit line, said first reference bit line and said second reference bit line for a predetermined period, respectively.

44. A semiconductor memory device according to claim 40, which further comprises equalizing means for equalizing potentials on said bit line and said first and second reference bit lines, wherein said equalizing means is operative to equalize potentials on said bit line and said first and second reference bit lines for a predetermined period when an address signal for selecting said memory cell changes, as detected by an address transition detection means connected to said equalizing means.

45. A semiconductor memory device according to claim 40, wherein said second sense means has an output terminal for outputting a data corresponding to a data stored to said memory cell, a pull-up transistor is provided between the output terminal of said second sense means and a power supply voltage terminal.

46. A semiconductor memory device according to claim 40, wherein said first reference cell has a threshold voltage which is set to a value lower than a threshold voltage of said memory cell stored at a first logic level of a binary data.

47. A semiconductor memory device according to claim 40, further comprising:
first load means for charging said bit line, connected between a power supply terminal and said bit line;
second load means for charging said first reference bit line, connected between the power supply terminal and said first reference bit line; and
third load means for charging said second reference bit line, connected between the power supply terminal and said second reference bit line.

48. A semiconductor memory device according to claim 40, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

49. A semiconductor memory device according to claim 40, wherein said memory cell includes a floating gate and said memory cell is adapted to store a binary data by using charges stored in said floating gate.

50. A semiconductor memory device according to claim 40, which further comprises:
voltage setting means for setting a voltage of said second reference bit line at the time of a program verify data read operation carried out after data is written into said memory cell to a value higher than a voltage of said second reference bit line at the time of an ordinary readout operation of data in said memory cell;
a fourth sense means for comparing a voltage of said second reference bit line with a voltage of said bit line at the time of said program verify data read operation to thereby sense the storage state of said memory cell; and
output switching means for outputting a sensed result from said second sense means at the time of reading out said data and for outputting a sensed result from said fourth sense means at the time of said program verify data read operation.

51. A semiconductor memory device according to claim 39, wherein said memory cell has a first threshold voltage when said memory cell stores a data of the first logic level, said memory cell has a second threshold voltage when said memory cell stores a data of the second logic level, said first threshold voltage is higher than said second threshold voltage.

52. A semiconductor memory device according to claim 39, wherein said second sense means has an output terminal for outputting a data corresponding to a data stored to said memory cell, a pull-up transistor is provided between the output terminal of said second sense means and a power supply voltage terminal.

53. A semiconductor memory device according to claim 39, wherein said first reference cell has a threshold voltage which is set to a value lower than a threshold voltage of said memory cell stored at a first logic level of a binary data.

54. A semiconductor memory device according to claim 38, further comprising:
a bit line connected to said memory cell, wherein said memory cell is connected to said first sense means through said bit line;
a first reference bit line connected to said first reference cell, wherein said first reference cell is connected to said first sense means through said first reference bit line; and
a second reference bit line connected to said second reference cell, wherein said second reference cell is connected to said first sense means through said second reference bit line.

55. A semiconductor memory device according to claim 54, which further comprises reference bit line leak means connected to said first reference bit line, for preventing said first reference bit line from being in an electrically floating state by flowing a leakage current in said first reference bit line.

56. A semiconductor memory device according to claim 55, wherein said memory cell has a first threshold voltage when said memory cell stores a data of the first logic level, said memory cell has a second threshold voltage when said memory cell stores a data of the second logic level, said first threshold voltage is higher than said second threshold voltage.

57. A semiconductor memory device according to claim 54, which further comprises bit line precharge means for precharging said bit line, first precharge means for precharging said first reference bit line, and second precharge means for precharging said second reference bit line, said bit line precharge means being connected between said bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said bit line precharge means, said first bit line precharge means, and said second bit line precharge means, said bit line precharge means, said first precharge means and said second precharge means precharge said bit line, said first reference bit line and said second reference bit line for a predetermined period, respectively.

58. A semiconductor memory device according to claim 57, wherein each of said precharge means for said bit line, and said first and second reference bit lines comprises a depletion type transistor and a P-channel transistor connected in series, each of said depletion type transistors has a gate and is turned on by applying a control signal to the gate of said depletion type transistor for a predetermined period.

59. A semiconductor memory device according to claim 58, wherein each of said depletion type transistors has a drain which is connected to the power supply, and has a source, each of said P-channel transistors has a drain, a source and a gate, the drain and gate of said P-channel transistor of said bit line precharge means are connected to said bit line, the source of said P-channel transistor of said bit line precharge means is connected to said source of said depletion type transistor of said bit line precharge means, the drain and gate of said P-channel transistor of said first precharge means are connected to said first reference bit line, the source of said P channel transistor of said first precharge means is connected to said source of said depletion type transistor of said first precharge means, the drain and gate of said P-channel transistor of said second precharge means are connected to said second reference bit line, the source of said P-channel transistor of said second precharge means is connected to said source of said depletion type transistor of said second precharge means.

60. A semiconductor memory device according to claim 59, which further comprises equalizing means for equalizing potentials on said bit line and said first and second reference bit lines, wherein said equalizing means is operative to equalize potentials on said bit line and said first and second reference bit lines for a predetermined period when an address signal for selecting said memory cell changes, as detected by an address transition detection means connected to said equalizing means.

61. A semiconductor memory device according to claim 58, which further comprises equalizing means for equalizing potentials on said bit line and said first and second reference bit lines, wherein said equalizing means is operative to equalize potentials on said bit line and said first and second reference bit lines for a predetermined period when an address signal for selecting said memory cell changes, as detected by an address transition detection means connected to said equalizing means.

62. A semiconductor memory device according to claim 57, wherein each of said precharge means for said bit line, and said first and second reference bit lines comprises a N-channel enhancement type transistor which has a drain, a source and a gate, the drain of said N-channel transistor of said bit line precharge means is connected to the power source, the source of said N-channel transistor of said bit line precharge means is connected to said bit line, the drain of said N-channel transistor of said first precharge means is connected to the power source, the source of said N-channel transistor of said first precharge means is connected to said first reference bit line, the drain of said N-channel transistor of said second precharge means is connected to the power source, the source of said N-channel transistor of said second precharge means is connected to said second reference bit line, each of said N-channel transistors is turned on by applying a control signal to the gate of said N-channel transistor for a predetermined period.

63. A semiconductor memory device according to claim 62, which further comprises equalizing means for equalizing potentials on said bit line and said first and second reference bit lines, wherein said equalizing means is operative to equalize potentials on said bit line and said first and second reference bit lines for a predetermined period when an address signal for selecting said memory cell changes, as detected by an address transition detection means connected to said equalizing means.

64. A semiconductor memory device according to claim 57, wherein each of said bit line precharge means, said first precharge means and said second precharge means has a conduction resistance, the conduction resistance of said bit line precharge means is set to a value smaller than each of the conduction resistances of said first and second precharge means.

65. A semiconductor memory device according to claim 57, which further comprises:
a first depletion type transistor connected between said bit line precharging means and said bit line for precharging said bit line through a drain-source path of said first depletion transistor, a gate of said first depletion transistor being connected to said power supply terminal;
a second depletion type transistor connected between said first precharging means and said first reference bit line for precharging said first reference bit line through a drain-source path of said second depletion transistor, a gate of said second depletion transistor being connected to said power supply terminal; and
a third depletion type transistor connected between said second precharging means and said second reference bit line for precharging said second reference bit line through a drain source path of said third depletion transistor, a gate of said third depletion transistor being connected to said power supply terminal.

66. A semiconductor memory device according to claim 65, wherein said gate of said first depletion type transistor is connected to said power supply terminal at a data read mode and said gate of said first depletion type transistor is connected to ground at a data write mode.

67. A semiconductor memory device according to claim 57, which further comprises equalizing means for equalizing potentials on said bit line and said first and second reference bit lines, wherein said equalizing means is operative to equalize potentials on said bit line and said first and second reference bit lines for a predetermined period when an address signal for selecting said memory cell changes, as detected by an address transition detection means connected to said equalizing means, 68. A semiconductor memory device according to claim 57, wherein said second sense means has an output terminal for outputting a data corresponding to a data stored to said memory cell, a pull-up transistor is provided between the output terminal of said second sense means and a power supply voltage terminal.

69. A semiconductor memory device according to claim 57, wherein said first reference cell has a threshold voltage which is set to a value lower than a threshold voltage of said memory cell stored at a first logic level of a binary data.

70. A semiconductor memory device according to claim 57, further comprising:
first load means for charging said bit line, connected between a power supply terminal and said bit line;
second load means for charging said first reference bit line, connected between the power supply terminal and said first reference bit line; and
third load means for charging said second reference bit line, connected between the power supply terminal and said second reference bit line.

71. A semiconductor memory device according to claim 57, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

72. A semiconductor memory device according to claim 57, wherein said memory cell includes a floating gate and said memory cell is adapted to store a binary data by using charges stored in said floating gate.

73. A semiconductor memory device according to claim 57, which further comprises:
voltage setting means for setting a voltage of said second reference bit line at the time of a program verify data read operation carried out after data is written into said memory cell to a value higher than a voltage of said second reference bit line at the time of an ordinary readout operation of data in said memory cell;
a fourth sense means for comparing a voltage of said second reference bit line with a voltage of said bit line at the time of said program verify data read operation to thereby sense the storage state of said memory cell; and
output switching means for outputting a sensed result from said second sense means at the time of reading out said data and for outputting a sensed result from said fourth sense means at the time of said program verify data read operation.

74. A semiconductor memory device according to claim 54, further comprising:
first load means for charging said bit line, connected between a power supply terminal and said bit line;
second load means for charging said first reference bit line, connected between the power supply terminal and said first reference bit line; and
third load means for charging said second reference bit line, connected between the power supply terminal and said second reference bit line.

75. A semiconductor memory device according to claim 74, further comprising:
first bias transistor for limiting the increase in the potential of said bit line at a predetermined restricted potential, a source-drain path of said first bias transistor being connected between said load means and a drain of said memory cell;
second bias transistor for limiting the increase in the potential of said first reference bit line at a predetermined restricted potential, a source-drain path of said second bias transistor being connected between said first load means and a drain of said first reference cell; and
third bias transistor for limiting the increase in the potential of said second reference bit line at a predetermined restricted potential, a source-drain path of said third bias transistor being connected between said second load means and a drain of said second reference cell.

76. A semiconductor memory device according to claim 75, wherein a constant voltage is applied to gates of said bias transistors.

77. A semiconductor memory device according to claim 75, further comprising:
first gate voltage control means for applying a control signal to a gate of said first bias transistor in response to a voltage of said bit line, connected between the gate of said first bias transistor and said bit line;
second gate voltage control means for applying a control signal to a gate of said second bias transistor in response to a voltage of said first reference bit line, connected between the gate of said second bias transistor and said first reference bit line;
third gate voltage control means for applying a control signal to a gate of said third bias transistor in response to a voltage of said second reference bit line, connected between the gate of said third bias transistor and said second reference bit line.

78. A semiconductor memory device according to claim 77, wherein each of said first, second and third gate voltage control means comprises an inverter.

79. A semiconductor memory device according to claim 78, wherein each of said inverters is of a complementary structure comprising a N-channel transistor having a threshold voltage of substantially zero volts and a P-channel transistor connected in series between the power supply terminal and a reference voltage.

80. A semiconductor memory device according to claim 79, wherein each of said inverters is of a complementary structure comprising a N-channel transistor and a P-channel transistor connected in series between the power supply terminal and a reference voltage, said P-channel transistor is connected to said power supply terminal through a constant current source.

81. A semiconductor memory device according to claim 80, wherein said constant current source is comprised of a depletion type transistor, the source and the gate thereof being connected to each other.

82. A semiconductor memory device according to claim 80, wherein said constant current source is comprised of a depletion type transistor of which gate is grounded.

83. A semiconductor memory device according to claim 80, wherein said constant current source is comprised of a transistor, a drain-source path of the transistor of said constant current source is connected between said inverter and said power supply terminal, a voltage obtained by dividing a power supply voltage by a plurality of series connected transistors is applied to a gate of the transistor of said constant current source.

84. A semiconductor memory device according to claim 78, which further comprises a fourth inverter for applying a control signal in response to the voltage of said bit line, and a transistor connected between said bit line and said power supply, wherein the control signal from said fourth inverter is applied to a gate of said transistor.

85. A semiconductor memory device according to claim 54, which further comprises equalizing means for equalizing potentials on said bit line and said first and second reference bit lines, wherein said equalizing means is operative to equalize potentials on said bit line and said first and second reference bit lines for a predetermined period when an address signal for selecting said memory cell changes, as detected by an address transition detection means connected to said equalizing means.

86. A semiconductor memory device according to claim 85, wherein said equalizing means comprises switching means for connecting said bit line and said first and second reference bit lines during said predetermined period for equalizing potentials on said bit line and said first and second reference bit lines.

87. A semiconductor memory device according to claim 86, wherein said switching means comprising first switching means and second switching means, said first switching means is connected between said bit line and said first reference bit line, said second switching means is connected between said second reference bit line and said first reference bit line.

88. A semiconductor memory device according to claim 87, further comprising:
- a first transistor having a drain, a source and a gate, the drain-source current path of said first transistor being inserted in said bit line, said first transistor dividing said bit line into two portions, the first portion of said two portions being coupled to said memory cell, the second portion of said two portions being coupled to said first sense means, wherein said first transistor limits the increase in the potential of said first portion at a predetermined restricted potential;
- a second transistor having a drain, a source and a gate, the drain-source current path of said second transistor being inserted in said first reference bit line, said second transistor dividing said first reference bit line into two portions, the first portion of said two portions being coupled to said first reference cell, the second portion of said two portions being coupled to said first sense means, wherein said second transistor limits the increase in the potential of said first portion at a predetermined restricted potential; and
- a third transistor having a drain, a source and a gate, the drain-source current path of said third transistor being inserted in said second reference bit line, said third transistor dividing said second reference bit line into two portions, the first portion of said two portions being coupled to said second reference cell, the second portion of said two portions being coupled to said first sense means, wherein said third transistor limits the increase in the potential of said first portion at a predetermined restricted potential,
- said first switching means including a first circuit and a second circuit, said first circuit connected between said first portion of said bit line and said first portion of said first reference bit line, said second circuit connected between said second portion of said bit line and said second portion of said first reference bit line,
- said second switching means including a first circuit and a second circuit, said first circuit connected between said first portion of said second reference bit line and said first portion of said first reference bit line, said second circuit connected between said second portion of said second reference bit line and said second portion of said first reference bit line.

89. A semiconductor memory device according to claim 88, further comprising:
- a first depletion type transistor connected between said first transistor and said memory cell, wherein said first transistor is connected to said memory cell through a drain-source path of said first depletion transistor, a gate of said first depletion transistor being connected to said power supply terminal;
- a second depletion type transistor connected between said second transistor and said first reference cell, wherein said second transistor is connected to said first reference cell through a drain-source path of said second depletion transistor, a gate of said second depletion transistor being connected to said power supply terminal; and
- a third depletion type transistor connected between said third transistor and said second reference cell, wherein said third transistor is connected to said second reference cell through a drain-source path of said third depletion transistor, a gate of said third depletion transistor being connected to said power supply terminal.

90. A semiconductor memory device according to claim 89, wherein said gate of said first depletion type transistor is connected to said power supply terminal at a data read mode and said gate of said first depletion type transistor is connected to ground at a data write mode.

91. A semiconductor memory device according to claim 86, wherein said switching means comprises first switching means, second switching means and third switching means, said first switching means is connected between said bit line and said first reference bit line, said second switching means is connected between said second reference bit line and said first reference bit line, said third switching means is connected between said second reference bit line and said bit line.

92. A semiconductor memory device according to claim 91, further comprising:

a first transistor having a drain, a source and a gate, the drain-source current path of said first transistor being inserted in said bit line, said first transistor dividing said bit line into two portions, the first portion of said two portions being coupled to said memory cell, the second portion of said two portions being coupled to said first sense means, wherein said first transistor limits the increase in the potential of said first portion at a predetermined restricted potential;

a second transistor having a drain, a source and a gate, the drain-source current path of said second transistor being inserted in said first reference bit line, said second transistor dividing said first reference bit line into two portions, the first portion of said two portions being coupled to said first reference cell, the second portion of said two portions being coupled to said first sense means, wherein said second transistor limits the increase in the potential of said first portion at a predetermined restricted potential; and a third transistor having a drain, a source and a gate, the drain-source current path of said third transistor being inserted in said second reference bit line, said third transistor dividing said second reference bit line into two portions, the first portion of said two portions being coupled to said second reference cell, the second portion of said two portions being coupled to said first sense means, wherein said third transistor limits the increase in the potential of said first portion at a predetermined restricted potential, said first switching means including a first circuit and a second circuit, said first circuit connected between said first portion of said bit line and said first portion of said first reference bit line, said second circuit connected between said second portion of said bit line and said second portion of said first reference bit line, said second switching means including a first circuit and a second circuit, said first circuit connected between said first portion of said second reference bit line and said first portion of said first reference bit line, said second circuit connected between said second portion of said second reference bit line and said second portion of said first reference bit line, said third switching means including a first circuit and a second circuit, and first circuit connected between said first portion of said bit line and said first portion of said second reference bit line, said second circuit connected between said second portion of said bit line and said second portion of said second reference bit line.

93. A semiconductor memory device according to claim 92, which further comprises:
a first depletion type transistor connected between said first transistor and said memory cell, wherein said first transistor is connected to said memory cell through a drain-source path of said first depletion transistor, a gate of said first depletion transistor being connected to said power supply terminal;
a second depletion type transistor connected between said second transistor and said first reference cell, wherein said second transistor is connected to said first reference cell through a drain-source path of said second depletion transistor, a gate of said second depletion transistor being connected to said power supply terminal; and
a third depletion type transistor connected between said third transistor and said second reference cell, wherein said third transistor is connected to said second reference cell through a drain-source path of said third depletion transistor, a gate of said third depletion transistor being connected to said power supply terminal.

94. A semiconductor memory device according to claim 93, wherein said gate of said first depletion type transistor is connected to said power supply terminal at a data read mode and said gate of said first depletion type transistor is connected to ground at a data write mode.

95. A semiconductor memory device according to claim 86, wherein said switching means comprises first switching means and second switching means, said first switching means is connected between said bit line and said second reference bit line, said second switching means is connected between said second reference bit line and said first reference bit line.

96. A semiconductor memory device according to claim 95, further comprising:
a first transistor having a drain, a source and a gate, the drain-source current path of said first transistor being inserted in said bit line, said first transistor dividing said bit line into two portions, the first portion of said two portions being coupled to said memory cell, the second portion of said two portions being coupled to said first sense means, wherein said first transistor limits the increase in the potential of said first portion at a predetermined restricted potential;

a second transistor having a drain, a source and a gate, the drain-source current path of said second transistor being inserted in said first reference bit line, said second transistor dividing said first reference bit line into two portions, the first portion of said two portions being coupled to said first reference cell, the second portion of said two portions being coupled to said first sense means, wherein said second transistor limits the increase in the potential of said first portion at a predetermined restricted potential; and a third transistor having a drain, a source and a gate, the drain-source current path of said third transistor being inserted in said second reference bit line, said third transistor dividing said second reference bit line into two portions, the first portion of said two portions being coupled to said second reference cell, the second portion of said two portions being coupled to said first sense means, wherein said third transistor limits the increase in the potential of said first portion at a predetermined restricted potential, said first switching means including a first circuit and a second circuit, said first circuit connected between said first portion of said bit line and said first portion of said second reference bit line, said second circuit connected between said second portion of said bit line and said second portion of said second reference bit line, said second switching means including a first circuit and a second circuit, said first circuit connected between said first portion of said second reference bit line and said first portion of said first reference bit line, said second circuit connected between said second portion of said second reference bit line and said second portion of said first reference bit line.

97. A semiconductor memory device according to claim 96, further comprising:
- a first depletion type transistor connected between said first transistor and said memory cell, wherein said first transistor is connected to said memory cell through a drain-source path of said first depletion transistor, a gate of said first depletion transistor being connected to said power supply terminal;
- a second depletion type transistor connected between said second transistor and said first reference cell, wherein said second transistor is connected to said first reference cell through a drain-source path of said second depletion transistor, a gate of said second depletion transistor being connected to said power supply terminal; and
- a third depletion type transistor connected between said third transistor and said second reference cell, wherein said third transistor is connected to said second reference cell through a drain-source path of said third depletion transistor, a gate of said third depletion transistor being connected to said power supply terminal.

98. A semiconductor memory device according to claim 97, wherein said gate of said first depletion type transistor is connected to said power supply terminal at a data read mode and said gate of said first depletion type transistor is connected to ground at a data write mode.

99. A semiconductor memory device according to claim 86, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

100. A semiconductor memory device according to claim 86, wherein said memory cell includes a floating gate and said memory cell is adapted to store a binary data by using charges stored in said floating gate.

101. A semiconductor memory device according to claim 86, which further comprises:
- voltage setting means for setting a voltage of said second reference bit line at the time of a program verify data read operation carried out after data is written into said memory cell to a value higher than a voltage of said second reference bit line at the time of an ordinary readout operation of data in said memory cell;
- a fourth sense means for comparing a voltage of said second reference bit line with a voltage of said bit line at the time of said program verify data read operation to thereby sense the storage state of said memory cell; and
- output switching means for outputting a sensed result from said second sense means at the time of reading out said data and for outputting a sensed result from said fourth sense means at the time of said program verify data read operation.

102. A semiconductor memory device according to claim 85, wherein said equalizing means is arranged between said bit line and said first reference bit line and second reference bit line so that a potential of said bit line is higher than that of said first reference bit line when a first logic level of a binary data is stored in a selected memory cell, and a potential of said bit line is lower than that of said second reference bit line when a second logic level of a binary data is stored in a selected memory cell.

103. A semiconductor memory device according to claim 85, wherein said second sense means has an output terminal for outputting a data corresponding to a data stored to said memory cell, a pull-up transistor is provided between the output terminal of said second sense means and a power supply voltage terminal.

104. A semiconductor memory device according to claim 85, wherein said first reference cell has a threshold voltage which is set to a value lower than a threshold voltage of said memory cell stored at a first logic level of a binary data.

105. A semiconductor memory device according to claim 85, further comprising:
- first load means for charging said bit line, connected between a power supply terminal and said bit line;
- second load means for charging said first reference bit line, connected between the power supply terminal and said first reference bit line; and
- third load means for charging said second reference bit line, connected between the power supply terminal and said second reference bit line.

106. A semiconductor memory device according to claim 85, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

107. A semiconductor memory device according to claim 85, wherein said memory cell includes a floating gate and said memory cell is adapted to store a binary data by using charges stored in said floating gate.

108. A semiconductor memory device according to claim 85, which further comprises:
- voltage setting means for setting a voltage of said second reference bit line at the time of a program verify data read operation carried out after data is written into said memory cell to a value higher than a voltage of said second reference bit line at the time of an ordinary readout operation of data in said memory cell;
- a fourth sense means for comparing a voltage of said second reference bit line with a voltage of said bit line at the time of said program verify data read operation to thereby sense the storage state of said memory cell; and
- output switching means for outputting a sensed result from said second sense means at the time of reading out said data and for outputting a sensed result from said fourth sense means at the time of said program verify data read operation.

109. A semiconductor memory device according to claim 54, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

110. A semiconductor memory device according to claim 54, wherein said memory cell includes a floating gate and said memory cell is adapted to store a binary data by using charges stored in said floating gate.

111. A semiconductor memory device according to claim 110, wherein said first reference cell has a threshold voltage substantially the same as a threshold voltage of the memory cell into which electrons are injected.

112. A semiconductor memory device according to claim 111, which further comprises bit line current leak means for respectively forming leak current paths in said bit line and said first and second reference bit lines so that a potential on said bit line is lower than both potentials on said first and second reference bit lines when no electron is injected into said floating gate of a selected memory cell.

113. A semiconductor memory device according to claim 111, which further comprises bit line current leak means for respectively forming leak current paths in said bit line and said first and second reference bit lines so that a potential on said bit line is higher than both potentials on said first and second reference bit lines when electrons are injected into said floating gate of a selected memory cell.

114. A semiconductor memory device according to claim 54, which further comprises:
- voltage setting means for setting a voltage of said second reference bit line at the time of a program verify data read operation carried out after data is written into said memory cell to a value higher than a voltage of said second reference bit line at the time of an ordinary readout operation of data in said memory cell;
- a fourth sense means for comparing a voltage of said second reference bit line with a voltage of said bit line at the time of said program verify data read operation to thereby sense the storage state of said memory cell; and
- output switching means for outputting a sensed result from said second sense means at the time of reading out said data and for outputting a sensed result from said fourth sense means at the time of said program verify data read operation.

115. A semiconductor memory device according to claim 54, wherein said memory cell has a first threshold voltage when said memory cell stores a data of the first logic level, said memory cell has a second threshold voltage when said memory cell stores a data of the second logic level, said first threshold voltage is higher than said second threshold voltage.

116. A semiconductor memory device according to claim 54, wherein said second sense means has an output terminal for outputting a data corresponding to a data stored to said memory cell, a pull-up transistor is provided between the output terminal of said second sense means and a power supply voltage terminal.

117. A semiconductor memory device according to claim 54, wherein said first reference cell has a threshold voltage which is set to a value lower than a threshold voltage of said memory cell stored at a first logic level of a binary data.

118. A semiconductor memory device according to claim 38, wherein the connection of said first reference cell in the semiconductor memory device is electrically equivalent to the connection of said memory cell in the semiconductor memory device, the connection of said second reference cell in the semiconductor memory device is electrically equivalent to the connection of said memory cell in the semiconductor memory device.

119. A semiconductor memory device according to claim 118, wherein said memory cell has a first threshold voltage when said memory cell stores a data of the first logic level, said memory cell has a second threshold voltage when said memory cell stores a data of the second logic level, said first threshold voltage is higher than said second threshold voltage.

120. A semiconductor memory device according to claim 38, wherein said memory cell has a first threshold voltage when said memory cell stores a data of the first logic level, said memory cell has a second threshold voltage when said memory cell stores a data of the second logic level, said first threshold voltage is higher than said second threshold voltage.

121. A semiconductor memory device according to claim 120, which further comprises bit line current leak means for respectively forming leak current paths in said bit line and said first and second reference bit lines, so that a potential on said bit line is lower than both potentials on said first and second reference bit lines whenever said memory cell has the second threshold voltage.

122. A semiconductor memory device according to claim 121, wherein a potential of said bit line is set higher than potentials of said first and second reference bit lines when said memory cell has the first threshold voltage.

123. A semiconductor memory device according to claim 120, which further comprises bit line current leak means for respectively forming leak current paths in said bit line and said first and second reference bit lines, so that a potential on said bit line is higher than both potentials on said first and second reference bit lines when said memory cell has the first threshold voltage.

124. A semiconductor memory device according to claim 38, wherein said second sense means has an output terminal for outputting a data corresponding to a data stored to said memory cell, a pull-up transistor is provided between the output terminal of said second sense means and a power supply voltage terminal.

125. A semiconductor memory device according to claim 38, wherein said first reference cell has a threshold voltage which is set to a value lower than a threshold voltage of said memory cell stored at first logic level of a binary data.

126. A semiconductor memory device, comprising:
- a first memory cell for storing binary data, wherein said first memory cell stores a first logic level of said binary data whenever said first memory cell has a first threshold voltage, said first memory cell stores a second logic level of said binary data whenever said first memory cell has a second threshold voltage, said first threshold voltage is higher than said second threshold voltage;
- a second memory cell for storing binary data, wherein said second memory cell stores a first logic level of said binary data whenever said second memory cell has a first threshold voltage, said second memory cell stores a second logic level of said binary data whenever said second memory cell has a second threshold voltage, said first threshold voltage is higher than said second threshold voltage;
- a first reference cell being in a storage state equivalent to said memory cell having the first threshold voltage;
- a second reference cell being in a storage state equivalent to said memory cell having the second threshold voltage;
- a first bit line connected to said first memory cell;
- a second bit line connected to said second memory cell;

a first reference bit line connected to said first reference cell;

a second reference bit line connected to said second reference cell;

a first sense means for comparing a voltage changed in response to a storage state of said first memory cell with voltages changed in response to respective storage states of said first and second reference cells, said first sense means coupled to said first bit line, said first reference bit line and said second reference bit line, and having at least two output terminals for outputting the compared result;

a second sense means coupled to said output terminals of said first sense means, for comparing the outputs of said first sense means, said second sense means outputting a data corresponding to a data stored in said first memory cell;

a third sense means for comparing a voltage changed in response to a storage state of said second memory cell with voltages changed in response to respective storage states of said first and second reference cells, said third sense means coupled to said second bit line, said first reference bit line and said second reference bit line, and having at least two output terminals for outputting the compared result; and a fourth sense means coupled to said output terminals of said third sense means, for comparing the outputs of said third sense means, said fourth sense means outputting a data corresponding to a data stored in said second memory cell.

127. A semiconductor memory device according to claim 126, wherein said first sense means includes a first sense section and a second sense section, said first sense section compares voltages of said first bit line and said first reference bit line changed in response to respective storage states of said first memory cell and said first reference cell, respectively, to provide a first output signal corresponding to the compared result to one of said output terminals, said second sense section compares voltages of said first bit line and said second reference bit line changed in response to respective storage states of said first memory cell and said second reference cell, respectively, to provide a second output signal corresponding to the compared result to the other of said output terminals, said third sense means includes a first sense section and a second sense section, said first sense section compares voltages of said second bit line and said first reference bit line changed in response to respective storage states of said second memory cell and said first reference cell, respectively, to provide a first output signal corresponding to the compared result to one of said output terminals, said second sense section compares voltages of said second bit line and said second reference bit line changed in response to respective storage states of said second memory cell and second reference cell, respectively, to provide a second output signal corresponding to the compared result to the other of said output terminals.

128. A semiconductor memory device according to claim 127, which further comprises equalizing means for equalizing potentials on said first bit line, said second bit line, said first reference bit line, and said second reference bit line, wherein said equalizing means is operative to equalize potentials on said first bit line, said second bit line, said first reference bit line and said second reference bit line for a predetermined period when an address signal for selecting said memory cell changes, as detected by an address transition detection means connected to said equalizing means.

129. A semiconductor memory device according to claim 127, which further comprises first bit line precharge means for precharging said first bit line, second bit line precharge means for precharging said second bit line, first precharge means for precharging said first reference bit line, and second precharge means for precharging said second reference bit line, said first bit line precharge means being connected between said first bit line and a power supply, said second bit line precharge means being connected between said second bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said first bit line precharge means, said second bit line precharge means, said first precharge means, and said second precharge means, said first bit line precharge means, said second bit line precharge means, said first precharge means and said second precharge means precharge said first bit line, said second bit line, said first reference bit line and said second reference bit line for a predetermined period, respectively.

130. A semiconductor memory device according to claim 127, wherein said second sense means has an output terminal for outputting a data corresponding to a data stored to said memory cell, a pull-up transistor is provided between the output terminal of said second sense means and a power supply voltage terminal.

131. A semiconductor memory device according to claim 127, wherein said first reference cell has a threshold voltage which is set to a value lower than a threshold voltage of said memory cell stored at a first logic level of a binary data.

132. A semiconductor memory device according to claim 127, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

133. A semiconductor memory device according to claim 127, wherein said memory cell includes a floating gate and said memory cell is adapted to store a binary data by using charges stored in said floating gate.

134. A semiconductor memory device according to claim 127, which further comprises:

voltage setting means for setting a voltage of said second reference bit line at the time of a program verify data read operation carried out after data is written into said memory cell to a value higher than a voltage of said second reference bit line at the time of an ordinary readout operation of data in said memory cell;

a fourth sense means for comparing a voltage of said second reference bit line with a voltage of said bit line at the time of said program verify data read operation to thereby sense the storage state of said memory cell; and output switching means for outputting a sensed result from said second sense means at the time of reading out said data and for outputting a sensed result from said fourth sense means at the time of said program verify data read operation.

135. A semiconductor memory device according to claim 126, which further comprises equalizing means for equalizing potentials on said first bit line, said second bit line, said first reference bit line, and said second reference bit line, wherein said equalizing means is operative to equalize potentials on said first bit line, said second bit line, said first reference bit line and said second reference bit line for a predetermined period when an address signal for selecting said memory cell changes, as detected by an address transition detection means connected to said equalizing means.

136. A semiconductor memory device according to claim 135, wherein said equalizing means includes switching means for connecting said first bit line and said second bit line and said first reference bit line and said second reference bit line during said predetermined period for equalizing potentials on said first bit line and said second bit line and said first reference bit line and said second reference bit line.

137. A semiconductor memory device according to claim 136, wherein said switching means comprises first switching means connected between said first bit line and said first reference bit line, second switching means connected between said second bit line and said first reference bit line, and third switching means connected between said second reference bit line and said first reference bit line.

138. A semiconductor memory device according to claim 137, which further comprises first bit line precharge means for precharging said first bit line, second bit line precharge means for precharging said second bit line, first precharge means for precharging said first reference bit line, and second precharge means for precharging said second reference bit line, said first bit line precharge means being connected between said first bit line and a power supply, said second bit line precharge means being connected between said second bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said first bit line precharge means, said second bit line precharge means, said first precharge means, and said second precharge means, said first bit line precharge means, said second bit line precharge means, said first precharge means and said second precharge means precharge said first bit line, said second bit line, said first reference bit line and said second reference bit line for a predetermined period, respectively.

139. A semiconductor memory device according to claim 136, which further comprises first bit line precharge means for precharging said first bit line, second bit line precharge means for precharging said second bit line, first precharge means for precharging said first reference bit line, and second precharge means for precharging said second reference bit line, said first bit line precharge means being connected between said first bit line and a power supply, said second bit line precharge means being connected between said second bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said first bit line precharge means, said second bit line precharge means, said first precharge means, and said second precharge means, said first bit line precharge means, said second bit line precharge means, said first precharge means and said second precharge means precharge said first bit line, said second bit line, said first reference bit line and said second reference bit line for a predetermined period, respectively.

140. A semiconductor memory device according to claim 136, wherein said switching means comprises first switching means connected between said first bit line and said second reference bit line, second switching means connected between said second bit line and said second reference bit line, and third switching means connected between said second reference bit line and said first reference bit line.

141. A semiconductor memory device according to claim 140, which further comprises first bit line precharge means for precharging said first bit line, second bit line precharge means for precharging said second bit line, first precharge means for precharging said first reference bit line, and second precharge means for precharging said second reference bit line, said first bit line precharge means being connected between said first bit line and a power supply, said second bit line precharge means being connected between said second bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said first bit line precharge means, said second bit line precharge means, said first precharge means, and said second precharge means, said first bit line precharge means, said second bit line precharge means, said first precharge means and said second precharge means precharge said first bit line, said second bit line, said first reference bit line and said second reference bit line for a predetermined period, respectively.

142. A semiconductor memory device according to claim 136, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

143. A semiconductor memory device according to claim 136, wherein said memory cell includes a floating gate and said memory cell is adapted to store a binary data by using charges stored in said floating gate.

144. A semiconductor memory device according to claim 136, which further comprises:
voltage setting means for setting a voltage of said second reference bit line at the time of a program verify data read operation carried out after data is written into said memory cell to a value higher than a voltage of said second reference bit line at the time of an ordinary readout operation of data in said memory cell;
a fourth sense means for comparing a voltage of said second reference bit line with a voltage of said bit line at the time of said program verify data read operation to thereby sense the storage state of said memory cell; and output switching means for outputting a sensed result from said second sense means at the time of reading out said data and for outputting a sensed result from said fourth sense means at the time of said program verify data read operation.

145. A semiconductor memory device according to claim 135, which further comprises first bit line precharge means for precharging said first bit line, second bit line precharge means for precharging said second bit line, first precharge means for precharging said first reference bit line, and second precharge means for precharging said second reference bit line, said first bit line precharge means being connected between said first bit line and a power supply, said second bit line precharge means being connected between said second bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said first bit line precharge means, said second bit line precharge means, said first precharge means, and said second precharge means, said first bit line precharge means, said second bit line precharge means, said first precharge means and said second precharge means precharge said first bit line, said second bit line, said first reference bit line and said second reference bit line for a predetermined period, respectively.

146. A semiconductor memory device according to claim 135, wherein said second sense means has an output terminal for outputting a data corresponding to a data stored to said memory cell, a pull-up transistor is provided between the output terminal of said second sense means and a power supply voltage terminal.

147. A semiconductor memory device according to claim 135, wherein said first reference cell has a threshold voltage which is set to a value lower than a threshold voltage of said memory cell stored at a first logic level of a binary data.

148. A semiconductor memory device according to claim 135, wherein a plurality of memory cells is connected to said bit line, a plurality of first reference cells is connected to said first reference bit line, a plurality of second reference cells is connected to said second reference bit line, the number of said first reference cells connected to said first reference bit line is larger than that of said memory cells connected to said bit line.

149. A semiconductor memory device according to claim 135, wherein said memory cell includes a floating gate and said memory cell is adapted to store a binary data by using charges stored in said floating gate.

150. A semiconductor memory device according to claim 135, which further comprises:

voltage setting means for setting a voltage of said second reference bit line at the time of a program verify data read operation carried out after data is written into said memory cell to a value higher than a voltage of said second reference bit line at the time of an ordinary readout operation of data in said memory cell;

a fourth sense means for comparing a voltage of said second reference bit line with a voltage of said bit line at the time of said program verify data read operation to thereby sense the storage state of said memory cell; and output switching means for outputting a sensed result from said second sense means at the time of reading out said data and for outputting a sensed result from said fourth sense means at the time of said program verify data read operation.

151. A semiconductor memory device according to claim 126, which further comprises first bit line precharge means for precharging said first bit line, second bit line precharge means for precharging said second bit line, first precharge means for precharging said first reference bit line, and second precharge means for precharging said second reference bit line, said first bit line precharge means being connected between said first bit line and a power supply, said second bit line precharge means being connected between said second bit line and a power supply, said first precharge means being connected between said first reference bit line and said power supply, and said second precharge means being connected between said second reference bit line and said power supply, wherein when an address signal for selecting said memory cell changes, as detected by an address transition detection means connected to said first bit line precharge means, said second bit line precharge means, said first precharge means, and said second precharge means, said first bit line precharge means, said second bit line precharge means, said first precharge means and said second precharge means precharge said first bit line, said second bit line, said first reference bit line and said second reference bit line for a predetermined period, respectively.

152. A semiconductor memory device according to claim 151, wherein each of said precharge means for said first bit line, said second bit line, said first reference bit line and said second reference bit line comprises a depletion type transistor and a P-channel transistor connected in series, each of said depletion type transistors has a gate and is turned on by applying a control signal to the gate of said depletion type transistor for a predetermined period.

153. A semiconductor memory device according to claim 152, wherein each of said P-channel transistors is operative to set potentials of said first bit line, said second bit line, said first reference bit line and said second reference bit line to predetermined potentials which are lower than a power supply voltage.

154. A semiconductor memory device according to claim 152, wherein each of said depletion type transistors has a drain which is connected to the power supply, and has a source, each of said P-channel transistors has a drain, a source and a gate, the drain and gate of said P-channel transistor of said first bit line precharge means are connected to said first bit line, the source of said P-channel transistor of said first bit line precharge means is connected to said source of said depletion type transistor of said first bit line precharge means, the drain and gate of said P-channel transistor of said second bit line precharge means are connected to said second bit line, the source of said P-channel transistor of said second bit line precharge means is connected to said source of said depletion type transistor of said second bit line precharge means, the drain and gate of said P-channel transistor of said first precharge means are connected to said first reference bit line, the source of said P-channel transistor of said first precharge means is connected to said source of said depletion type transistor of said first precharge means, the drain and gate of said P-channel transistor of said second precharge means are connected to said second reference bit line, the source of said P-channel transistor of said second precharge means is connected to said source of said depletion type transistor of said second precharge means.

155. A semiconductor memory device according to claim 151, wherein each of said precharge means for said first bit line, said second bit line, said first reference bit line and said second reference bit line comprises a N-channel enhancement type transistor which has a drain, a source and a gate, the drain of said N-channel transistor of said first bit line precharge means is connected to the power source, the source of said N-channel transistor of said first bit line precharge means is connected to said first bit line, the drain of said N-channel transistor of said second bit line precharge means is connected to the power source, the source of said N-channel transistor of said second bit line precharge means is connected to said second bit line, the drain of said N-channel transistor of said first precharge means is connected to the power source, the source of said N-channel transistor of said first precharge means is connected to said first reference bit line, the drain of said N-channel transistor of said second precharge means is connected to the power source, the source of said N-channel transistor of said second precharge means is connected to said second reference bit line, each of said N-channel transistors is turned on by applying a control signal to the gate of said N-channel transistor for a predetermined period.

156. A semiconductor memory device according to claim 151, wherein each of said first bit line precharge means, said second bit line precharge means, said first precharge means and said second precharge means has a conduction resistance, each of the conduction resistances of said first and second bit line precharge means is set to a value smaller than each of the conduction resistances of said first and second precharge means.

157. A semiconductor memory device according to claim 151, wherein said second sense means has an output terminal for outputting a data corresponding to a data stored to said memory cell, a pull-up transistor is provided between the output terminal of said second sense means and a power supply voltage terminal.

158. A semiconductor memory device according to claim 151, wherein said first reference cell has a threshold voltage which is set to a value lower than a threshold voltage of said memory cell stored at a first logic level of a binary data.

159. A semiconductor memory device comprising:
a memory cell including a floating gate, for storing a binary data by using charges stored in said floating gate;
a first reference cell placed in a storage state equivalent to a storage state of said memory cell in which electrons are injected into said floating gate;
a second reference cell placed in a storage state equivalent to a storage state of said memory cell in which no electron is injected into said floating gate;
a first sense means for comparing a voltage changed in response to a storage state of said memory cell with voltages changed in response to respective storage states of said first and second reference cells, said first sense means coupled to said memory cell, said first reference cell and said second reference cell, and having at least two output terminals for outputting the compared result; and
a second sense means coupled to said output terminals of said first sense means, for comparing the outputs of said first sense means, said second sense means outputting a data corresponding to a data stored to said memory cell.

160. A semiconductor memory device according to claim 159, wherein said first sense means includes a first sense section and a second sense section, said first sense section compares voltages changed in response to respective storage states of said memory cell and said first reference cell to provide a first output signal corresponding to the compared result to one of said output terminals, said second sense section compares voltages changed in response to respective storage states of said memory cell and said second reference cell to provide a second output signal corresponding to the compared result to the other of said output terminals.

161. A semiconductor memory device according to claim 160, wherein current flowing through the memory cell is larger than current flowing through the second reference cell.

162. A semiconductor memory device according to claim 159, wherein current flowing through the memory cell is larger than current flowing through the second reference cell.

163. A semiconductor memory device comprising:
a memory cell including a floating gate, for storing a binary data by using charges stored in said floating gate;
a first reference cell placed in a storage state equivalent to a storage state of said memory cell in which electrons are injected into said floating gate;
a second reference cell placed in a storage state equivalent to a storage state of said memory cell in which no electron is injected into said floating gate;
first sense means for comparing a voltage changed in response to a storage state of said memory cell with voltages changed in response to respective storage states of said first and second reference cells, said first sense means coupled to said memory cell, said first reference cell and said second reference cell, and having at least two output terminals for outputting the compared result;
second sense means coupled to said output terminals of said first sense means, for comparing the outputs of said first sense means, said second sense means outputting a data corresponding to a data stored to said memory cell;
a voltage drop circuit for outputting a voltage corresponding to a power supply voltage, and lower than said power supply voltage by a predetermined value; and
a third reference cell having a drain connected to a drain of said first reference cell and a gate connected to an output terminal of said voltage drop circuit, said third reference cell being placed in a state equivalent to that of said memory cell in which no electron is injected into said floating gate.

164. A semiconductor memory device according to claim 163, wherein said first sense means includes a first sense section and a second sense section, said first sense section compares voltages changed in response to respective storage states of said memory cell and said first reference cell to provide a first output signal corresponding to the compared result to one of said output terminals, said second sense section compares voltages changed in response to respective storage states of said memory cell and said second reference cell to provide a second output signal corresponding to the compared result to the other of said output terminals.

* * * * *